(12) United States Patent
Kobuke et al.

(10) Patent No.: US 7,192,650 B2
(45) Date of Patent: Mar. 20, 2007

(54) ELEMENT HAVING PORPHYRIN POLYMER FIXED ON A SUBSTRATE AND METHOD OF PREPARING THE SAME

(75) Inventors: Yoshiaki Kobuke, Ikoma (JP); Akiharu Satake, Ikoma (JP)

(73) Assignee: Nara Institute of Science and Technology, Ikoma (JP)

( * ) Notice: Subject to any disclaimer, the term of this patent is extended or adjusted under 35 U.S.C. 154(b) by 561 days.

(21) Appl. No.: 10/787,146

(22) Filed: Feb. 27, 2004

(65) Prior Publication Data

US 2004/0202876 A1 Oct. 14, 2004

(30) Foreign Application Priority Data

Feb. 28, 2003 (JP) ............................. 2003-054719

(51) Int. Cl.
*B32B 15/04* (2006.01)
*C07D 487/22* (2006.01)
*C08G 79/00* (2006.01)

(52) U.S. Cl. .................. 428/457; 428/543; 528/395; 540/145; 514/185; 514/410; 534/15; 424/9.362; 424/9.61

(58) Field of Classification Search ................ 428/457, 428/543; 528/395; 540/145; 514/185, 410; 534/15; 424/9.362, 9.61
See application file for complete search history.

(56) References Cited

U.S. PATENT DOCUMENTS 6,429,310 B2 8/2002 Kobuke et al.
6,602,998 B2 8/2003 Kobuke et al.
2003/0187251 A1 10/2003 Yoshiaki et al.
2004/0202876 A1 10/2004 Kobuke et al.

OTHER PUBLICATIONS

U.S. Appl. No. 11/442,567, filed May 30, 2006, Kobuke et al.
Marius Albota, et al., "Design of Organic Molecules with Large Two-Photon Absorption Cross Sections", www.sciencemag.org., Science, vol. 281, Sep. 11, 1998, pp. 1653-1656.
Thomas E. O. Screen, et al., "Amplified Optical Nonlinearity in a Self-Assembled Double-Strand Conjugated Porphyrin Polymer Ladder", J. AM. Chem. Soc. vol. 124, No. 33, 2002, pp. 9712-9713.
Kazuya Ogawa, et al., "Large Third-Order Optical Nonlinearity of Self-Assembled Porphyrin Oligomers", J. AM. Chem. vol. 124, No. 1, 2002, pp. 22-23.
Kazuya Ogawa, et al., "Strong Two-Photon Absorption of Self-Assembled Butadiyne-Linked", J. AM. Chem. Soc., vol. 125, No. 44, 2003, pp. 13356-13357.
Katsuhiko Ariga, et al., "Assembling Alternate Dye-Polyion Molecular Films by Electrostatic Layer-By-Layer Adsorption", J. Am. Chem. Soc., vol. 119, 1997, pp. 2224-2231.

(Continued)

*Primary Examiner*—Duc Truong
(74) *Attorney, Agent, or Firm*—Oblon, Spivak, McClelland, Maier & Neustadt, P.C.

(57) ABSTRACT

A photo-functional molecule element having, on a substrate, a porphyrin polymer containing covalently-fixed porphyrin units, and the method of preparing the same. The photo-functional molecule element may be used as a photoelectric conversion element such as an organic solar cell or a three-dimensional, non-linear organic material.

20 Claims, 5 Drawing Sheets

OTHER PUBLICATIONS

Dong-Jin Qian, et al., "Palladium-Mediated Stepwise Assembly of Three-Dimensional Organized Multiporphyrin Arrays Directly on Solid Substrates", Langmuir, vol. 18, 2002, pp. 10237-10242.

Koiti Araki, et al., "Layer-by-Layer Growth of Electrostatically Assembled Multilayer Porphyrin Films", Langmuir, vol. 12, 1996, pp. 5393-5398.

Feras B. Abdelrazzaq, et al., "Photocurrent Generation in Multilayer Organic-Inorganic Thin Films with Cascade Energy Architechtures", J. Am. Chem. Soc., vol. 124, 2002, pp. 4796-4803.

Atsushi Ikeda, et al., "Efficient Photocurrent Generation in Novel Self-Assembled Multilayers Comprised of [60]Fullerene-Cationic Homooxacalix[3]Arene Inclusion Complex and Anionic Porphyrin Polymer", J. Am. Chem. Soc., vol. 123, 2001, pp. 4855-4856.

Frank J. Kampas, et al., "Porphyrin Films. 3. Photovoltaic Properties of Octaethylporphine and Tetraphenylporphine", The Journal of Physical Chemistry, vol. 81, No. 8, 1977, pp. 690-695.

F. J. Kampas, et al., "Photoelectrochemical Properties of Metalloporphyrins", Nature, vol. 284, Mar. 6, 1980, pp. 40-42.

Yutaka Harima, et al., "Organic Photoelectrodes Based on p-p Iso-Type Junctions", The Journal of Physical Chemistry, vol. 89, No. 25, Dec. 15, 1985, pp. 5325-5327.

Yoshiaki Kobuke, et al., "Supramolecular Organization of Imidazolyl-Porphyrin to a Slipped Cofacial Dimer", J. Am. Chem. Soc., vol. 116, 1994, pp. 4111-4112.

The gist of tecture 2-2 at 82$^{th}$ Symposium on Organic Synthesis, Japan, 2002, pp. 65-68.

Atsushi Ohashi, et al., "Covalent Linking of Coordination-Organized Slipped Cofacial Porphyrin Dimers", Bull. Chem. Soc. Jpn., vol. 77, 2004, pp. 365-374 (corresponds to reference AN listed above).

Chusaku Ikeda, et al., "Proofs of Macrocyclization of Gable Porphyrins as Mimics of Photosynthetic Light-Harvesting Complexes", Organic Letters, vol. 5, No. 26, 2003, pp. 4935-4938, (corresponds to reference AN listed above).

Kazuya Ogawa, et al., "Formation of a Giant Supramolecular Porphyrin Array by Self-Coordination", Angew. Chem. Int. Ed., vol. 39, No. 22, 2000, pp. 4070-4073.

Akihiro Nomoto, et al., "Photocurrent Generation System Incorporated with Antenna Function", Chem. Commun., 2002, pp. 1104-1105.

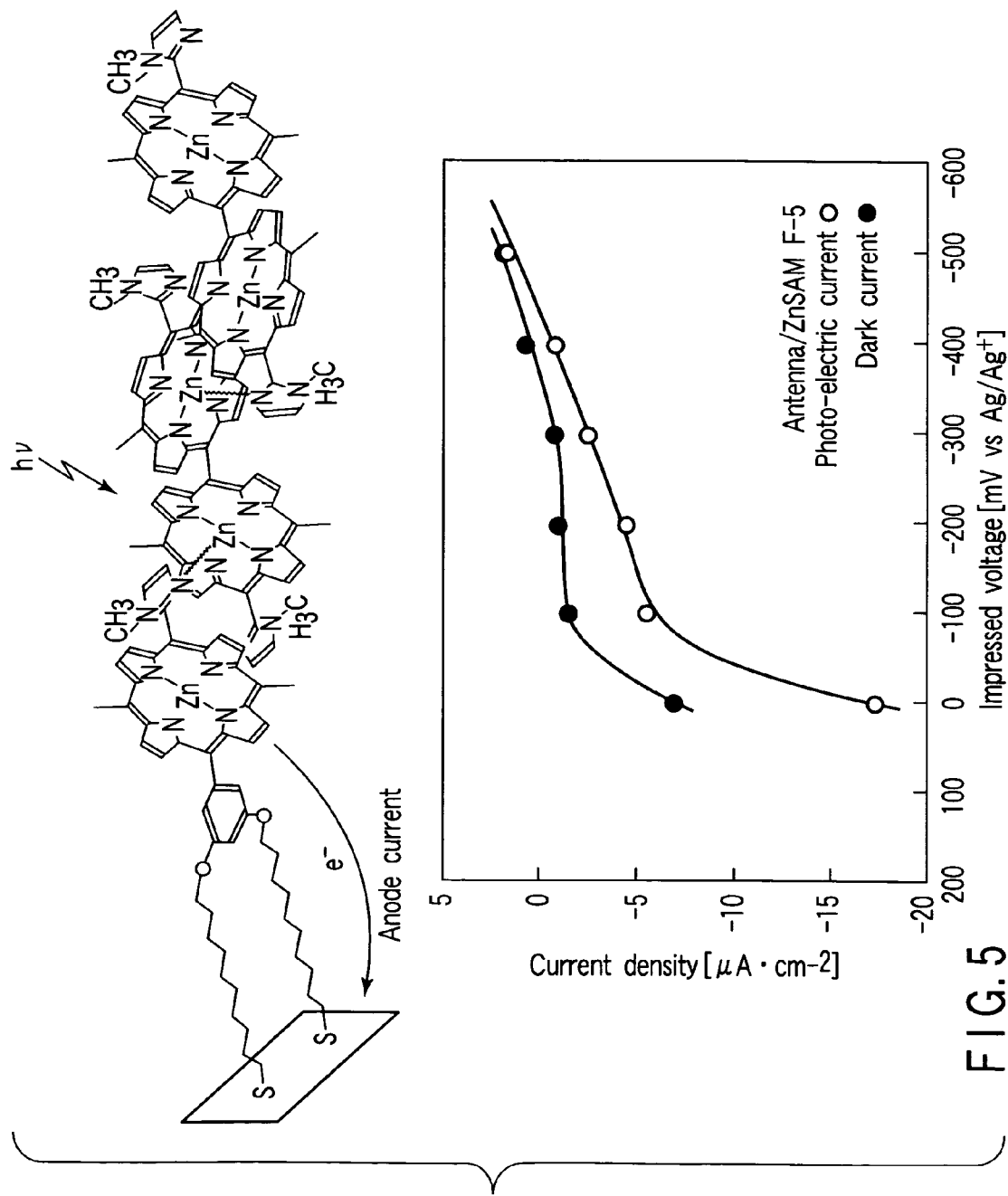
F I G. 5

ELEMENT HAVING PORPHYRIN POLYMER FIXED ON A SUBSTRATE AND METHOD OF PREPARING THE SAME

CROSS-REFERENCE TO RELATED APPLICATIONS

This application is based upon and claims the benefit of priority from prior Japanese Patent Application No. 2003-054719, filed Feb. 28, 2003, the entire contents of which are incorporated herein by reference.

BACKGROUND OF THE INVENTION

1. Field of the Invention

The present invention relates to an element having, on a substrate, a porphyrin polymer fixed by covalent bonds, and a method of producing the same. The element can be used as a photo-functional molecule material, and more specifically, as a photoelectric conversion element such as an organic solar cell or a three-dimensional, non-linear organic material.

2. Description of the Related Art

It is expected that a porphyrin polymer can be used as a media having high performance light-collecting medium and electron transport such as observed in chloroplast of green plants and photo-synthetic bacteria. It is assumed that a porphyrin polymer can be applied to a molecule element such as an organic solar cell and photo-semiconductor and by providing porphyrin on an electrode by way of chemical modification. As a method of producing a porphyrin polymer thin film in which arrangement of porphyrin unit is controlled at the molecular level, the alternately-laminating method has been reported. Kunitake et al. has produced a porphyrin multi-layer film by alternately laminating polycationic and polyanionic porphyrins (K. Ariga, Y. Lvov and T. Kunitake, J. Am. Chem. Soc. 1997, 119, 2224–2231). Alternatively, porphyrins can be fixed on a substrate by alternately laminating a metal ion and porphyrin having metal ligand (D. J. Quian, C. Nakamura, T. Ishida, S. O. Wenk, T. Wakayama, S. Takeda and J. Miyake, Langmuir 2002, 18, 10237–10242). Photoelectric conversion has also been attempted by constructing a gradient of potential in such a porphyrin multi-layer film as described above (K. Araki, M. J. Wagner and M. S. Wrighton, Langmuir, 1996, 12, 5393–5398; F. B. Abdelrazzaq, R. C. Kwong and M. E. Thompson, J. Am. Chem. Soc. 2001, 124, 4796–4803; and A. Ikeda, T. Hatano, S. Shinkai, T. Akiyama and S. Yamada, J. Am. Chem. Soc. 2001, 123, 4855–4856).

Further, it is known that porphyrin functions as a p-type semiconductor. There has been a report in which a p-n/p-p' junction interface was produced by a porphyrin film laminated by CVD or with electrolytically-polymerized films, and production of a photoelectric conversion element, a photo-rectification interface or a Schottky diode was attempted (F. J. Kampas and M. Gouterman, J. Phys. Chem. 1977, 81, 690–695; F. J. Kampas, K. Yamashita and J. Fajer, Nature 1980, 284, 40–42; and Y. Harima and K. Yamashita, J. Phys. Chem. 1985, 89, 5325–5327).

On the other hand, the inventors of the present invention have discovered that imidazole-substituted porphyrin metal complexes coordination-bond in a complementary manner between molecules, thereby forming a hyper molecular structure similar to a dimer observed in photosynthetic bacteria, as shown below (Y. Kobuke and H. Miyaji, J. Am. Chem. Soc., 1994, 116, 4111–4112):

Dimerization of Imidazolylporphyrin by Coordination Bonds and its Dissociation

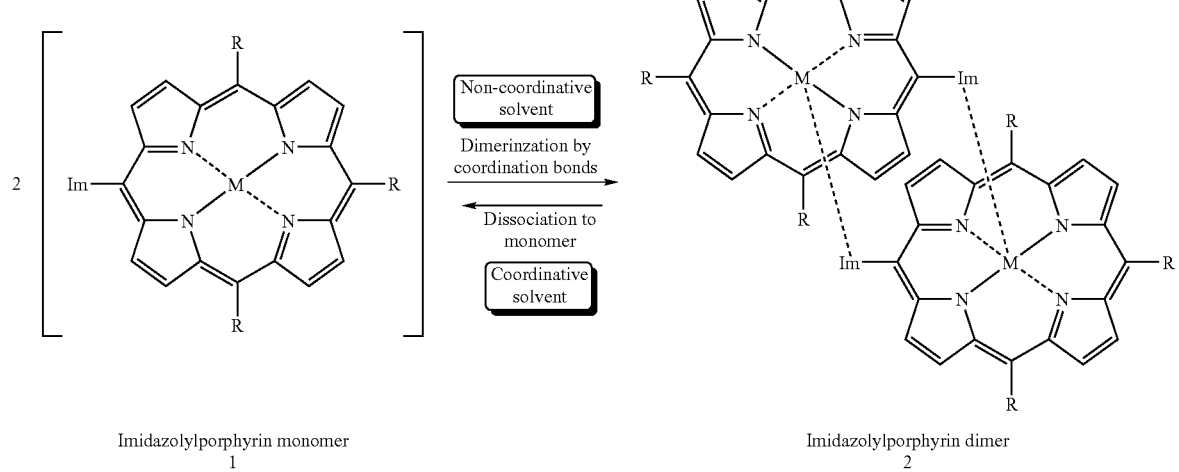

Imidazolylporphyrin monomer
1

Imidazolylporphyrin dimer
2

The characteristics of the above-described porphyrin dimer reside in that the porphyrin dimer is capable of absorbing light in a significantly wide wavelength range owing to exciton division and that the charge-dissociated state can be prolonged because the exciton species is present between the dimer in a non-localized manner. Accordingly, the porphyrin dimer enables a very efficient photosensitization reaction. Further, when a side-chain allyl substituent is introduced to the imidazole-substituted porphyrin, the dimer structure can be fixed by covalent bonds through a metathesis ring-closing reaction using a Grubbs complex. The electronic spectrum of the dimer structure fixed by covalent bonds was not affected by a solvent and exhibited a strong exciton interaction (The gist of lecture 2—2 at 82th Organic Synthesis Symposium, p. 65–68 (2002).

Imidazolylporphyrin Metal Complex Dimer Fixed with Covalent Bonds

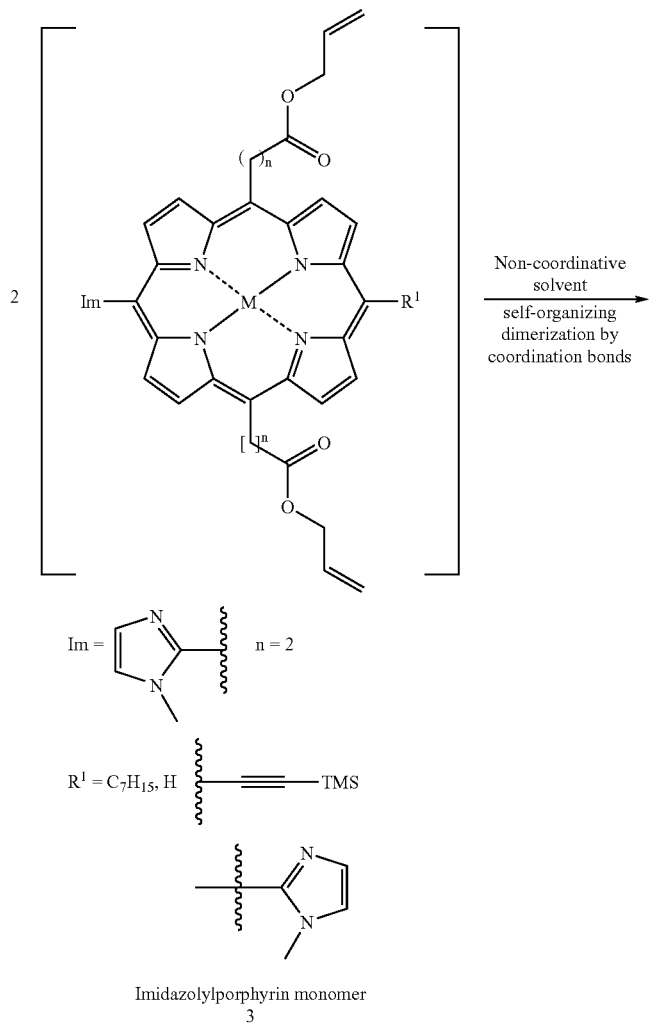

-continued

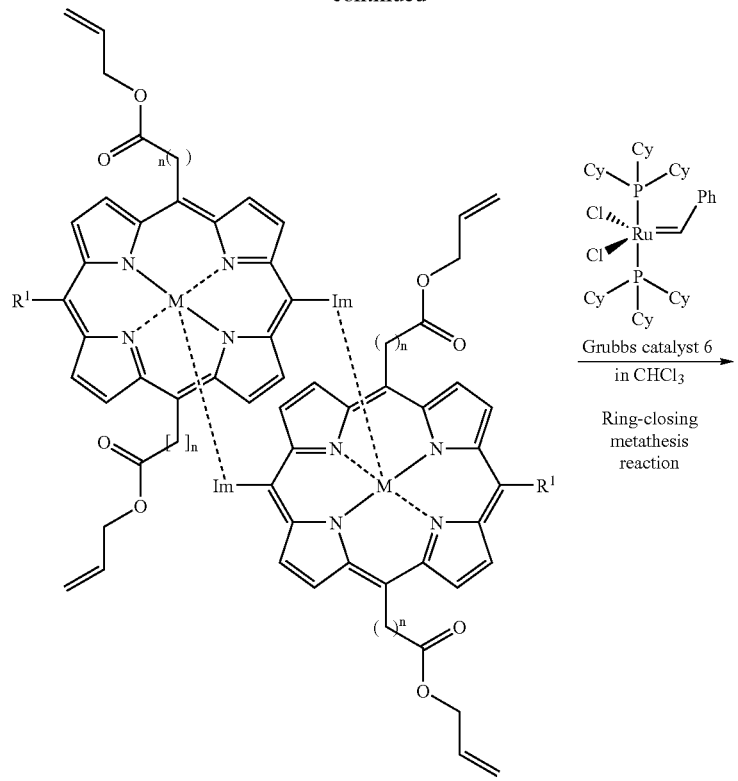

Imidazolyporphyrin dimer
4

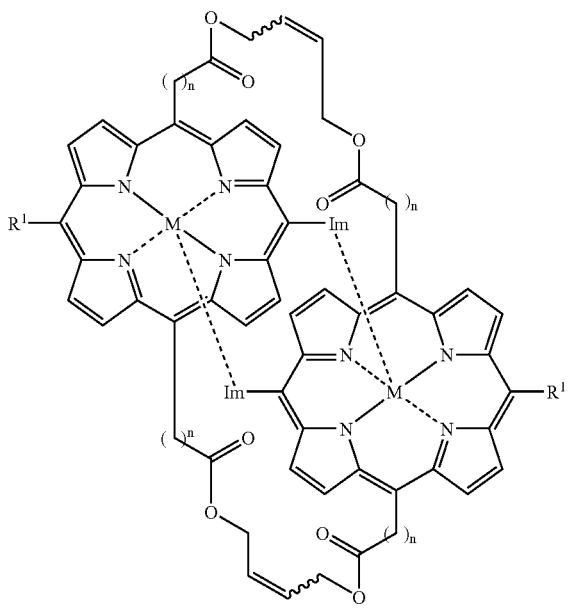

Imidazolyporphyrin dimer fixed
by covalents bonds
5

By using the above bis(imidazole-substituted porphyrinatozinc) units fixed by covalent bonds, it is now possible to design a hyper molecule structure which has been made more highly multi-layered. Specifically, the imidazole-substituted bis-porphyrin forms a one-dimensionally extended, coordinated structural array (K. Ogawa and Y. Kobuke, Angew. Chem. Int. Ed. 2000, 39, 4070–4073). By fixing the coordinated structural array with covalent bonds through a metathesis reaction in a step-by-step manner, next imidazole-substituted porphyrinatozinc having the functional groups can be introduced to the coordinate structural array and fixed thereto, in the step-by-step manner as shown below:
Fixation by Covalent Bonds of Porphyrin Polymer Self-Organized with Coordination Bonds
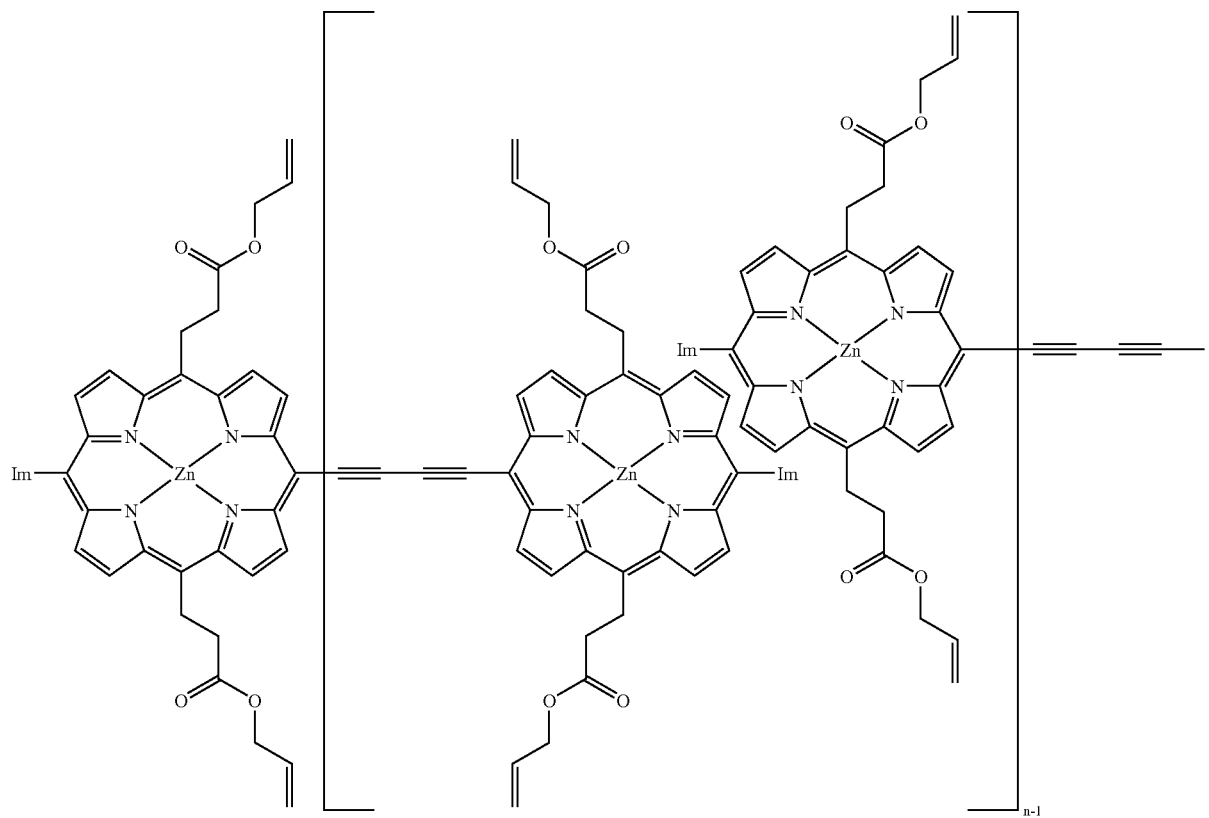
7
Diacetylene-linked imidazolylbis porphyrin
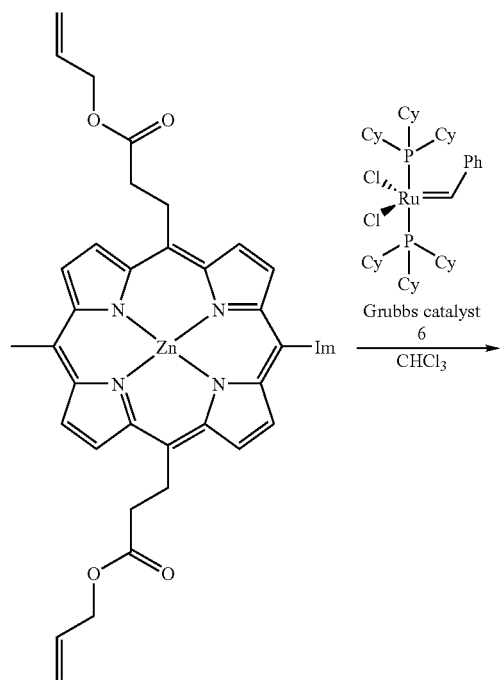

-continued
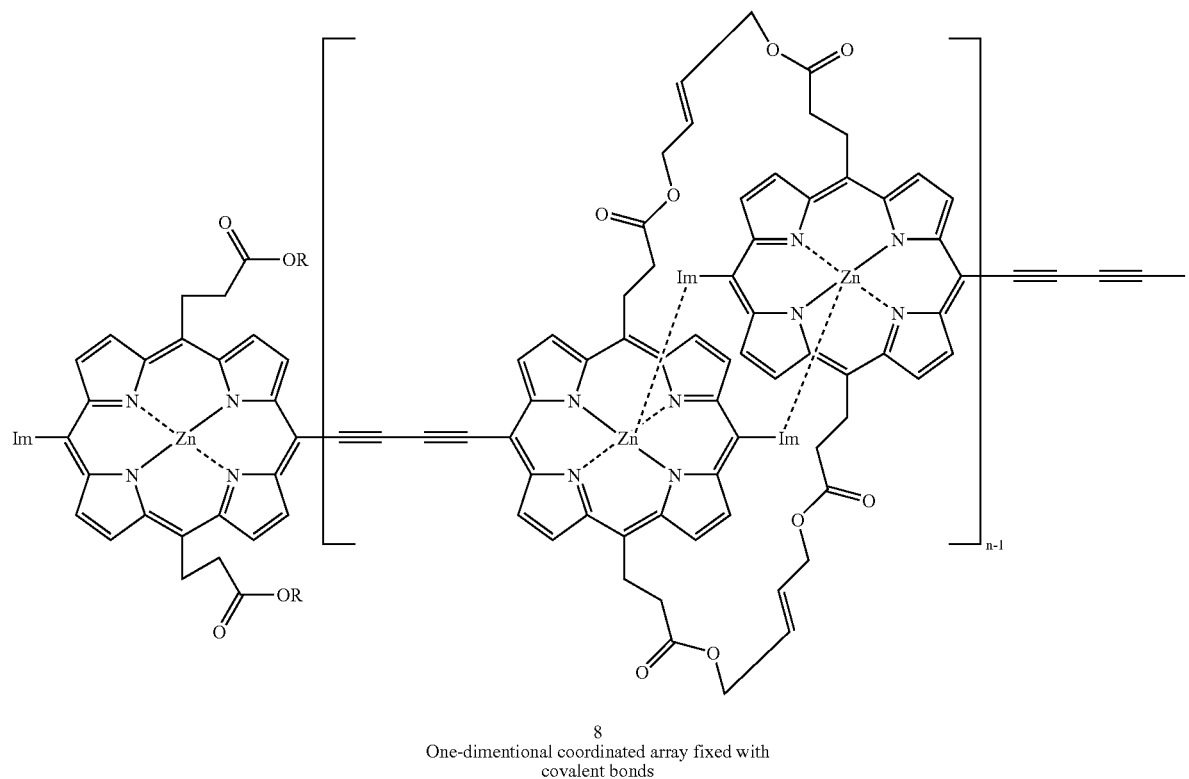
8
One-dimentional coordinated array fixed with covalent bonds
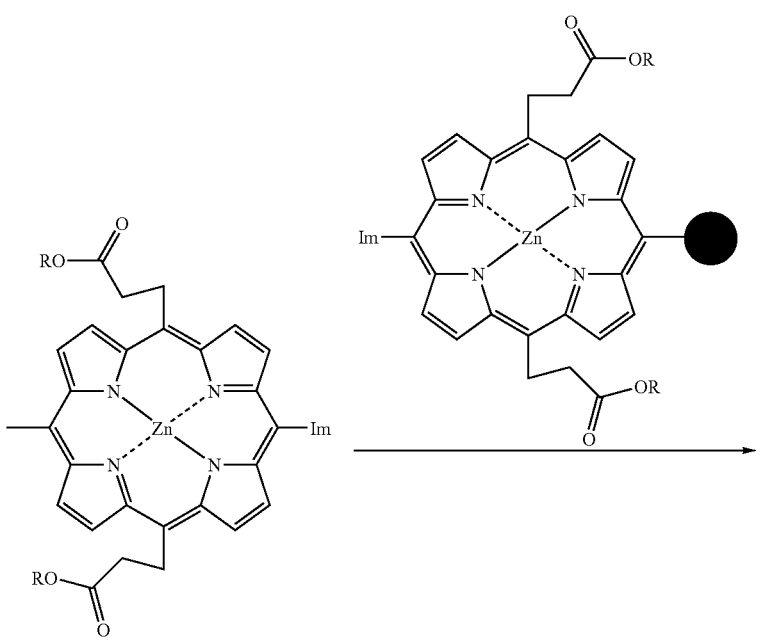

-continued
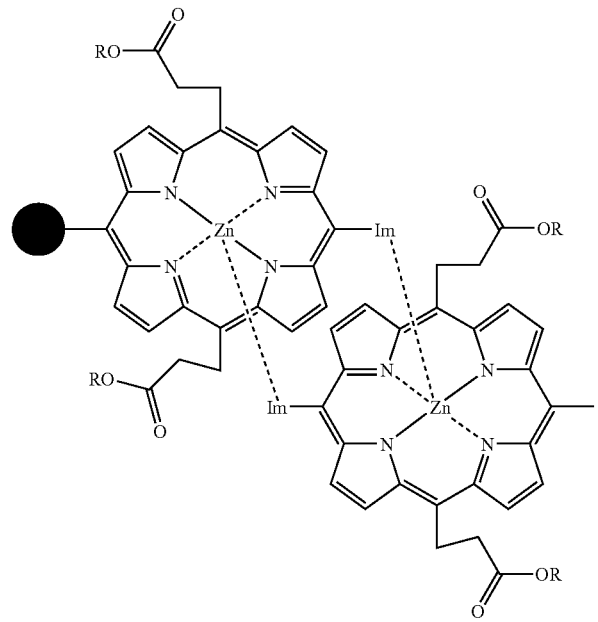
9
Array elongated by a different kind of porphyin at the terminal ends thereof
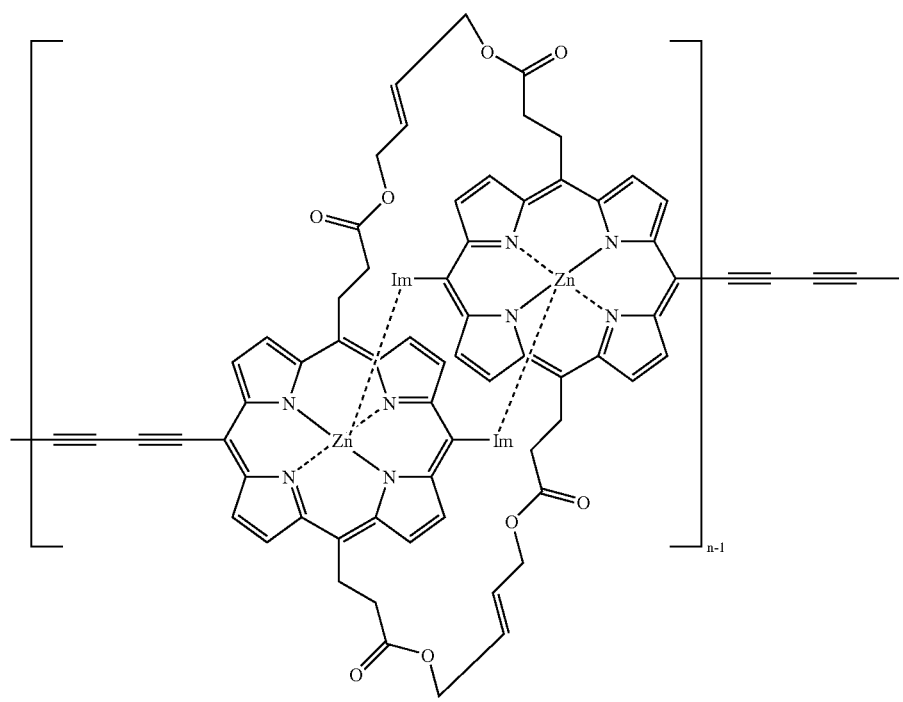

-continued

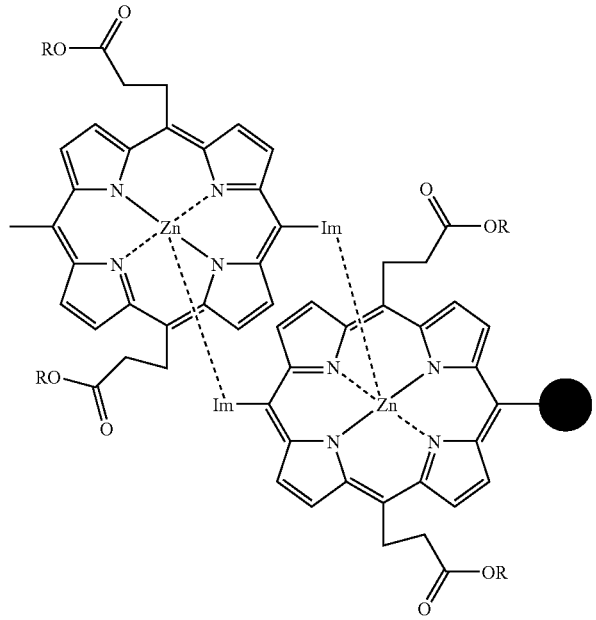

In order to develop a practical device from such porphyrin polymer as described above, it is necessary to provide the porphyrin polymer on a solid substrate such as an electrode. In the study at the early stage, the inventors of the present invention conducted an experiment in which linker porphyrin was attached to a gold substrate and the substrate was soaked in a solution of the imidazole-substituted porphyrinatozinc, so that the porphyrin polymer was laminated on the substrate by coordinate bond. The resulting element which actually had a laminate structure was subjected to photocurrent measurement and it was confirmed that the element functioned properly as a photo-functional element (A. Nomoto and Y. Kobuke, Chem. Commun., 2002, 1104–1105).

Elongation, on a Substrate, of Imidazolylporphyrin Polymer by Coordination Bonds

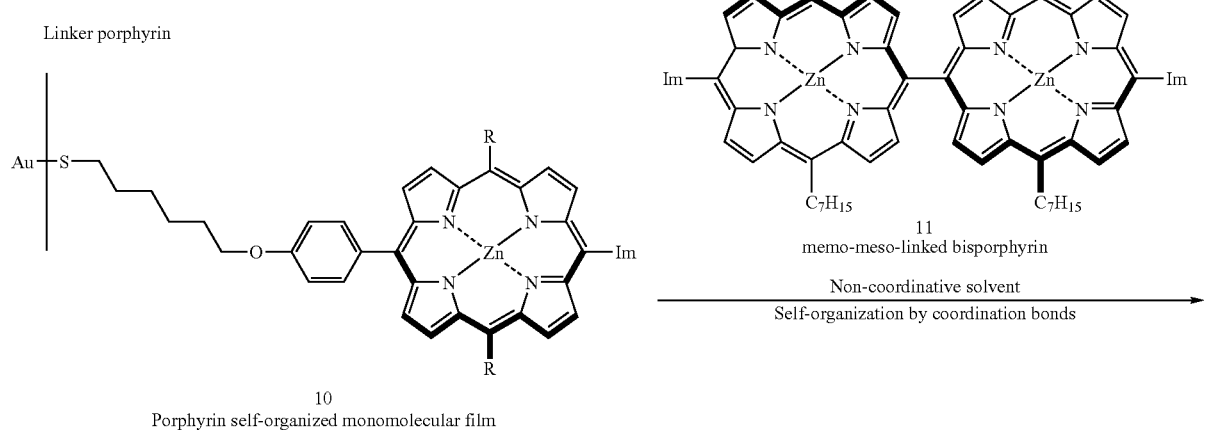

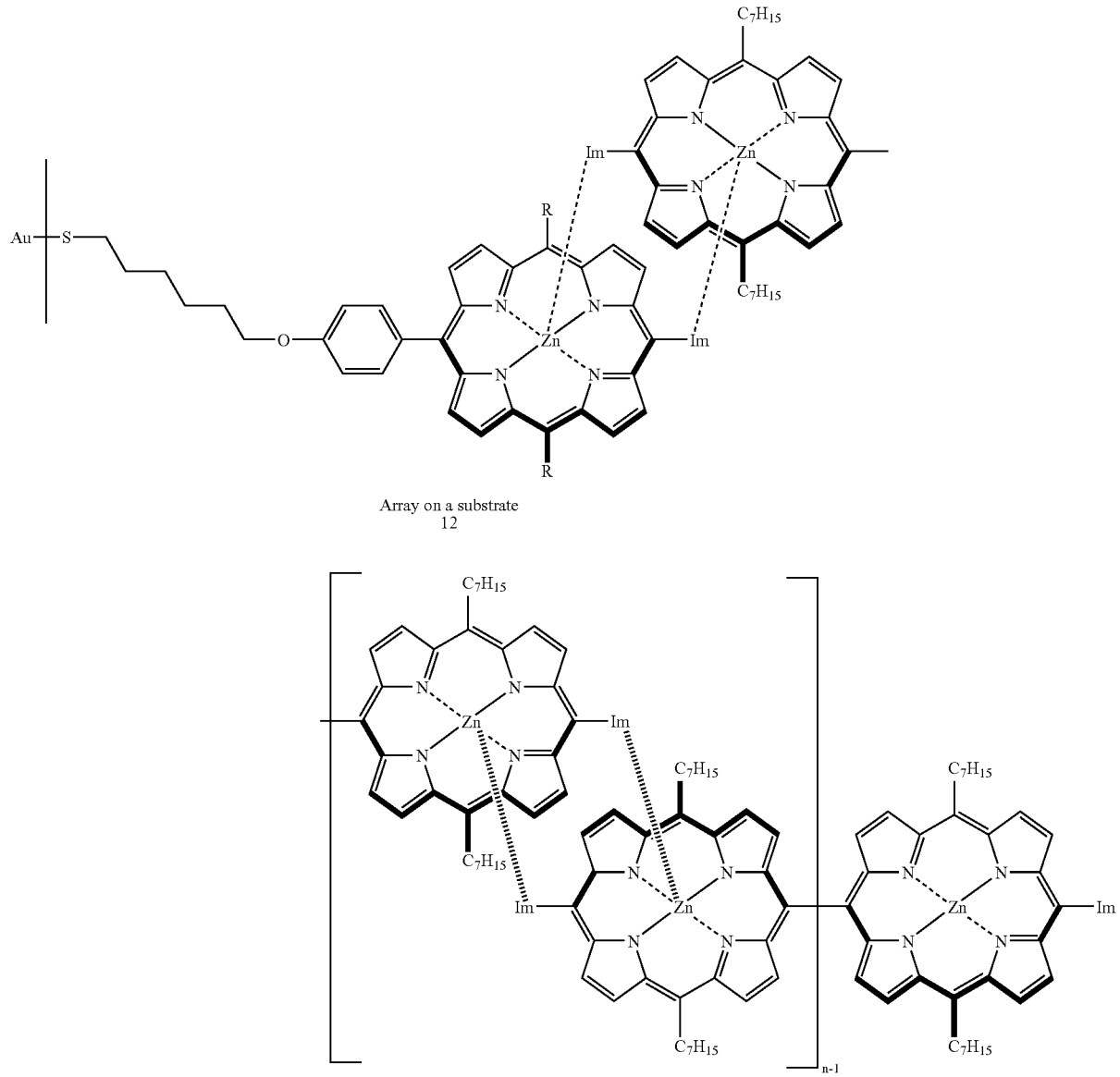

Array on a substrate
12

In order to improve the function of the above-described element, it is necessary to provide, on a solid substrate, porphyrin polymers of different characteristics sequentially in a predetermined direction. By providing porphyrin polymers in such a manner, an element which loses less energy and enables more efficient operation than the conventional element can be constructed. In the aforementioned method in which a substrate is simply soaked in a porphyrin solution and allowed to form a laminate, the layer which has been laminated on the substrate in the first lamination step is peeled off when another layer is laminated thereon in the second lamination step. That is, in the aforementioned method, the first layer is simply replaced with the second layer and it is impossible to provide, on a solid substrate, porphyrin polymers of different characteristics sequentially in a predetermined direction.

BRIEF SUMMARY OF THE INVENTION

An object of the present invention is to solve the above-described problems of the prior art and provide a photo-functional molecule element which loses less energy and effects more efficient operation than the conventional element, and a method of producing the same.

As a result of the keen study, the inventors of the present invention have discovered that the above-described problems can be solved by the following photo-functional molecule element in which a photo-functional molecule element composed of a covalently-fixed porphyrin polymer is laminated on a substrate, and the method of preparing the photo-functional molecule element. Specifically, the present invention provides a photo-functional molecule element laminated on a substrate represented by the following formula (VIII) or (VIII'):

(VIII)
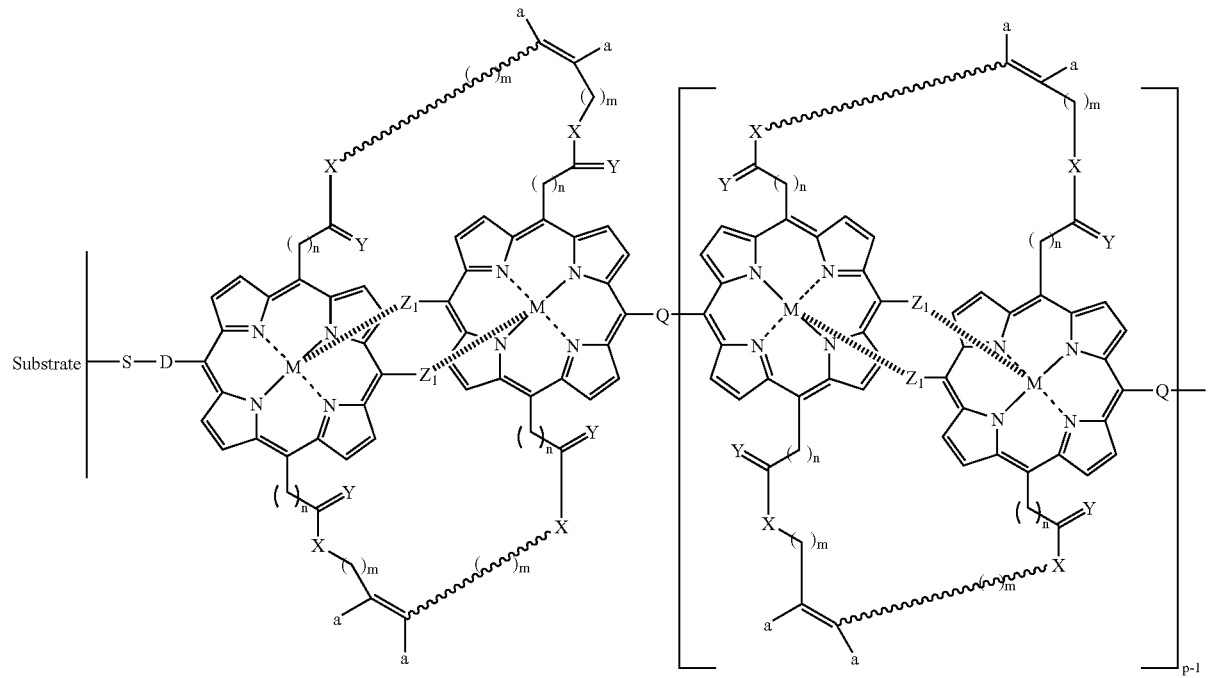
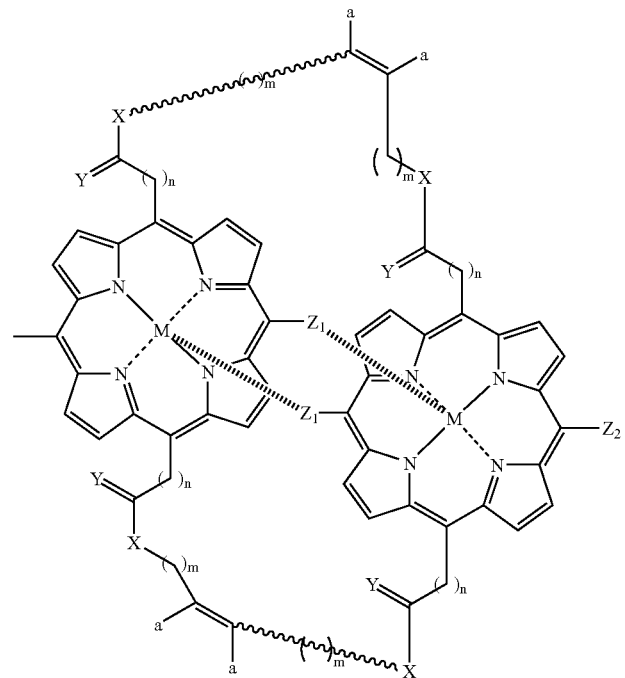

(VIII')

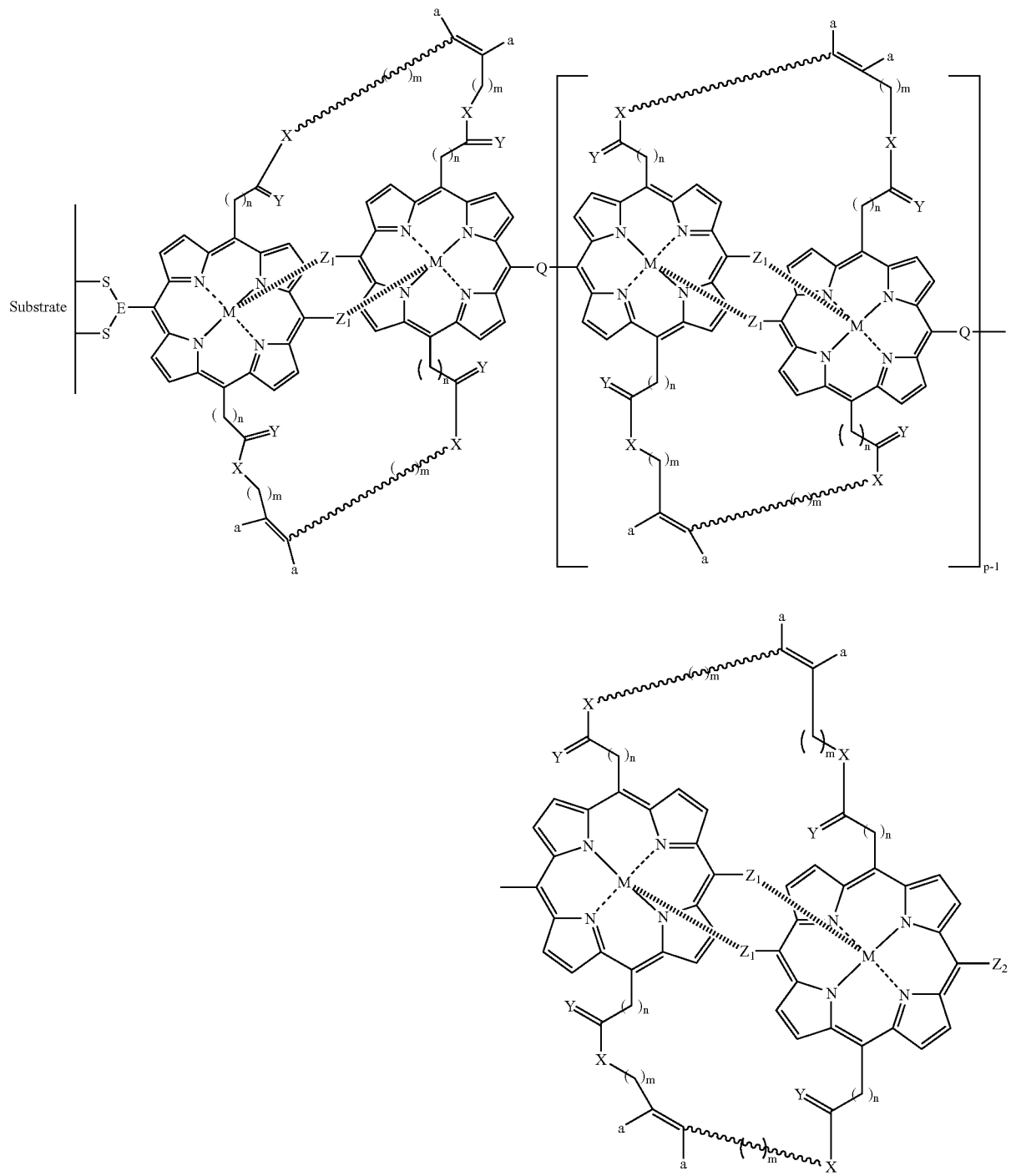

[wherein a represents H, alkyl group or aryl group; X represents —O—, —S—, >NR$_{101}$ (wherein R$_{101}$ represents H or an alkyl group), CH$_2$ or single bond; Y represents =O, =S or 2H; m represents an integer of 0 to 4; n represents an integer of 0 to 6; Z$_1$ represents a 5- or 6-membered nitrogen-containing heteroaromatic ring group capable of forming a coordination bond; Z$_2$ represents a group having a functional group which can be an electron acceptor or electron donor, or a group which can be the terminal group of the porphyrin polymer; D represents a divalent group including at least one of arylene group and alkylene group; E represents a trivalent group including at least one of arylene group and alkylene group; M represents an ion of metal selected from the group consisting of typical metals and transition metals; Q represents a single bond or divalent linking group; and p represents an integer of 1 or more].

The present invention also provides the following method of producing the photo-functional molecule element in which a covalently-fixed porphyrin polymer has been laminated on a substrate. The method comprises:

(1) fixing, on a substrate, a linker molecule represented by the following formula (I):

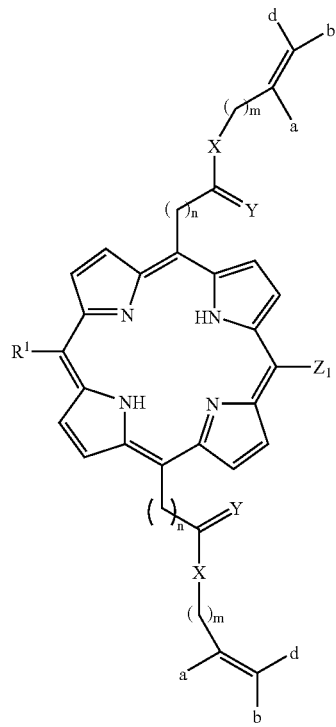

(I)

[wherein a, b and d independently-represent H, an alkyl group or aryl group; X represents —O—, —S—, >NR$_{101}$ (wherein R$_{101}$ represents H or an alkyl group), CH$_2$ or single bond; Y represents =O, =S or 2H; m represents an integer of 0 to 4; n represents an integer of 0 to 6; Z$_1$ represents a 5- or 6-membered nitrogen-containing heteroaromatic ring group capable of forming a coordination bond; and R$^1$ represents

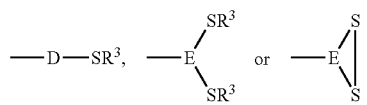

(wherein D represents a divalent group including at least one of arylene group and alkylene group; E represents a trivalent group including at least one of arylene group and alkylene group; and R$^3$ represents H or an acetyl group)]; and introducing a metal M selected from the group consisting of typical metals and transition metals to the porphyrin residue derived from the linker molecule, thereby obtaining a monomolecular film represented by the following formula (II) or (II'):

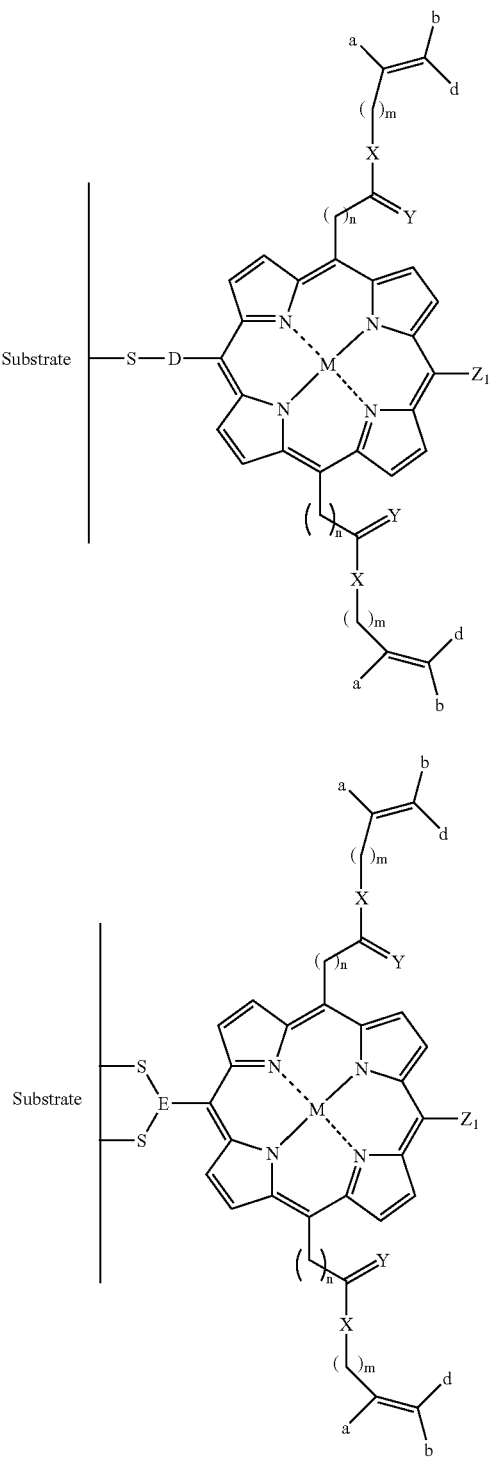

(wherein each of the substituents is as defined above), provided that either one of the fixing a linker molecular and the introducing a metal M may be carried out earlier than the other;

(2) linking the porphyrin residue of the monomolecular film with one of porphyrin residues of meso-meso linked bis-porphyrin represented by the following formula (III):

(III)
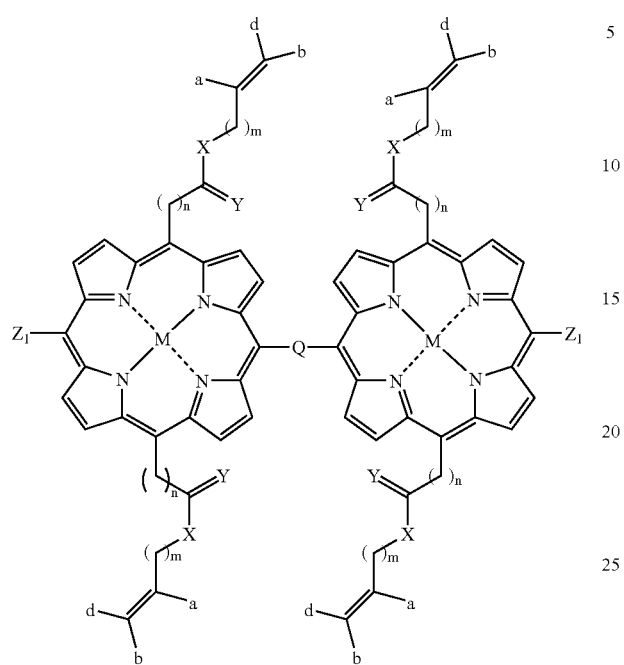
(wherein each of a, b, d, X, Y, m, n, M and $Z_1$ is as defined above and Q represents a single bond or divalent linking group), via two coordinate bonds, thereby obtaining a first laminate represented by the following formula (IV) or (IV'):
(IV)
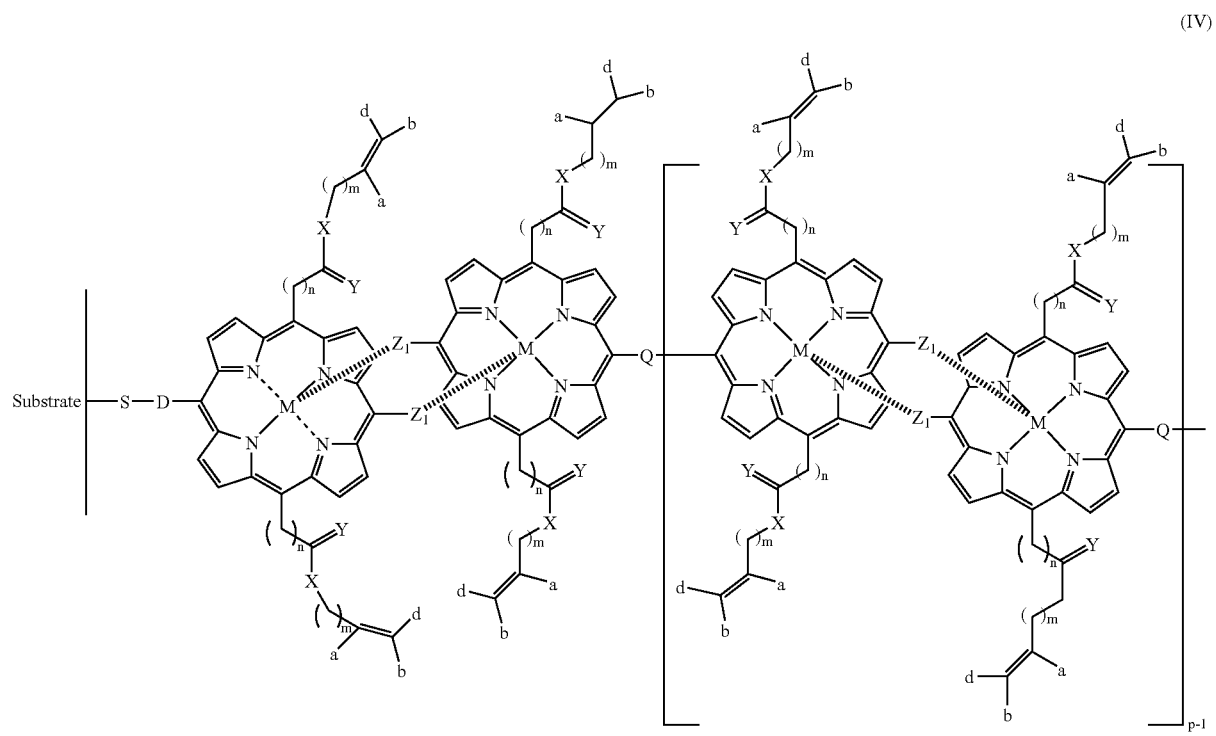

-continued
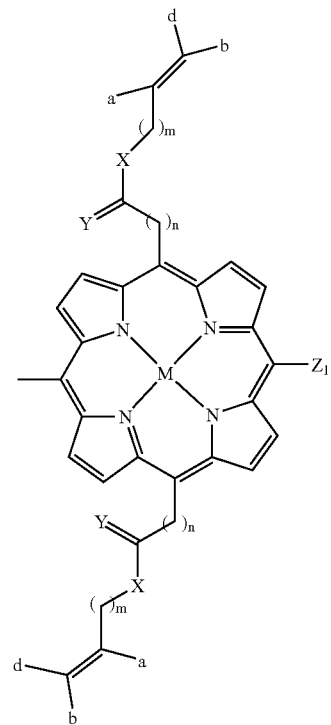
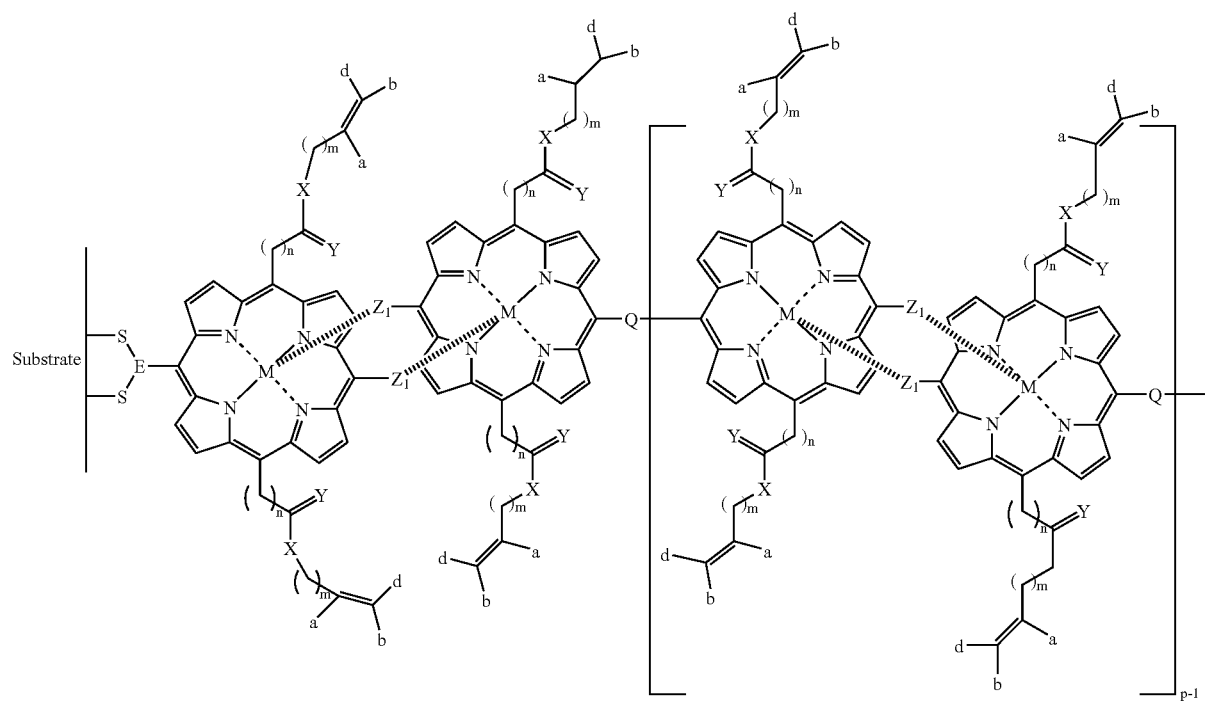
(IV')

-continued

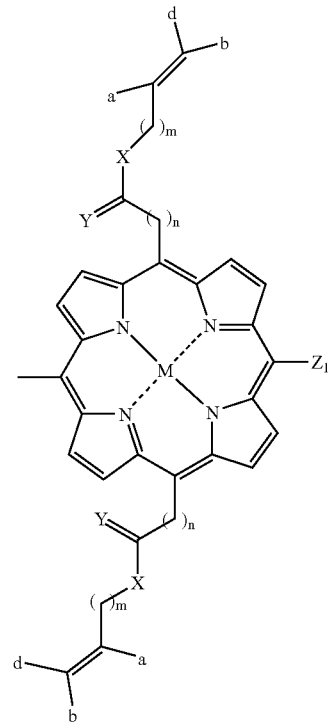

(wherein each of the substituent is as defined above, and p is 1);

(3) effecting, in the presence of a Grubbs catalyst, a ring-closing metathesis reaction of the olefin portions of the porphyrin residue derived from the linker molecule, with the corresponding olefin portions of the porphyrin residue that is coordinated to the linker molecule, so that the porphyrins are fixed to each other by covalent bonds, thereby obtaining a fixed first laminate represented by the following formula (V) or (V'):

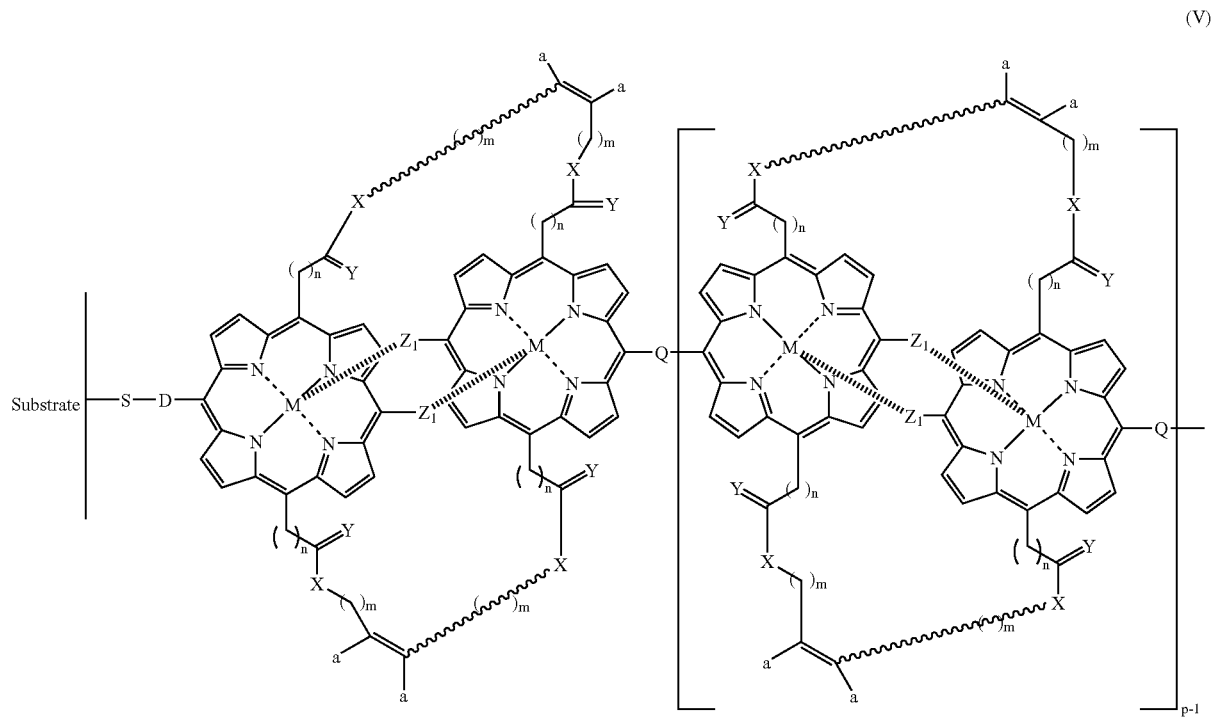

-continued
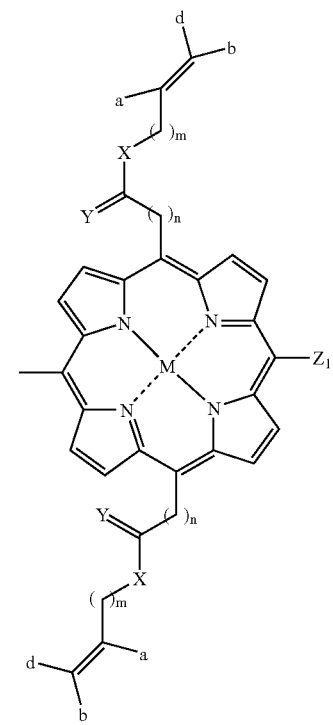
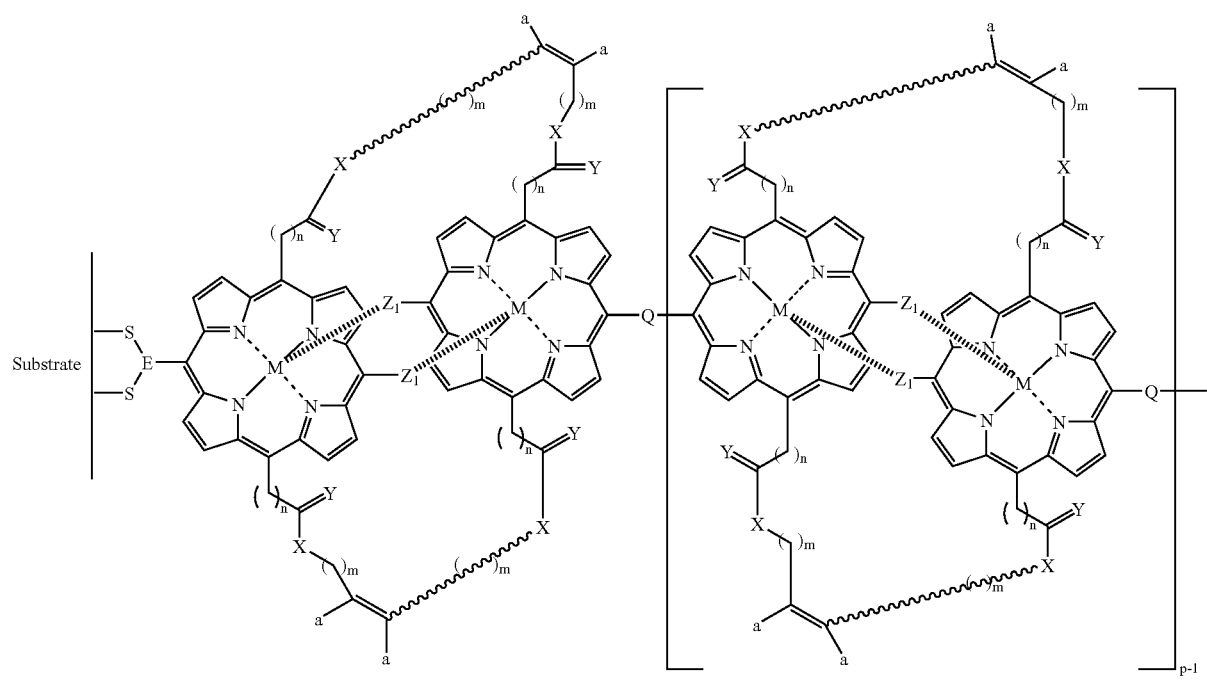
(V')

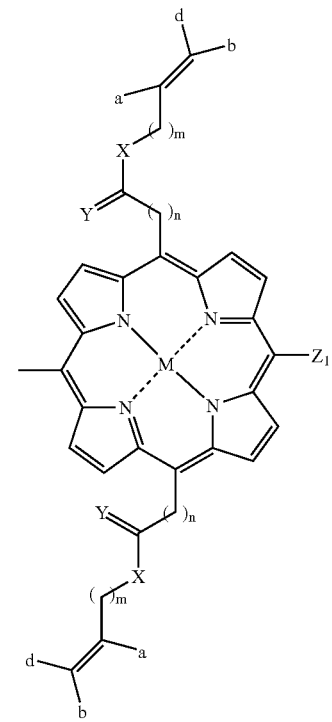

(wherein each of the substituents is as defined above, and p is 2);

(4) optionally, linking the porphyrin residue at the terminal end of the fixed first laminate with one of the porphyrin residues of another meso-meso linked bis-porphyrin represented by the formula (III), via two coordinate bonds, in the same manner as in above (2), thereby obtaining a second laminate represented by the above formula (IV) or (IV'), wherein p represents an integer of 2 or more); and effecting, in the presence of a Grubbs catalyst, a ring-closing metathesis reaction in the same manner as in above (3), thereby obtaining a fixed second laminate represented by the formula (V) or (V'), wherein p represents an integer of 2 or more);

wherein the linking and the effecting the ring-closing metathesis reaction, as a cycle, are sequentially repeated q times, thereby obtaining a fixed $q^{th}$ laminate represented by the formula (V) or (V'), wherein p represents q, and q is an integer of 2 or more;

(5) linking the porphyrin residue at the terminal end of the fixed first laminate obtained in above (3) or the fixed $q^{th}$ laminate obtained in above (4), with the porphyrin residue of a porphyrin derivative represented by the following formula (VI):

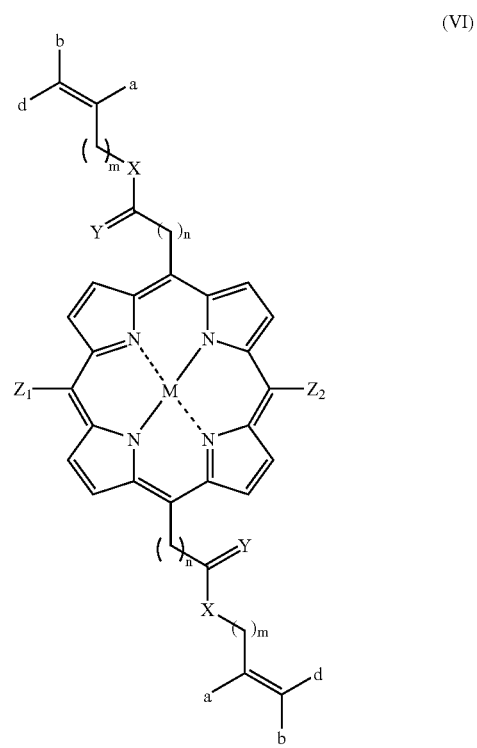

(wherein each of $Z_1$, M, X, Y, m, n, a, b and d is as defined above, and $Z_2$ represents a group having a functional group which can be an electron acceptor or electron donor, or a group which can be the terminal group of the porphyrin polymer), via two coordinate bonds, thereby obtaining a photo-functional molecule precursor represented by the following formula (VII) or (VII'):
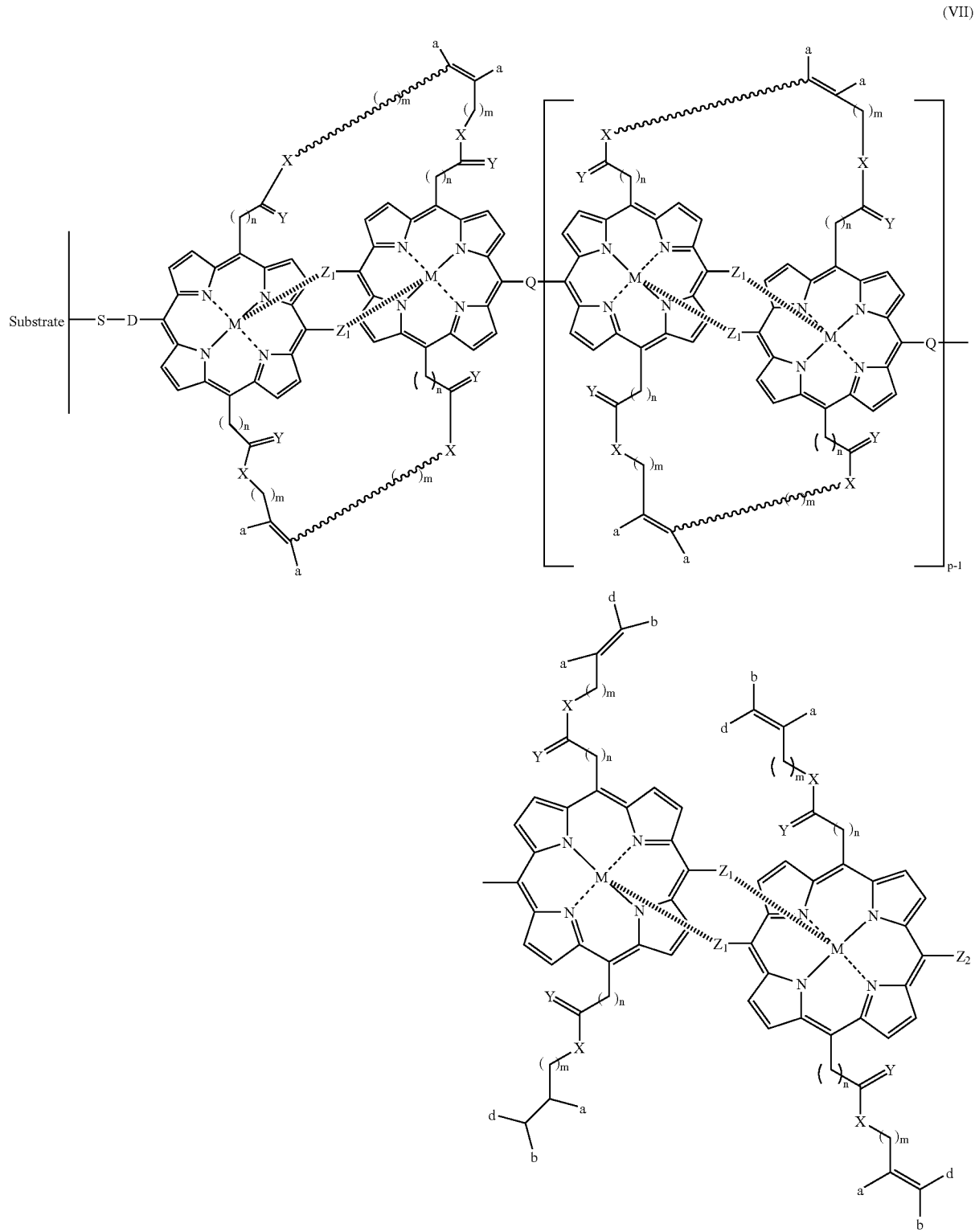

(VII')

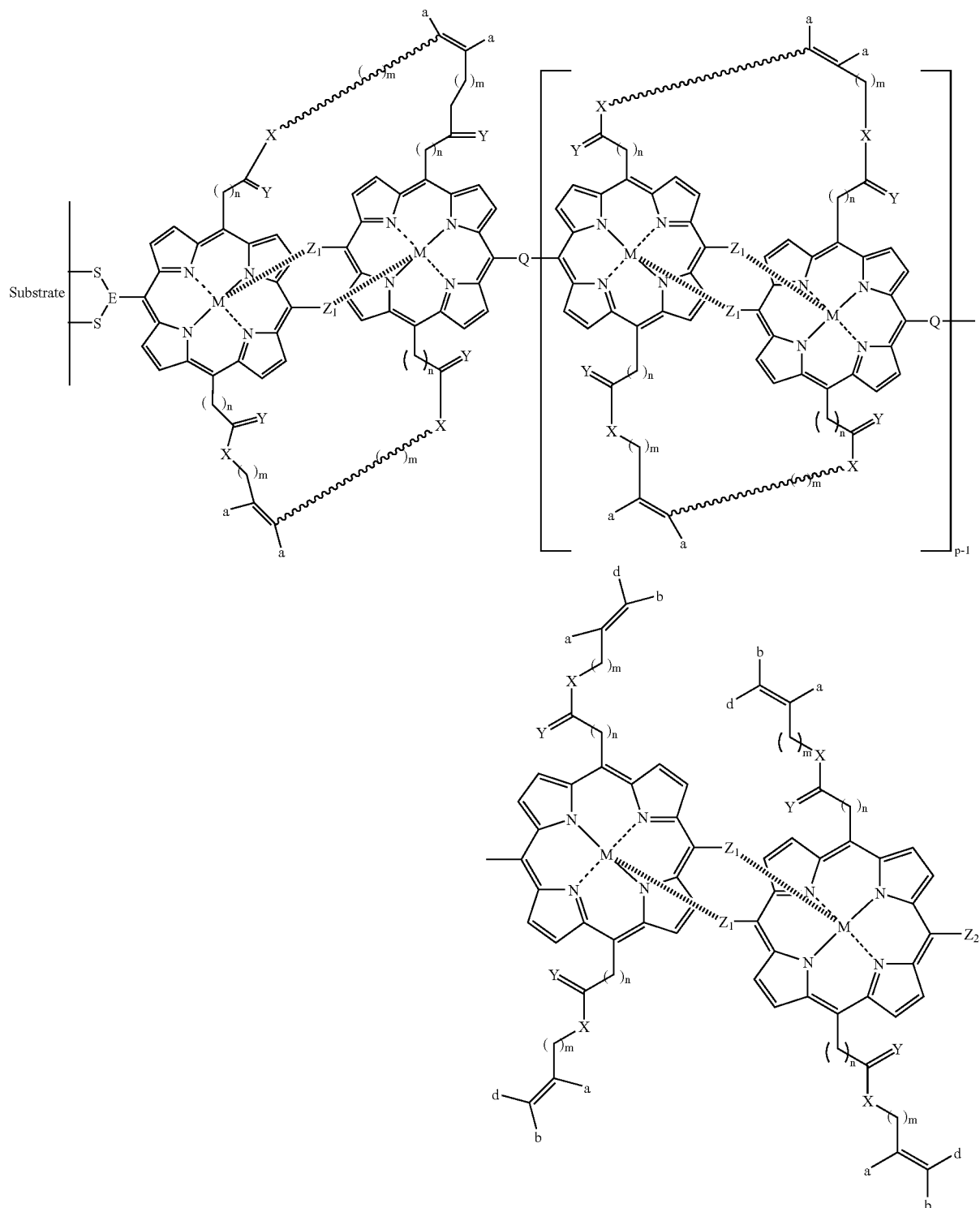

(wherein each of the substituents is as defined above); and (6) effecting, in the presence of a Grubbs catalyst, a ring-closing metathesis reaction of the olefin portion derived from the porphyrin derivative represented by the formula (VI), with the olefin portion of the porphyrin residue that is coordinated to the porphyrin derivative, so that the porphyrins are fixed to each other by covalent bonds, thereby obtaining a photo-functional molecule element represented by the following formula (VIII) or (VIII'):

(VIII)
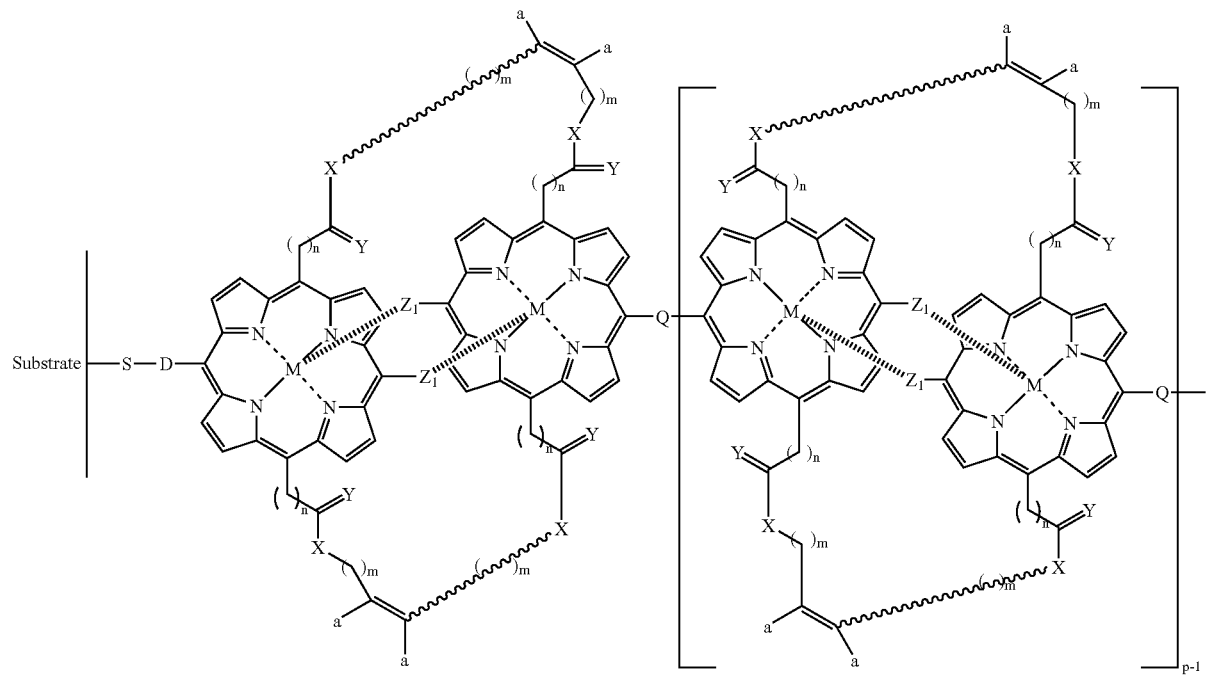
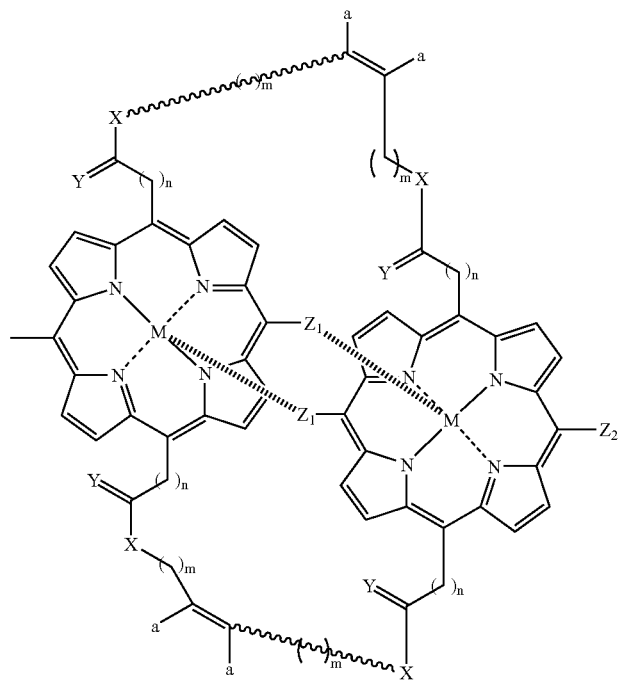

-continued (VIII′)

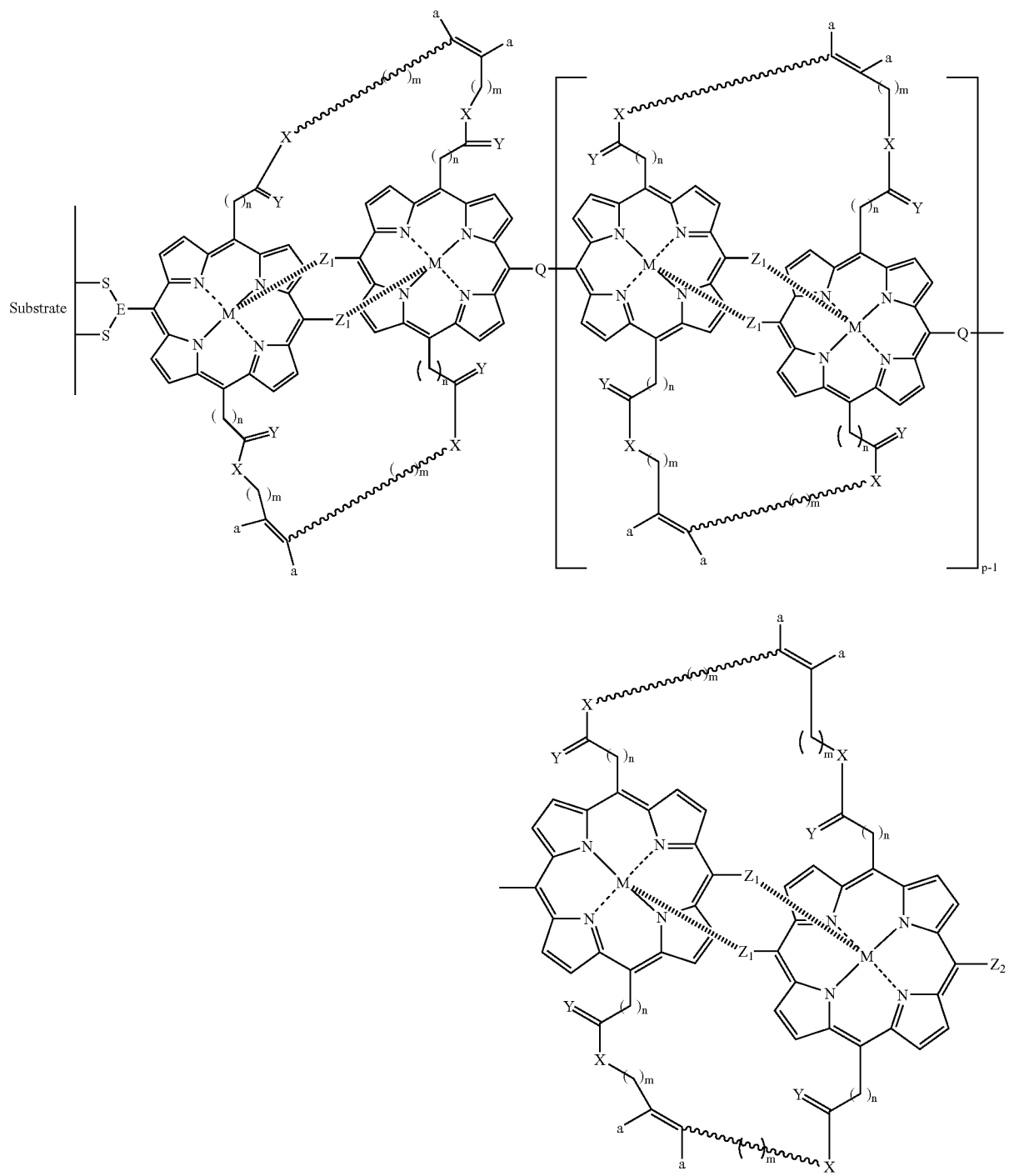

(wherein each of the substituents is as defined above).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a graph showing results of photocurrent measurement of Antenna-ZnSAM/Au F-5 (white and black circles indicate photocurrent and dark current, respectively).

DETAILED DESCRIPTION OF THE INVENTION

Figure 1:
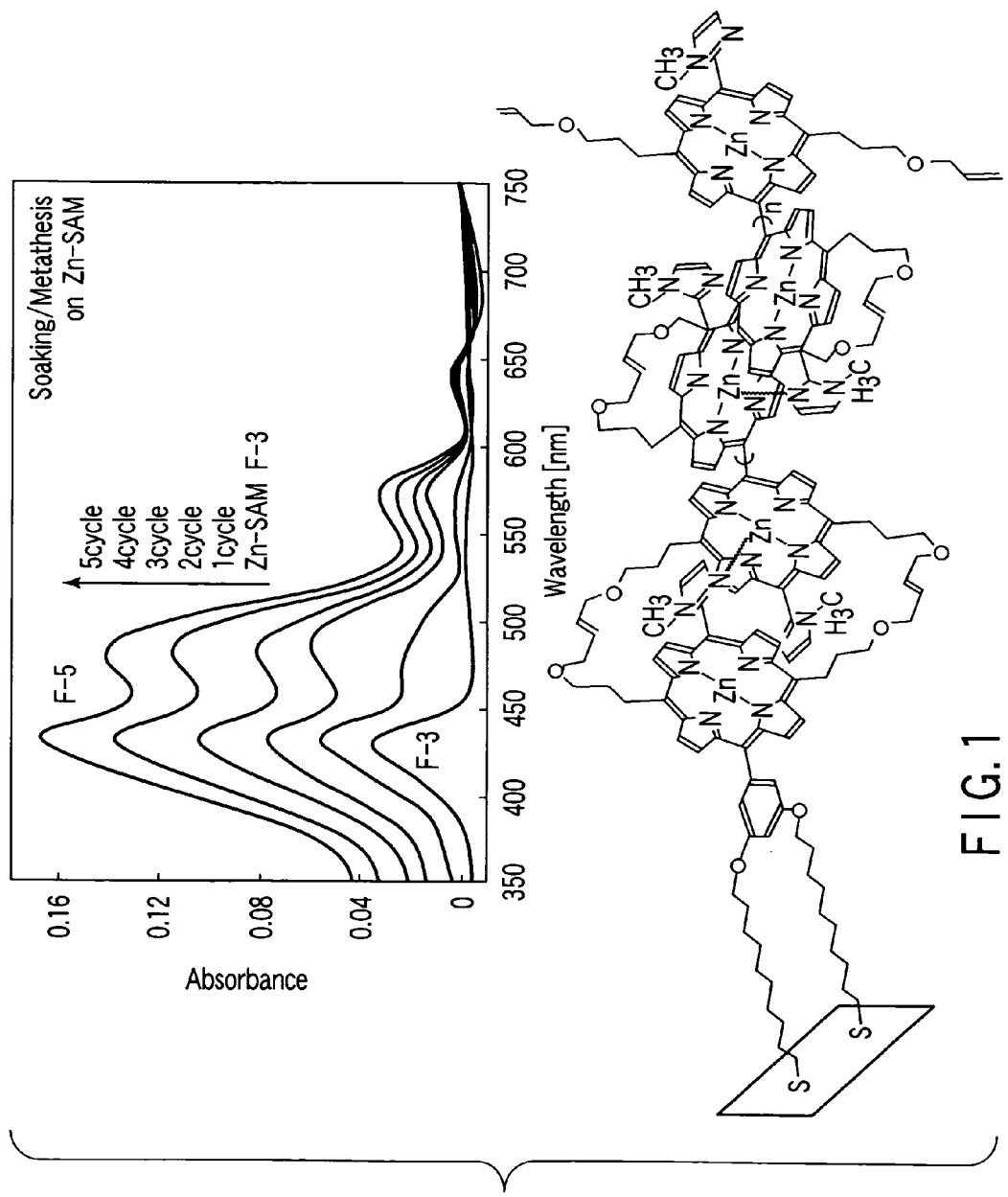
FIG. 1 is a graph showing absorbance at each cycle (totally 5 cycles) required for obtaining Zn-SAM F-3 and Antenna-ZnSAM/Au F-5.

First, the photo-functional molecule element in which covalently-fixed porphyrin polymer is laminated on a support, and represented by the formula (VIII) or (VIII') will be described in detail.

In the formula (VIII), a represents H, an alkyl group or aryl group. A plurality of a's may be the same or different. A plurality of a's are preferably the same, in light of making the preparation process simple.

The alkyl group herein indicates a normal, branched or cyclic monovalent saturated aliphatic group (hereinafter, when a substituent is an alkyl group, the same principle as described above will be applied thereto). The aryl group indicates a monovalent aromatic hydrocarbon group, which may either be a monocyclic or condensed ring of two or more rings (hereinafter, when a substituent is an aryl group, the same principle as describe above will be applied thereto). Further, the alkynyl group represents a normal, branched or cyclic unsaturated aliphatic group. The above-described alkyl group, alkynyl group and aryl group may have a substituent, when it is possible to do so (hereinafter, this principle is also applied to a group other than the alkyl group and the aryl group).

The number of carbon atoms of the alkyl group represented by a may be determined in consideration of whether or not the double bond between the carbon atom to which one a is bonded and the carbon atom to which another a is bonded, can serve for a ring-closing metathesis reaction, whether or not a compound as a raw material of the alkyl group can be synthesized easily, and/or the function which the synthesized product is expected to have. The number of carbon atoms of the alkyl group is generally 1 to 8, and preferably 1 to 2.

The number of carbon atoms of the aryl group represented by a may be determined from the same viewpoint as described above. The number of carbon atoms of the aryl group represented by a is generally in a range of 6 to 20 (e.g., phenyl, naphthyl, anthracenyl, pyrenyl, naphthacenyl), and preferably in a range of 6 to 10.

In the general formula (VIII), X represents —O—, —S—, >$NR_{101}$ (wherein $R_{101}$ represents H or an alkyl group), $CH_2$ or single bond.

The number of carbon atoms of the alkyl group represented by $R_{101}$ is not particularly restricted, but is generally in a range of 1 to 4.

In the general formula (VIII), X is preferably —O— in light of the easiness in synthesis of the raw material compound and the function expected for the synthesized product.

In the general formula (VIII), Y represents =O, =S or 2H. Here, the expression that "Y represents 2H" indicates a state in which each of two hydrogen atoms is bonded, by single bond, to a carbon atom to which Y is bonded.

Y is preferably =O in light of the easiness in synthesis of the raw material compound and the function expected for the synthesized product.

In the general formula (VIII), m represents an integer of 0 to 4. m is preferably 1 in light of the easiness in synthesis of the raw material compound and the function expected for the synthesized product.

In the general formula (VIII), n represents an integer of 0 to 6. n is preferably 2 in light of the easiness in synthesis of the raw material compound and the function expected for the synthesized product.

In the general formula (VIII), $Z_1$ represents a 5- or 6-membered nitrogen-containing heteroaromatic ring group capable of forming a coordination bond. A "5- or 6-membered nitrogen-containing heteroaromatic ring group capable of forming a coordination bond" indicates a 5- or 6-membered heterocycle containing at least one nitrogen atom therein, and the type thereof is not particularly restricted as long as the heterocycle has aromaticity. The heterocycle may include oxygen, sulfur or the like as a hetero atom other than nitrogen. In a case in which a structural isomer of the nitrogen-containing heteroaromatic ring group exists, such a structural isomer is included to $Z_1$.

Examples of the 5- or 6-membered nitrogen-containing heteroaromatic ring group include imidazolyl group, oxazolyl group, thiazolyl group and pyridyl group shown below, but the heteroaromatic ring is not limited to these:

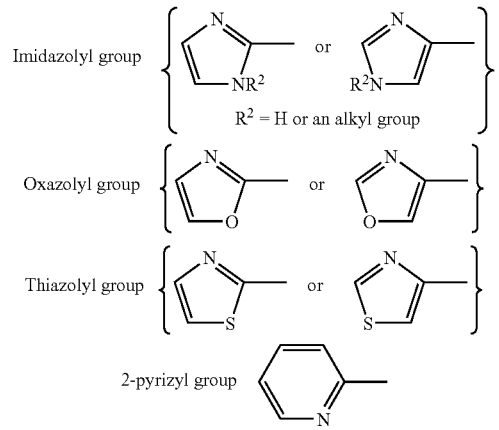

In the above-described imidazolyl group, the number of carbon atoms of the alkyl group represented by $R^2$ is generally in a range of 1 to 10, and preferably 1 or so in light of the easiness in synthesis of the raw material compound and the function expected for the synthesized product.

In the general formula (VIII), $Z_1$ is preferably imidazolyl group in light of the strength of bond between $Z_1$ and the core metal of the porphyrin metal complex.

In the general formula (VIII), $Z_2$ represents a group having a functional group which can be an electron acceptor or electron donor, or a group which can be the terminal group of the porphyrin polymer.

Specific examples of the group having a functional group which can be an electron acceptor, represented by $Z_2$, include the following groups:

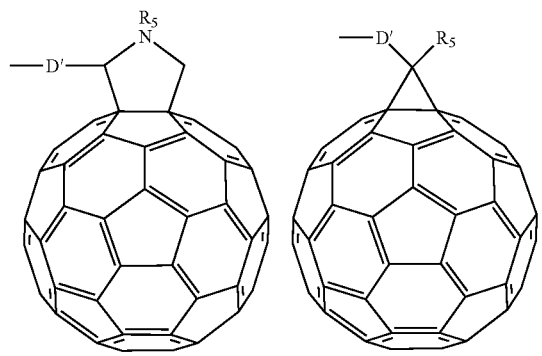

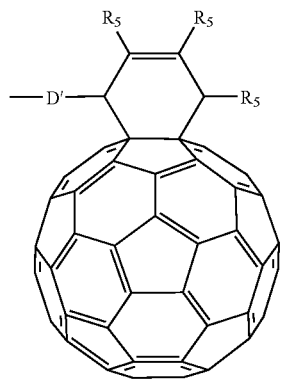

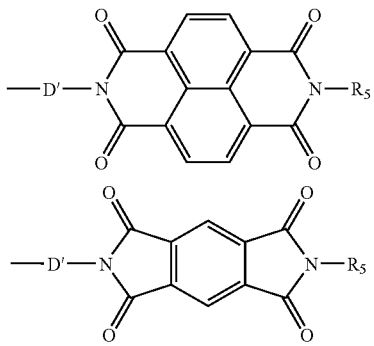

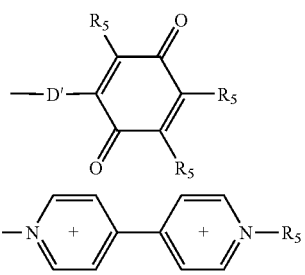

-continued

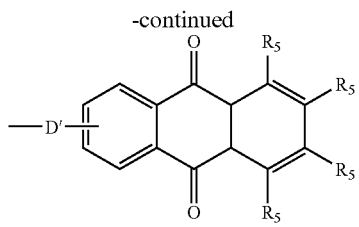

[(wherein D' represents, in addition to those defined as D of the general formula (VIII), a single bond,

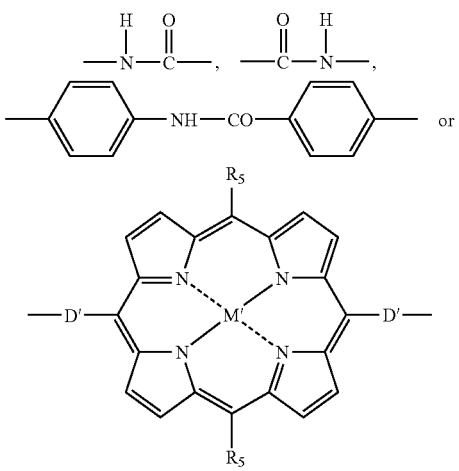

(wherein $R_5$ represents H, an alkyl group, aryl group, halogen atom, cyano group or alkoxy group. Two $R_5$s may be the same or different. M' represents 2H or an ion of the metal selected from typical metals and transition metals represented by M)], but the group having a functional group which can be an electron acceptor is not limited to these. For example, a group capable of receiving an electron from excited porphyrin (such as a metal complex whose energy level of reduction potential is lower than that of excited porphyrin) can be a group having a functional group which can be an electron acceptor.

Examples of the group that can be the terminal group of porphyrin polymer, and represented by $Z_2$, include an alkyl group, aryl group and alkynyl group. The number of the carbon atoms of the alkyl group and that of the aryl group are the same as described above for the substituent represented by a. In a case in which the group represented by $Z_2$ is alkynyl group, the number of carbon atom of the $Z_2$ group may be in a range of 2 to 18, and preferably 2 or so.

In a case in which the group represented by $R_5$ is an alkyl group, aryl group or alkoxy group, the number of carbon atoms of the $R_5$ group is defined in the same manner as described above. The alkyl portion of the alkoxy group is defined in the same manner as described with regards to the aforementioned substituent represented by a. In a case in which the group represented by RS is a halogen atom, specific examples of the halogen atom include F, Cl, Br, I and the like.

Specific examples of the group having a functional group which can be an electron donor, represented by $Z_2$, include the following groups:

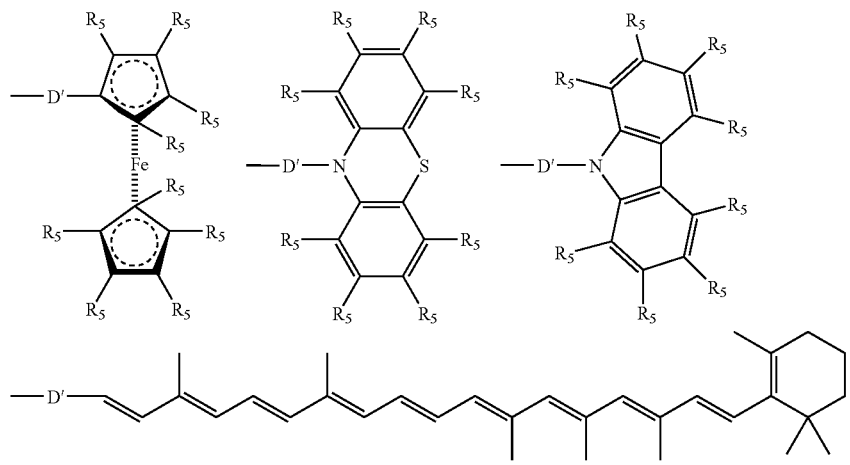

[wherein D' represents, in addition to those defined as D of the general formula (VIII), a single bond,

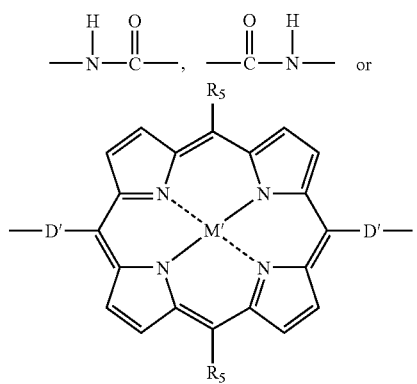

(wherein $R_5$ represents H, alkyl group, aryl group, halogen atom, cyano group or alkoxy group. Two $R_5$s may be the same type or different. M' represents 2H or an ion of the metal selected from typical metals and transition metals represented by M)], but the group having a functional group which can be an electron donor is not limited to these examples. For example, a group capable of donating an electron to oxidized porphyrin (such as a metal complex whose energy level of oxidation potential is higher than that of one electron-oxidized porphyrin) can be a group having a functional group which can be an electron donor.

In the formula (VIII), D represents a divalent group including at least one of arylene group and alkylene group. E represents a trivalent group including at least one of arylene group and alkylene group. $R^3$ represents H or an acetyl group.

The above-described "divalent group including at least one of arylene group and alkylene group" represented by D indicates a divalent group having arylene group and/or alkylene group at terminal ends thereof, and between which terminal end groups, at least one group such as ether group, carbonyl group and functional group having a hetero atom (e.g., an ester group, and amido group) intervenes, but such intervening group may not exist. The intervening group(s) located between the two terminal end groups is a group that can be used for linking a porphyrin ring with a sulfur atom-containing group when a linker molecule is synthesized. The number of carbon atoms of the arylene group and alkylene group is not particularly restricted, but is generally in a range of 1 to 18 for the alkylene group and in a range of 6 to 13 for the arylene group.

The above-described "trivalent group including at least one of arylene group and alkylene group" represented by E indicates a group obtained by removing one hydrogen atom from the aforementioned group represented by D.

In the formula (VIII), M represents an ion of a metal selected from the group consisting of typical metals and transition metals. Here, the "typical metals" represent metals which belong to 1A, 2A, 2B, 3B to 7B and 0 groups on the periodic table, and specific examples thereof include Mg, Zn, Cd, Hg, Al, Ga, In, Tl, Si, Ge, Sn, Pb, P, As, Sb, Bi and the like. The "transition metals" represent metals which belong to 3A to 7A, 8 and 1B groups, and specific examples thereof include Sc, Y, lanthanoid (La, Ce, Pr, Nd, Pm, Sm, Eu, Gd, Tb, Dy, Ho, Er, Tm, Yb, Lu), Ti, Zr, Hf, V, Nb, Ta, Cr, Mo, W, Mn, Tc, Re, Fe, Ru, Os, Co, Rh, Ir, Ni, Pd, Pt, Cu, Ag, Au and the like. The valence number of these metals is not particularly restricted, as long as the metals can serve as the core metal of a porphyrin metal complex. The valence number of these metals is generally divalent or trivalent.

The metal represented by M is not particularly restricted, as long as coordinate bond can be formed between M and the above-described Z. The metal represented by M is preferably Zn, Mg, Co or Fe, in light of the reactivity, strength of the coordinate bond, and the function which the synthesized product is expected to effect.

In the formula (VIII), Q represents single bond or a linear divalent linking group. The type of the linear divalent linking group may be determined in consideration of the function which the synthesized product is expected to effect (e.g., conductivity of electron or energy, strength of bond between porphyrin rings, capacity of maintaining a steric configuration).

Herein, the linear, divalent linking group includes: (a) a divalent linking group whose connecting bonds at both ends thereof are aligned on the same line; or (b) a divalent linking group whose connecting bonds at both ends thereof are aligned in parallel with each other. Here, the expression that the connecting bonds at both ends of the divalent linking group are "aligned on the same line" does not necessarily mean that the connecting bonds are aligned on the same, geometrically perfect line. Similarly, the expression that the connecting bonds at both ends of the divalent linking group are "aligned in parallel with each other" does not necessarily mean that the connecting bonds are aligned in parallel with each other in the geometrically perfect manner. Accordingly, it suffices, as long as the polymer constituted by way of the liner, divalent linking group is not cyclic, but takes on the substantially linear chain-like form as a whole. In particular, in the case in which the polymer formed by way of the liner, divalent linking group is relatively long, the connecting bonds at both ends of the liner, divalent group need to be neither aligned on the same, geometrically perfect line nor aligned in parallel (with each other) in the geometrically perfect manner. In this case, a chain-like polymer can reliably be formed as long as the connecting bonds at both ends of the liner, divalent group are located substantially on the same line or aligned substantially in parallel with each other. Hereinafter, in the present specification, the state in which the connecting bonds are aligned substantially on the same line and the state in which the connecting bonds are aligned substantially in parallel with each other will simply be referred to as "linear" and "in parallel", respectively.

Examples of the group (a) whose connecting bonds at both ends thereof are aligned on the same line include: a divalent, saturated or unsaturated aliphatic hydrocarbon group [e.g., alkylene group having 1–3 carbon atoms (e.g., —CH$_2$—), —C≡C—]; a divalent, saturated or unsaturated hydrocarbon ring group [e.g., a monocycle or condensed ring having 3–20 carbon atoms (e.g., 1,3-cyclobutylene (in trans form), 1,4-phenylene, 2,7-pyrenylene); a divalent, saturated or unsaturated hetero cyclic group [e.g., a 6-membered hetero cycle containing at least one N, S, O or P atom or the like as a hetero atom (such as 2,5-pyridine); and a combination of at least two of the aforementioned divalent groups. When at least two of the aforementioned divalent groups are combined, the groups may be either the same (the resulting structure is what is called a bis structure) or different. Combining the groups of the same type is preferable, in light of making the synthesis of the raw material compound easy. Further, when at least two of the aforementioned divalent groups are combined, these divalent groups may be intervened by a group whose connecting bonds at both ends thereof are aligned on the same line, such as —O— and —C(═O)—. Still further, the divalent groups may be intervened by any linking group, as long as the connecting bonds of both ends of the linking group represented by Q are eventually aligned on the same line.

Examples of the group (b) whose connecting bonds at both ends thereof are aligned in parallel with each other include: a divalent, saturated or unsaturated hydrocarbon group [e.g., linear alkyl groups having 3–5 carbon atoms (such as n-propylene), —C═C— (in trans form)]; a divalent, aromatic hydrocarbon ring group [e.g., condensed ring having approximately 10–20 carbon atoms (e.g., 2,6-naphthylenyl and 1,6-pyrenylene)]; and the like.

Further, the aforementioned group (a) whose connecting bonds at both ends thereof are aligned on the same line may be combined with the aforementioned group (b) whose connecting bonds at both ends thereof are aligned in parallel with each other, as long as the connecting bonds of the thus formed divalent group are eventually aligned on the same line or aligned in parallel with each other.

Specific examples of the divalent linking group whose connecting bonds at both ends thereof are: (a) aligned on the same line or (b) aligned in parallel with each other are described below. It should be noted, however, that the group represented by Q is not limited to these.

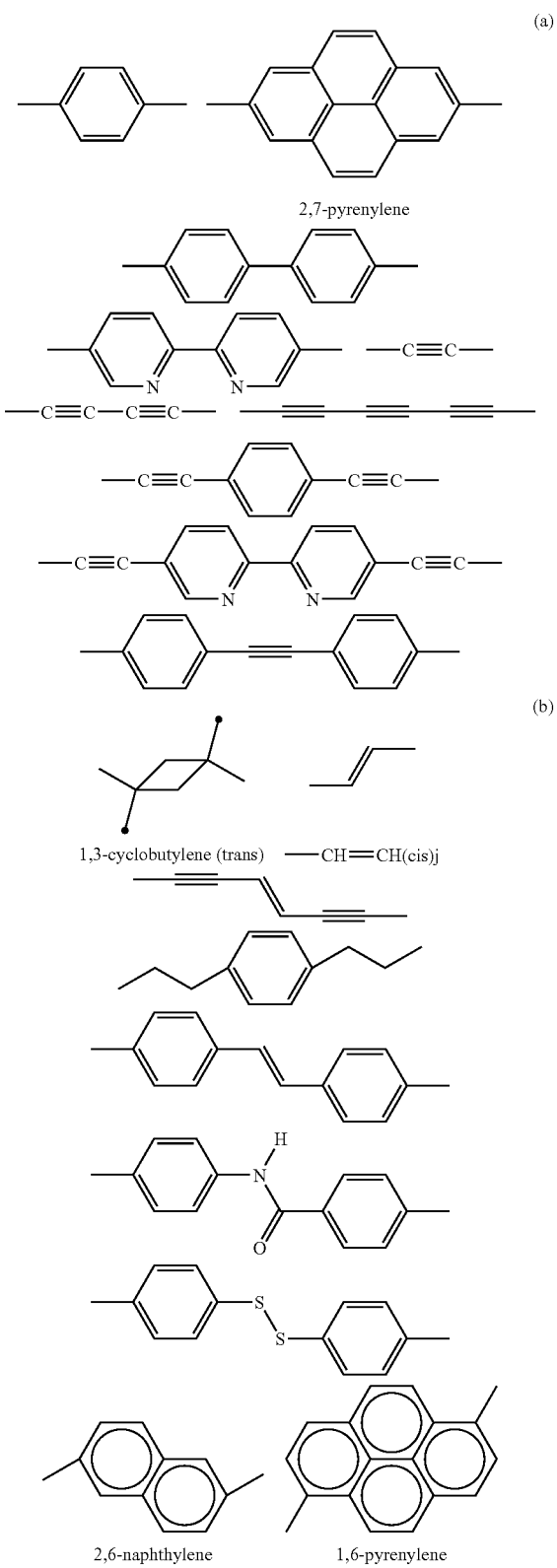

In the formula (VIII), Q is preferably a single bond or alkynylene group represented by the formula: (—C≡C—)$_n$, wherein n represents an integer of 1 to 3), in consideration of the strength of the bond, stability, and easiness of the synthesis of the raw material.

In the formula (VIII), p represents an integer o 1 or more. The value of p may be selected in an appropriate manner, in accordance with the application of the photo-functional molecule element of the present invention. The upper limit of the p value is not particularly restricted, and it is assumed that the photo-functional molecule element whose p value is approximately 10,000 could be produced. At the present stage, the photo-functional molecule element whose p value is approximately 100 can be produced.

The photo-functional molecule element represented by the formula (VIII) includes a photo-functional molecule element in which two or more types of porphyrins are laminated and fixed in a desired order. For example, the photo-functional molecule element represented by the formula (VIII) can be made a gradient-functional material having a gradient of potential, by fixing stepwise porphyrin polymers which are different in energy level as shown in the schematic view set forth below:

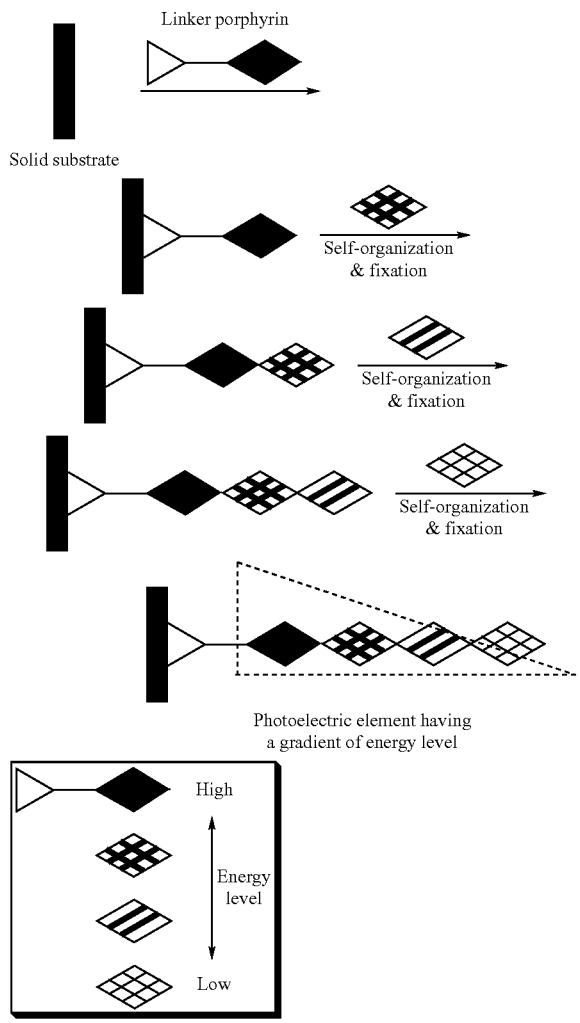

As a result, the direction in which an electron and a hole flow can be controlled (i.e., rectification can be effected). Since transfer of photo-excited electrons is caused in each of the porphyrins as the structural unit, the photo-functional molecule of the formula (VIII) can be used as a photo-functional molecule element. Specifically, it has already been confirmed that the thus produced element functions as a photoelectric conversion element (refer to example 3).

In the formula (VIII), examples of a metal material which can be used as the substrate include, apart from gold, a metal having good conductivity such as silver, copper, platinum, palladium, nickel, aluminum, and a material obtained by vapor-depositing one of these metals on a solid substrate (e.g., slide glass, mica, silicon wafer) such that the thickness of the metal is generally 50 to 1000 Å. Also, semiconductor including $TiO_2$, $SnO_2$, ITO (indium tin oxide), CdS, CdSe, GaAs, GaP, Si, InP, CdTe, and a semiconductor obtained by adding an electron acceptor or electron donor to one of the above-described semiconductors so that the band structure thereof is changed, may be used as the substrate. Also, organic solid substrate including macromolecular polymers of various types and an organic solid substrate obtained by coating one of these polymers on a solid substrate such that the thickness of the polymer is generally 50 to 1000 Å, may be used as the substrate. Conductive or semiconductive polymer (PPV, i.e., polyphenylenevinylene-type polymer), P3OT (polythiophene-type polymer), polypyrrole-type polymer, polyacetylene-type polymer, polydiacetylene-type polymer, in particular, are especially promising because these polymers can construct a completely organic element by being combined with a porphyrin element.

Although the formula (VIII) set forth above shows a state in which a porphyrin chain extends from a substrate by way of a single —S— bond, the photo-functional molecule element of the present invention is generally formed on the substrate so as to expand thereover as a film. In one example, in a case in which gold is used as the substrate, the surface-coating rate calculated by the Au—S reductive elimination method is approximately $7 \times 10^{13}$ molecule/cm$^2$ ($10^{-10}$ mol/cm$^2$). That is, the area of the gold substrate occupied by one molecule thereon is approximately 3 nm$^2$/molecule. As the width of the porphyrin ring is approximately 1 nm, it is understood that the film is formed on the substrate quite densely.

In the formula (VIII) set forth above, the porphyrin chain extends in a direction of normal line to the substrate surface. It should be noted, however, that the angle formed between the porphyrin chain and the substrate surface in the formula (VIII) does not necessarily reflect an angle actually formed in practice. In consideration of the above-described assumption from the data of the area occupied by one porphyrin molecule that the porphyrin molecules are densely arranged and a fact that the structure of the porphyrin chain properly extends, it is assumed that the porphyrins are bonded to the substrate surface so as to stand on the substrate surface, with an angle in a certain range formed therebetween.

The photo-functional molecule element represented by the formula (VIII') is different from the photo-functional molecule element represented by the formula (VIII) in that the linker molecule is bonded to the substrate by way of two sites, but the former shares the same definitions of the substituents and the like as the latter. In the photo-functional molecule element represented by the formula (VIII'), the laminated porphyrins are fixed on the substrate more firmly than the photo-functional molecule element represented by the formula (VIII) are because the linker molecule of the former is bonded to the substrate by way of two sites. The photo-functional molecule element represented by the formula (VIII') has an advantage that porphyrins thereof are less likely to peel off in the soaking and washing processes for extending the porphyrin polymer. For example, in the case of the photo-functional molecule element represented by the formula (VIII) in which the laminated porphyrins are bonded to the substrate by way of one site, the absorption attributed to porphyrin may decrease by approximately 50% due to the soaking and washing processes. In contrast, in the case of the photo-functional molecule element represented by the formula (VIII'), it is assumed that the porphyrins are less likely to peel off and thus the magnitude of a decrease in the absorption attributed to porphyrin is relatively small.

Next, the method of producing the photo-functional molecule element represented by the formula (VIII) or the formula (VIII') will be described in detail. In the following descriptions, each of the substituents has the same manner as described above, unless otherwise specified.

The method of producing the photo-functional molecule element represented by the formulae (VIII) or (VIII') includes the processes (1) to (6) set forth below.

(Process 1): A step of fixing, on a substrate, a linker molecule represented by the following formula (I):

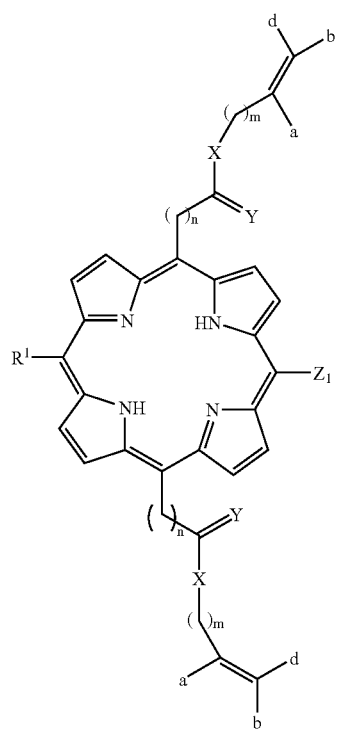
(I)

[wherein a, b and d independently represent H, an alkyl group or aryl group; X represents —O—, —S—, >NR$_{101}$ (wherein R$_{101}$ represents H or an alkyl group), CH$_2$ or single bond; Y represents =O, =S or 2H; m represents an integer of 0 to 4; n represents an integer of 0 to 6; Z$_1$ represents a 5- or 6-membered nitrogen-containing heteroaromatic ring group capable of forming a coordination bond; and R$^1$ represents

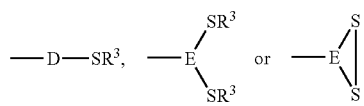

(wherein D represents a divalent group including at least one of arylene group and alkylene group; E represents a trivalent group including at least one of arylene group and alkylene group; and R$^3$ represents H or an acetyl group)]; and a step of introducing a metal M selected from the group consisting of typical metals and transition metals to the porphyrin residue derived from the linker molecule, thereby obtaining a monomolecular film represented by the following formula (II) or (II'):

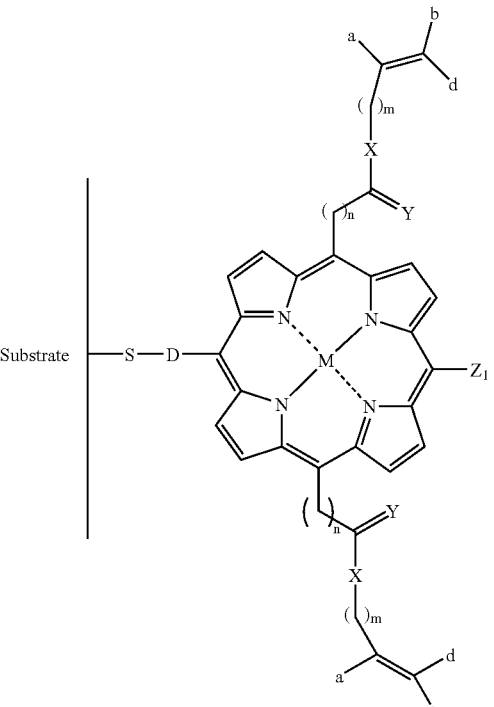
(II)

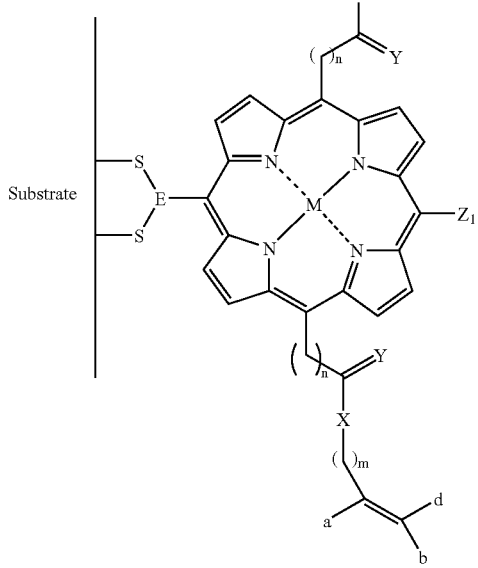
(II')

(wherein each of the substituents is as defined above).

In the process (1), either one of the step of fixing the linker molecule on the substrate and the step of introducing the metal M to the porphyrin residue may be carried out earlier. In other words, the order of these two steps may be reversed. However, fixing the linker molecule on the substrate first and then introducing the metal M thereto results in a better monomolecular film and thus is preferable.

The substrates, e.g., the substrate on which gold or the like has been vapor-deposited, are commercially available or can be prepared from a commercial product by the method disclosed in literatures.

The linker molecule can be fixed on a substrate by soaking (generally overnight) the substrate in a solution of the linker molecule. Examples of the solvent of the linker molecule solution include $CH_2Cl_2$, chloroform, bromobenzene, methanol or pyridine, but the solvent is not limited to these. Any solvent that dissolves the linker molecule and is adaptable to the substrate may be used. Even a polar solvent may be used, because the bond between the linker molecule and the substrate is so strong that the bond is maintained in a polar solvent.

The metal M can be introduced into the porphyrin ring by soaking (generally for 60 to 120 minutes) the substrate having the linker molecule fixed thereon in a solution of a salt (e.g., an acetate or hydrochloride) of the metal to be introduced. Example of the solvent is $CHCl_3$ and/or methanol, but the solvent is not limited to these. Any solvent that dissolves the metal salt and is miscible with porphyrin may be used.

During this process, it is preferable that the mixture is heated so that the temperature thereof is increased to about 40 to 50° C. In a case in which the metal M is introduced to the porphyrin ring prior to fixing the linker molecule on a substrate, the metal M can be introduced into the porphyrin ring in a condition similar to that described above.

The monomolecular film obtained by the process (1) and represented by the formula (II) or the formula (II') is washed, if necessary, and then the next process (2) is carried out thereto. Examples of the solvent which can be used in the washing process include methanol, hexane, $CH_2Cl_2$, but the solvent for washing is not limited to these. A washing process similar to that described above may be carried out between the processes described below.

Process (2): A step of linking the porphyrin residue of the monomolecular film with one of porphyrin residues of meso-meso linked bis-porphyrin represented by the following formula (III):

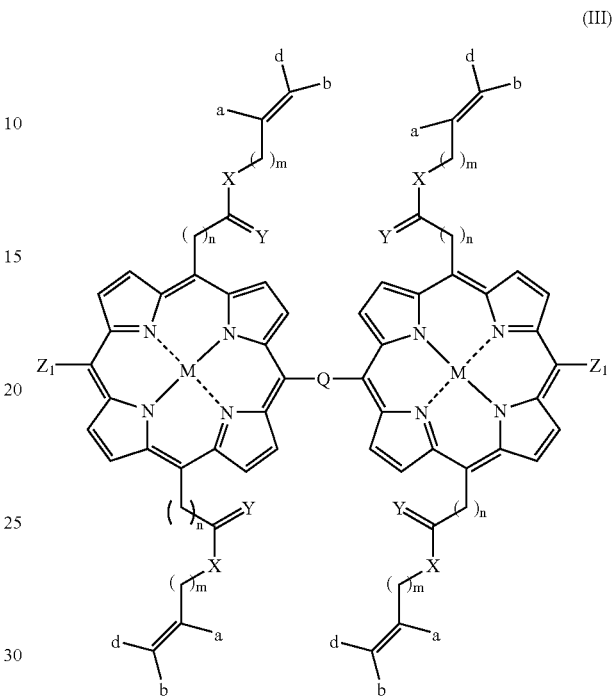

(III)

(wherein each of a, b, d, X, Y, m, n, M and $Z_1$ is as defined above and Q represents a single bond or divalent linking group), via two coordinate bonds, thereby obtaining a first laminate represented by the following formula (IV) or (IV'):

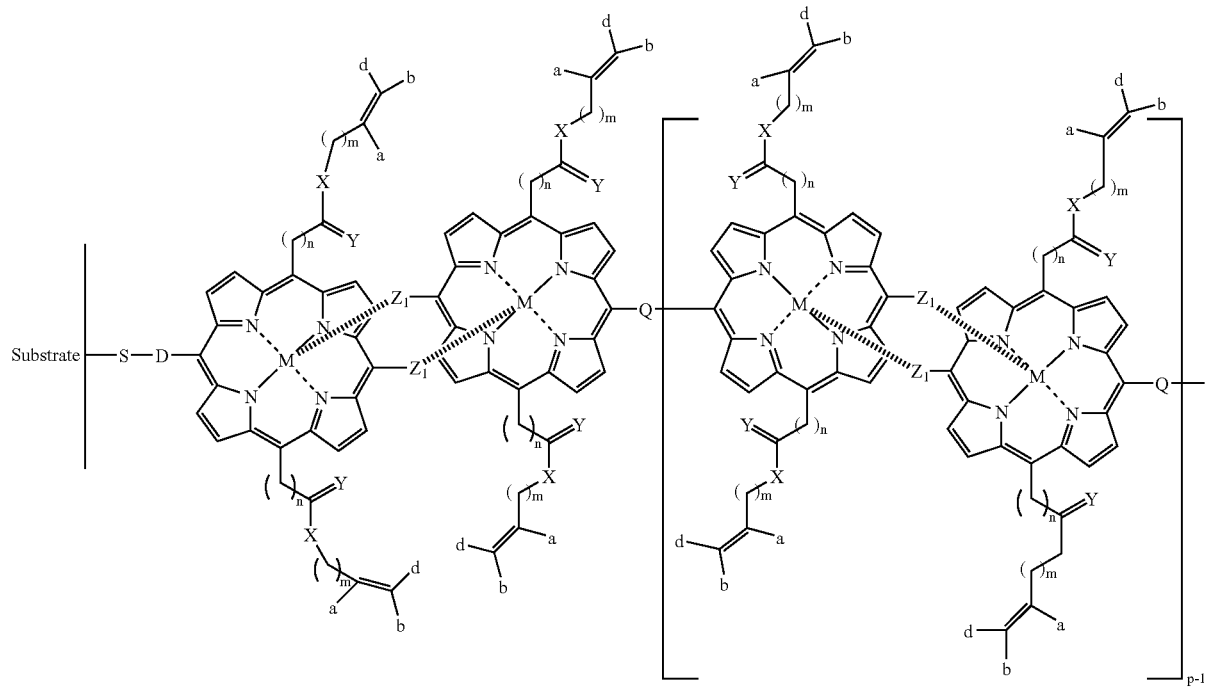

(IV)

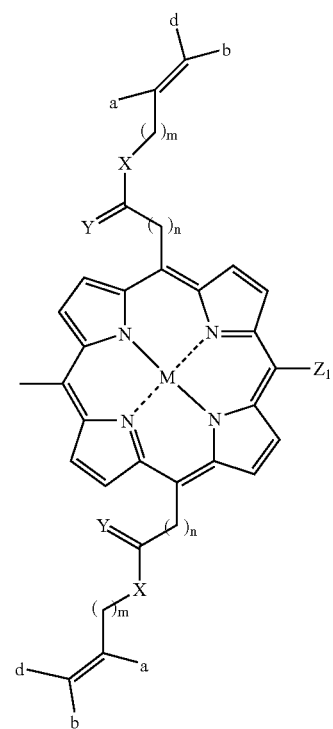
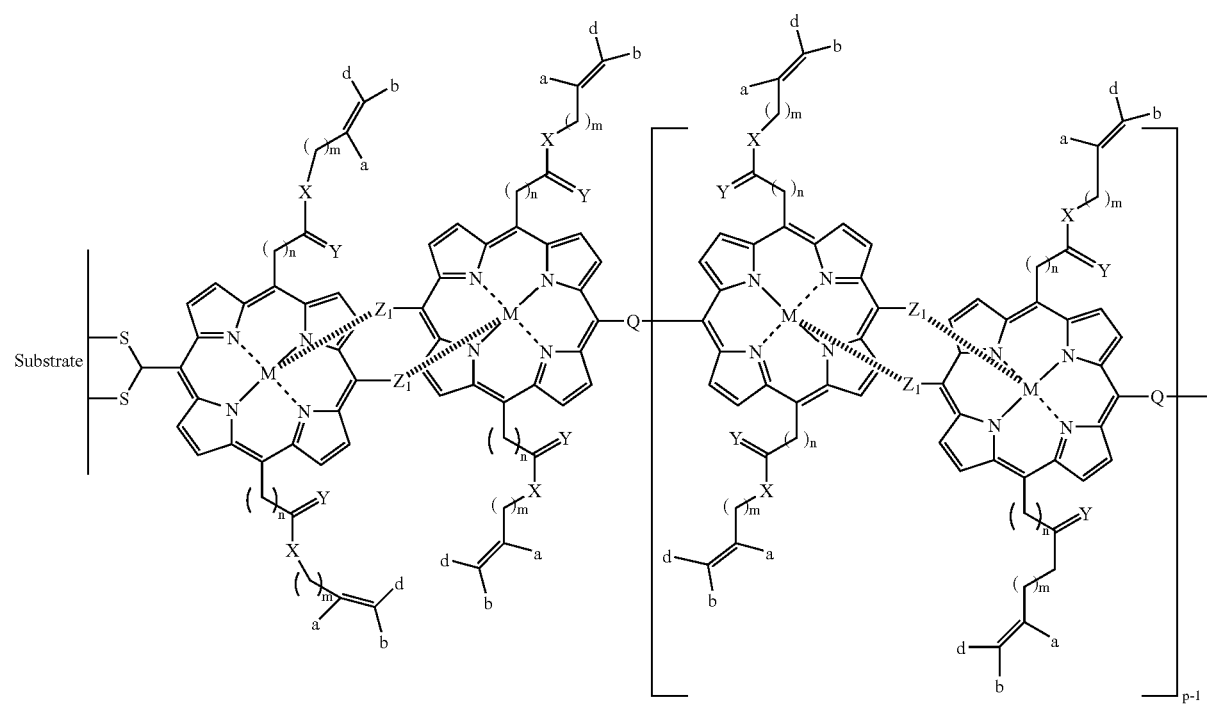
(IV′)

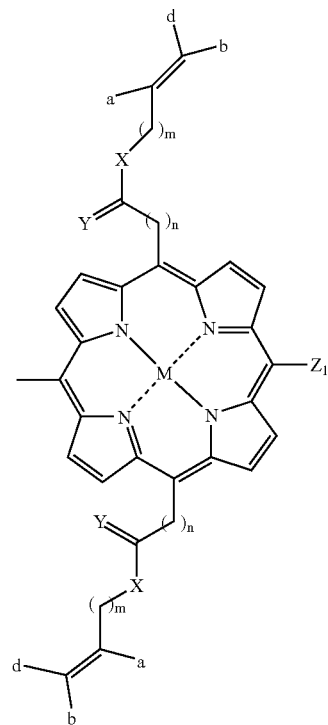

(wherein each of the substituent is as defined above, and p is 1).

In the process (2), the first laminate is obtained by soaking (generally, for 1 to 5 hours) the monomolecular film obtained by the process (1) in a solution of the meso-meso linked bis-porphyrin represented by the formula (III). The solvent that may be used is chloroform or $CH_2Cl_2$ containing approximately 20 mM pyridine. In the solvent mixture, the use of 20 mM pyridine renders the meso-meso linked bis-porphyrin partially dissociated, thereby to make the meso-meso linked bis-porphyrin a short unit, as short as almost a monomer. If no pyridine is used, meso-meso linked bis-porphyrin forms a large polymer and does not extend on the substrate. On the other hand, if the concentration of pyridine in the solvent mixture is higher than 20 mM, the meso-meso linked bis-porphyrin does not form coordination bonds with the porphyrin that has been attached to the substrate, i.e., the polymer does not extend. It should be noted, however, that other solvent mixture having a proper concentration which exhibits the similar characteristics mentioned above may be used.

Process (3): A step of effecting, in the presence of a Grubbs catalyst, a ring-closing metathesis reaction of the olefin portions of the porphyrin residue derived from the linker molecule, with the corresponding olefin portions of the porphyrin residue that is coordinated to the linker molecule, so that the porphyrins are fixed to each other by covalent bonds, thereby obtaining a fixed first laminate represented by the following formula (V) or (V'):

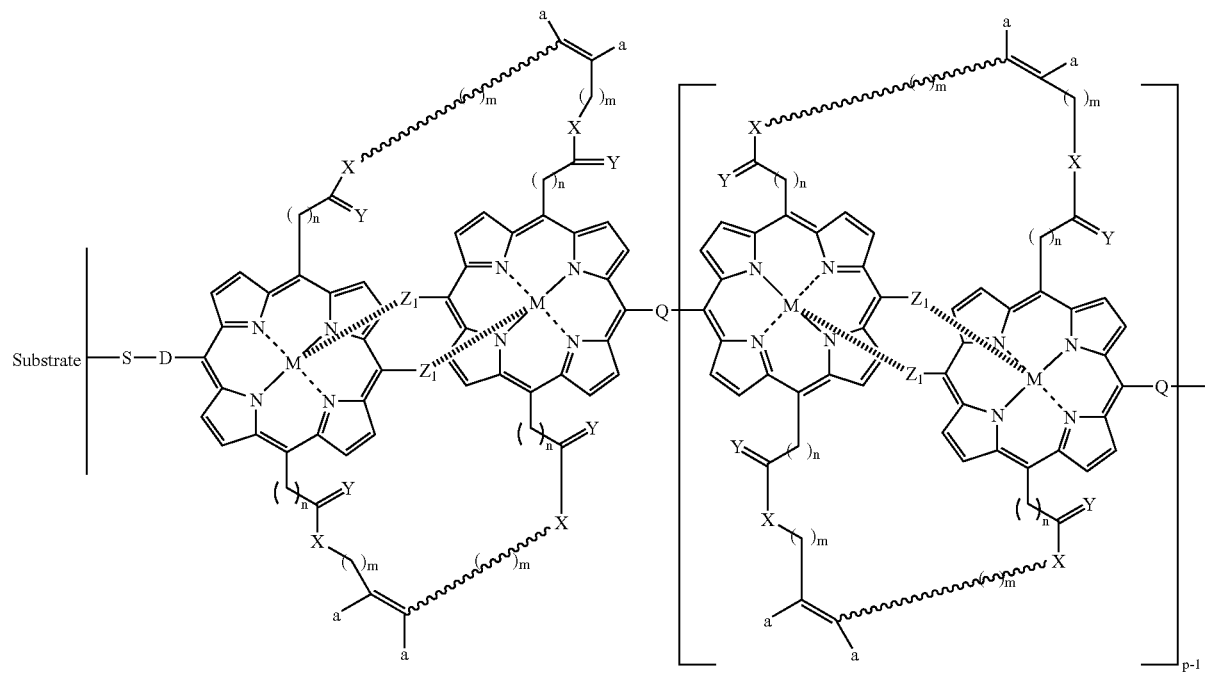
(V)
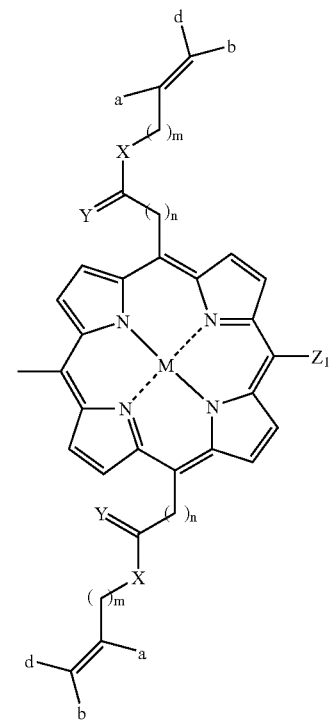

(V')
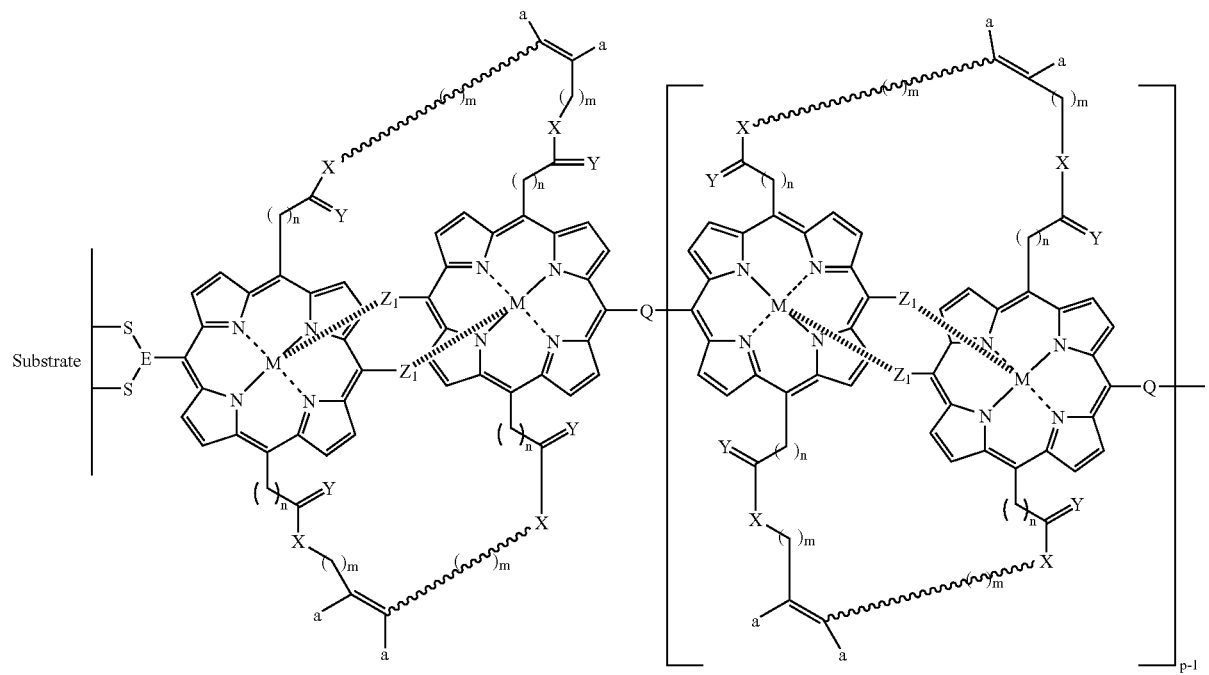
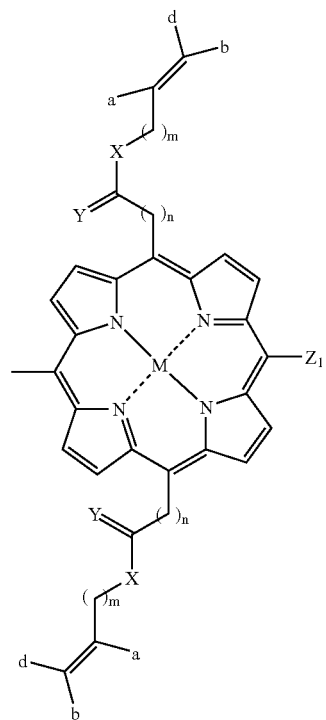

(wherein each of the substituents is as defined above, and p is 1).

The "Grubbs catalyst" used in the process (3) generally represents a ruthenium carbene complex developed by Grubbs et al., which facilitates an olefin metathesis reaction. When this complex is used, even in a case in which an olefin compound having various functional groups such as ester, ketone and amide is employed as a reaction substrate, the metathesis reaction selectively proceeds only at the olefin portion (refer to the general theory by Grubbs et al. (T. M. Trnka, R. H. Grubbs, Acc. Chem. Res. 34, 18 (2001))).

The ring-closing metathesis reaction in the process (3) can be effected by soaking (generally for 5 to 20 minutes) the first laminate obtained in the process (2) in a solution (example of the solvent is a hydrocarbon-based solvent, such as chlorohydrocarbon solvent ($CH_2Cl_2$ or chloroform)) of Grubbs catalyst. It is preferable that this reaction is carried out in inactive atmosphere such as nitrogen or argon. The reaction, however, proceeds in air without causing any problem.

The ring-closing metathesis reaction of the process (3) occurs between the olefin portion of the porphyrin residue derived from the linker molecule of the first laminate and the olefin portion of the porphyrin residue linked, by coordinate bond, with the porphyrin residue derived from the linker molecule. The ring-closing metathesis reaction of the process (3) does not occur between the meso-meso linked bis-porphyrin of the formula (III). This phenomenon occurs due to the conformation of the first laminate.

Process (4): Optional Process

In the method of the present invention, the following steps may be conducted if necessary.

A step of linking the porphyrin residue at the terminal end of the fixed first laminate with one of the porphyrin residues of another meso-meso linked bis-porphyrin represented by the formula (III), via two coordinate bonds, in the same manner as in above (2), thereby obtaining a second laminate represented by the above formula (IV) or (IV'), wherein p represents an integer of 2 or more); and a step of effecting, in the presence of a Grubbs catalyst, a ring-closing metathesis reaction in the same manner as in above (3), thereby obtaining a fixed second laminate represented by the formula (V) or (V'), wherein p represents an integer of 2 or more);

wherein the linking and the effecting the ring-closing metathesis reaction, as a cycle, are sequentially repeated q times, thereby obtaining a fixed $q^{th}$ laminate represented by the formula (V) or (V'), wherein p represents q, and q is an integer of 2 or more;

By adjusting the number of repeating the process (4), the number of laminated layers of the photo-functional molecule element of the present invention can be set at a desired value. The number of the molecules which are laminated at one implementation of the process (4) varies depending on the concentration of the porphyrin solution, time during which the substrate is soaked, reaction temperature and the like. For example, in the condition of example described below, it is assumed that the value of p increases by 2 to 3 at each implementation of the process (4).

Further, by changing the type of the meso-meso linked bis-porphyrin represented by the formula (III), which is used in the process (4), a gradient-functional material having a gradient of potential as shown in the schematic view described above can be prepared.

Process (5): a step of linking the porphyrin residue at the terminal end of the fixed first laminate obtained in above (3) or the fixed $q^{th}$ laminate obtained in above (4), with the porphyrin residue of a porphyrin derivative represented by the following formula (VI):

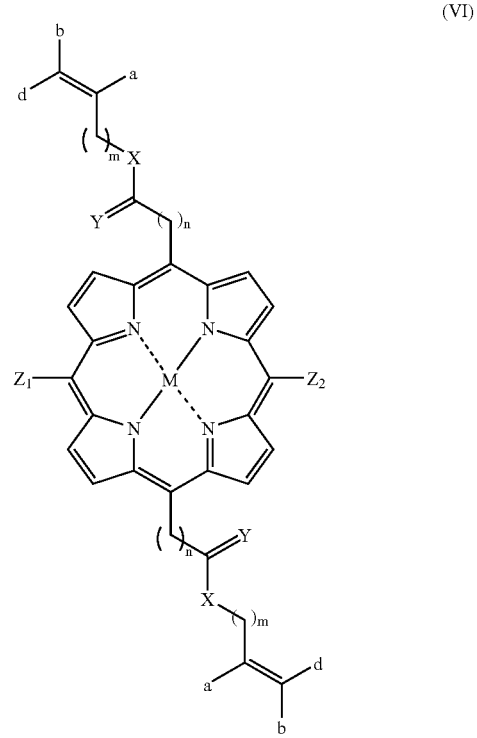

(VI)

(wherein each of $Z_1$, M, X, Y, m, n, a, b and d is as defined above, and $Z_2$ represents a group having a functional group which can be an electron acceptor or electron donor, or a group which can be the terminal group of the porphyrin polymer), via two coordinate bonds, thereby obtaining a photo-functional molecule precursor represented by the following formula (VII) or (VII'):

(VII)
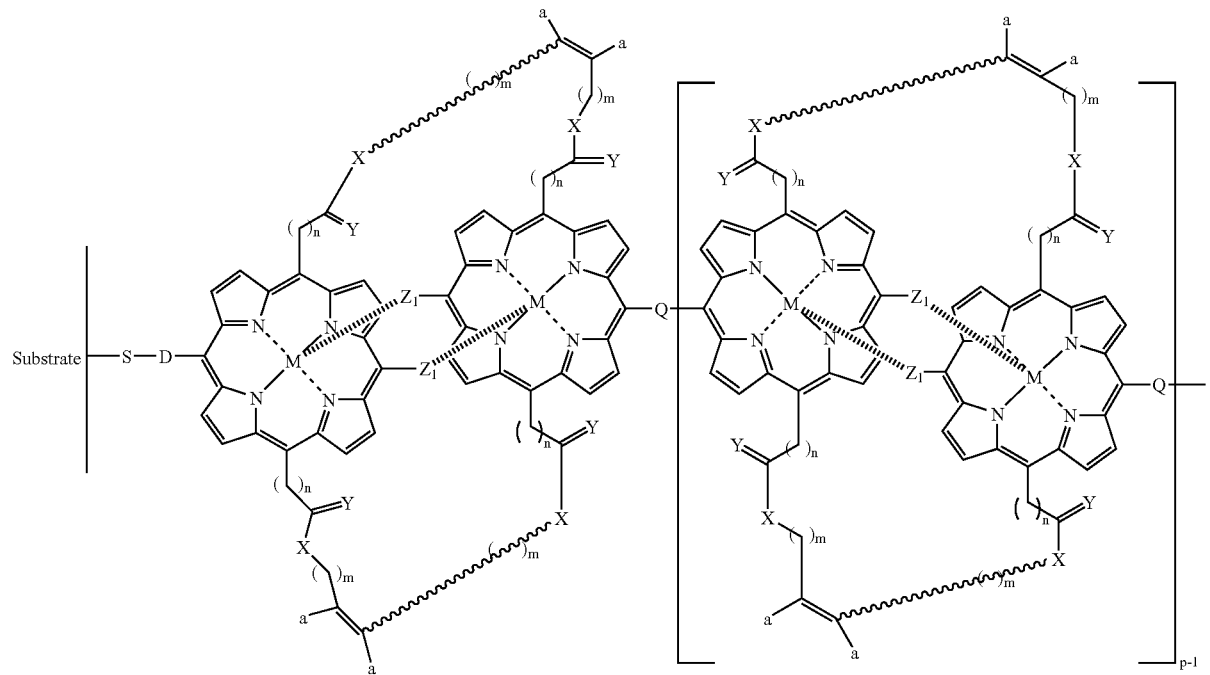
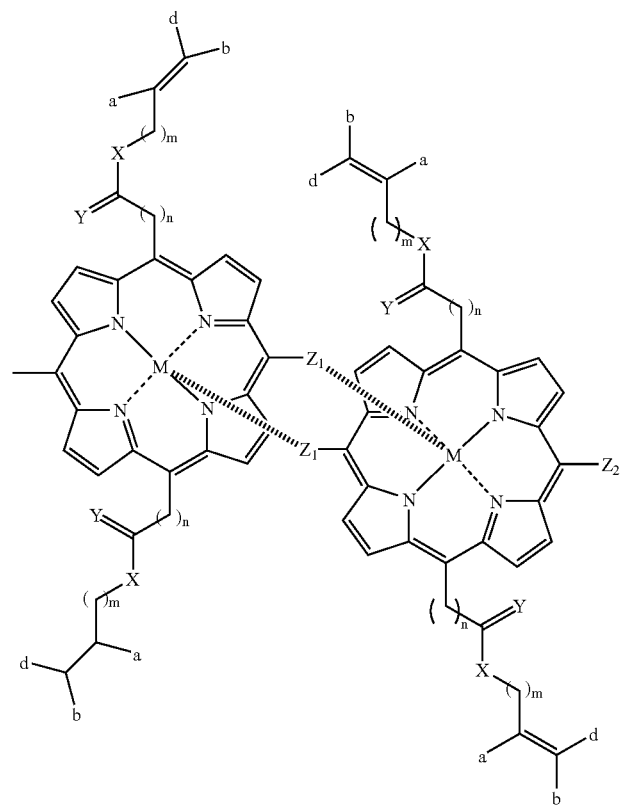

-continued (VII′)

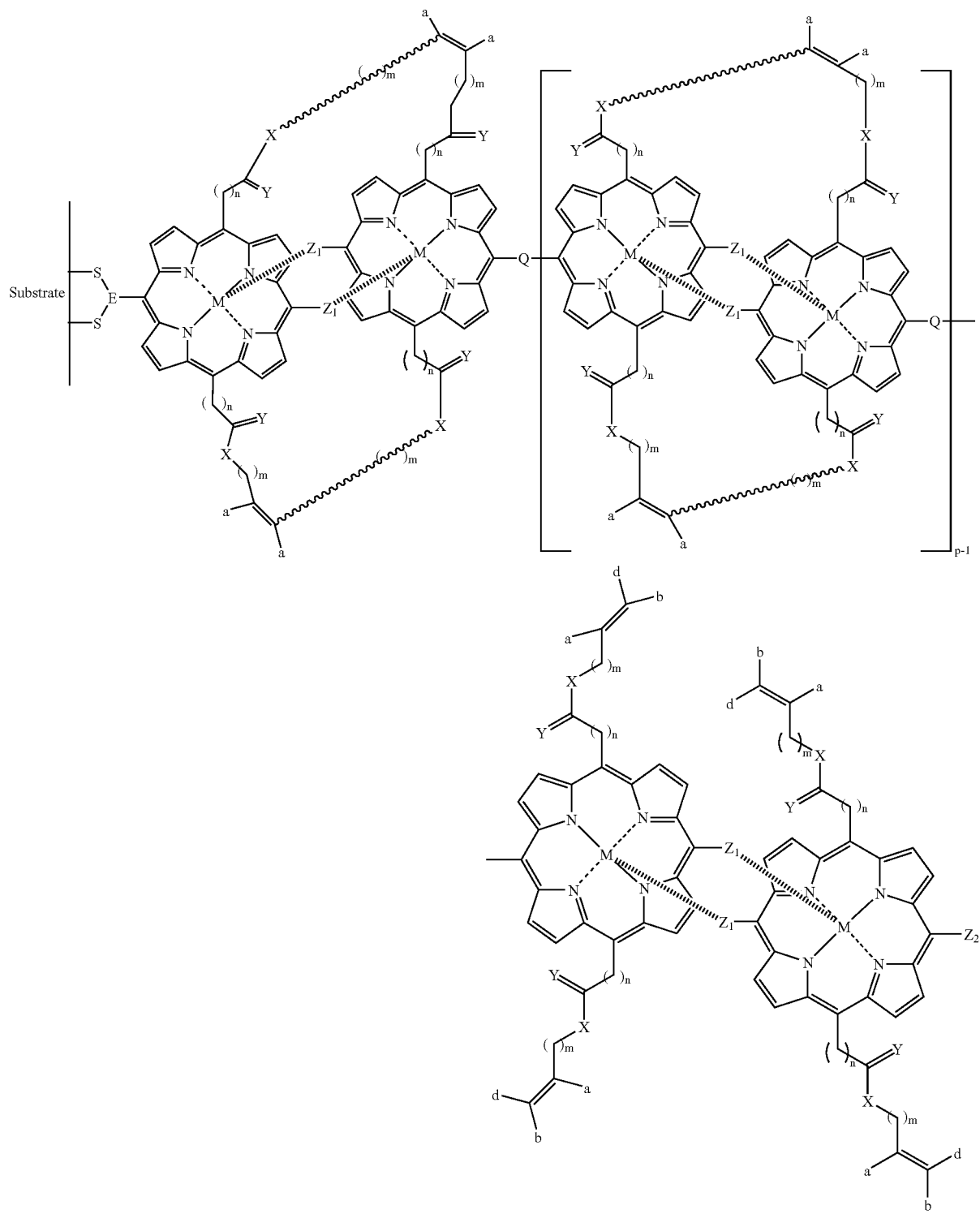

(wherein each of the substituents is as defined above).

In the process (5), a photo-functional molecule precursor is obtained by soaking (generally for 1 to 5 hours) the fixed first laminate or the fixed $q^{th}$ laminate obtained by the optional process (4) in a solution of a porphyrin derivative having en electron accepting group or electron donating group and represented by the aforementioned formula (VI). The solvent that may be used is the same as described above in process 2.

Process (6): A step of effecting, in the presence of a Grubbs catalyst, a ring-closing metathesis reaction of the olefin portion derived from the porphyrin derivative represented by the formula (VI), with the olefin portion of the porphyrin residue that is coordinated to the porphyrin derivative, so that the porphyrins are fixed to each other by covalent bonds, thereby obtaining a photo-functional molecule element represented by the following formula (VIII) or (VIII'):

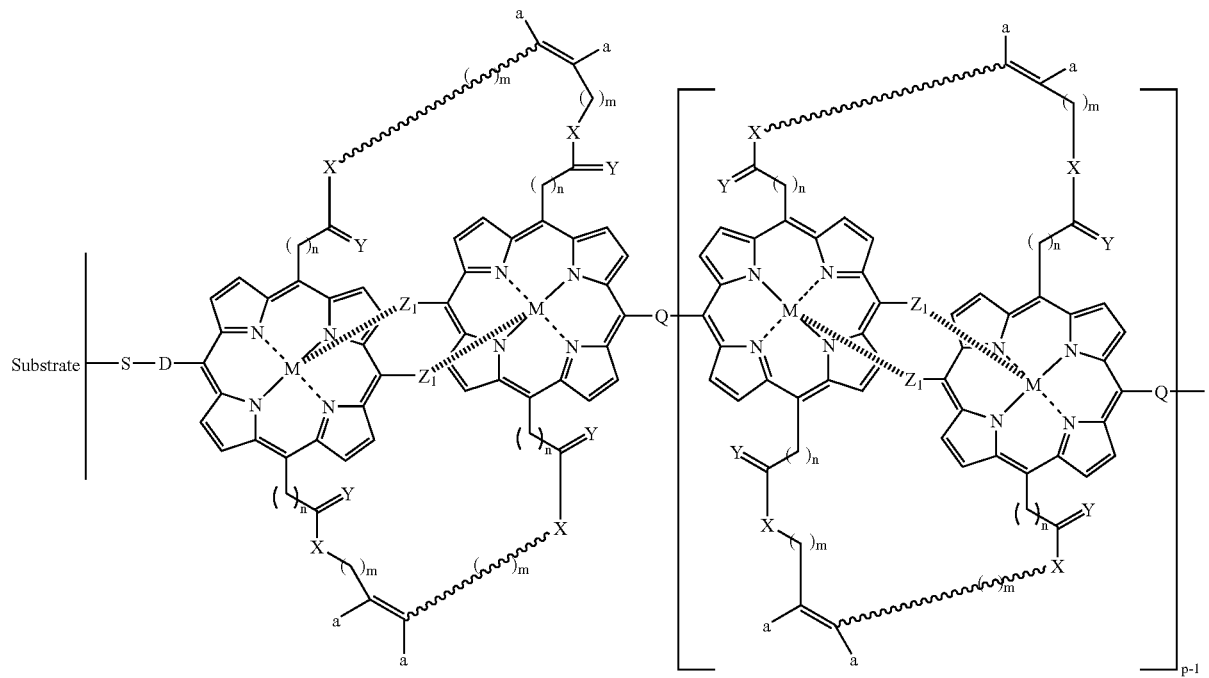

(VIII)

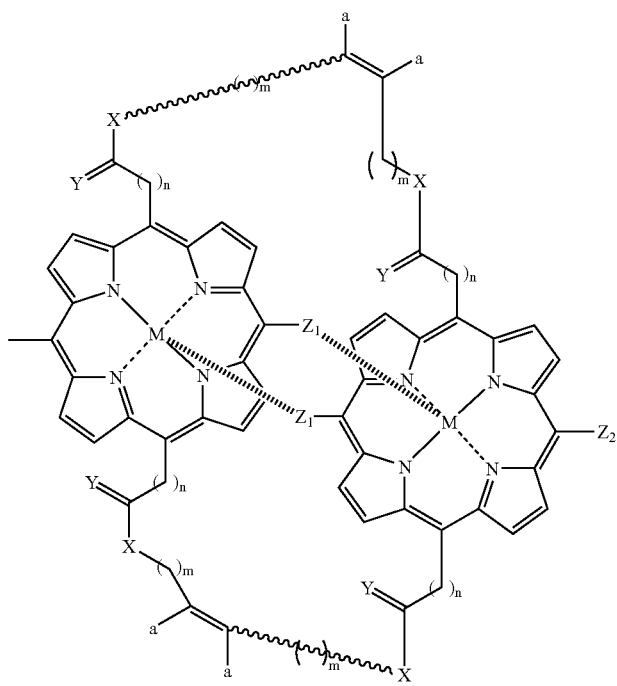

-continued

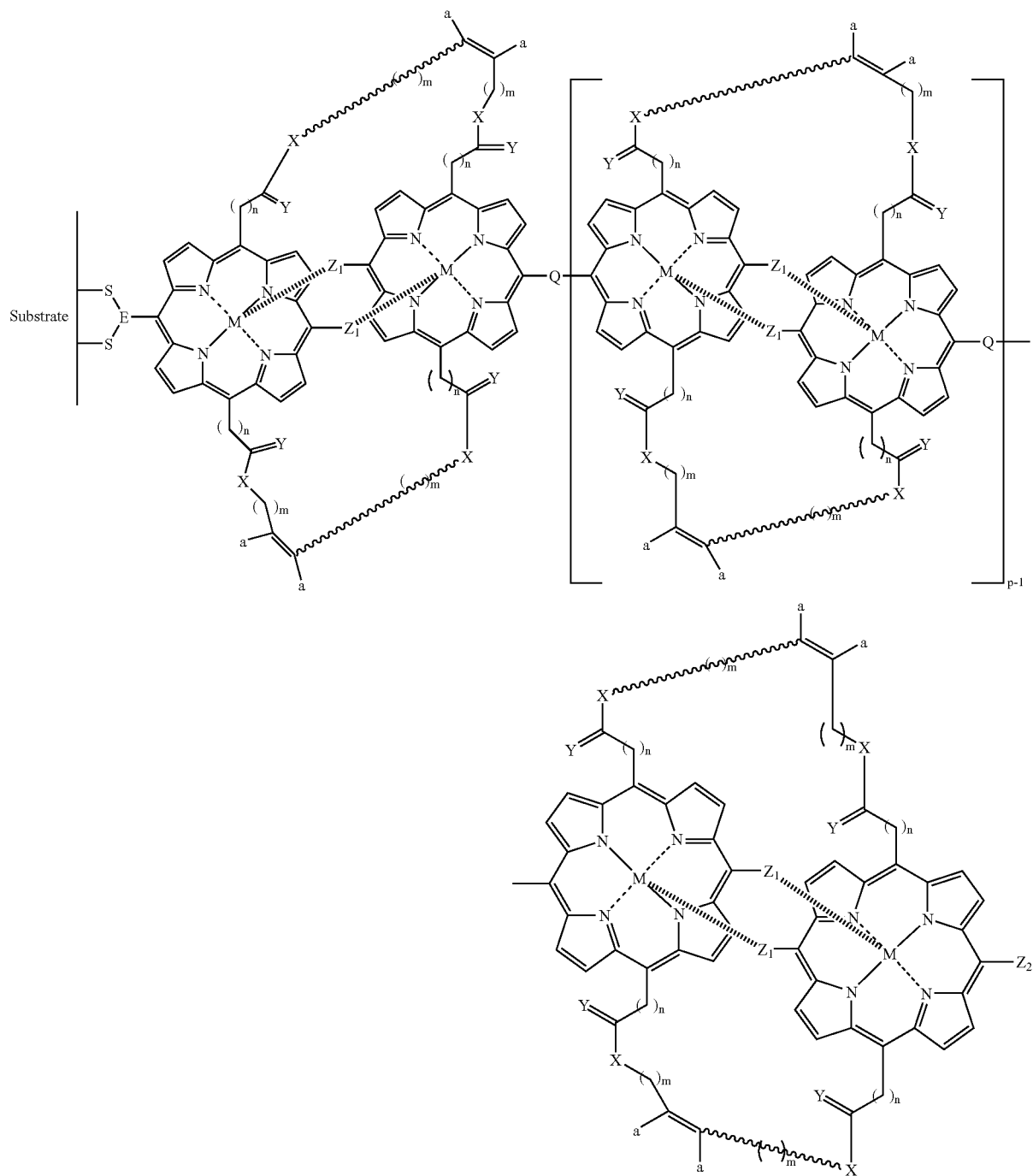

(wherein each of the substituents is as defined above).

The ring-closing metathesis reaction of the process (6) can be carried out in a condition similar to that in the ring-closing metathesis reaction of the process (3).

EXAMPLES

Examples of the present invention will be described hereinafter, however, the present invention is not restricted to these examples.

Example 1

(1-1) Synthesis of Porphyrin Molecule (1-1-1) General Operation

The synthesized compounds were identified by the method described below. Silica gel 60 (Merck) was used as a carrier of the column chromatography used for separation of the products. Silica gel 60F254 (Merck) was used as a carrier of the thin layer chromatography (TLC). For detecting a spot, coloring of iodine, 10% ethanol solution of phosphomolybdic acid and UV luminescence (short 254 nm, long 365 nm) were used in combination. NMR spectrum was measured by dissolving a sample in CDCl$_3$ or DMSO-d$_6$ and using JEOL JNM EX 270 spectrometer (270 MHz) or JEOL ECP 600 spectrometer (600 MHz) as an analyzer, in which measurement tetramethylsilane (TMS) was employed as the internal standard substance. The infrared (IR) absorption spectrum was measured according to the KBr tablet method by using Nicolet AVATAR 320ES. The UV-visible (UV-VIS) spectrum was measured by using Shimazu UV-3100PC, in which measurement a quartz cell having optical path length of 10 mm or 1 mm was used. The fluorescence spectrum was measured by using Hitachi F-4500. The mass spectrometry was carried out according to the matrix assisted laser desorption ionisation time-of-flight mass spectrometry (MALDI-TOF MS). The mass spectrometry was measured by using PerSeptive Biosystems VoyagerDE-STR as an analyzer. The measurements were conducted with a sample coated on a gold plate together with Dithranol (Aldrich Co., Ltd.) as matrix.

(1-1-2) Compound A-5 was Obtained as a Result of a Reaction Shown in the Following Scheme A:

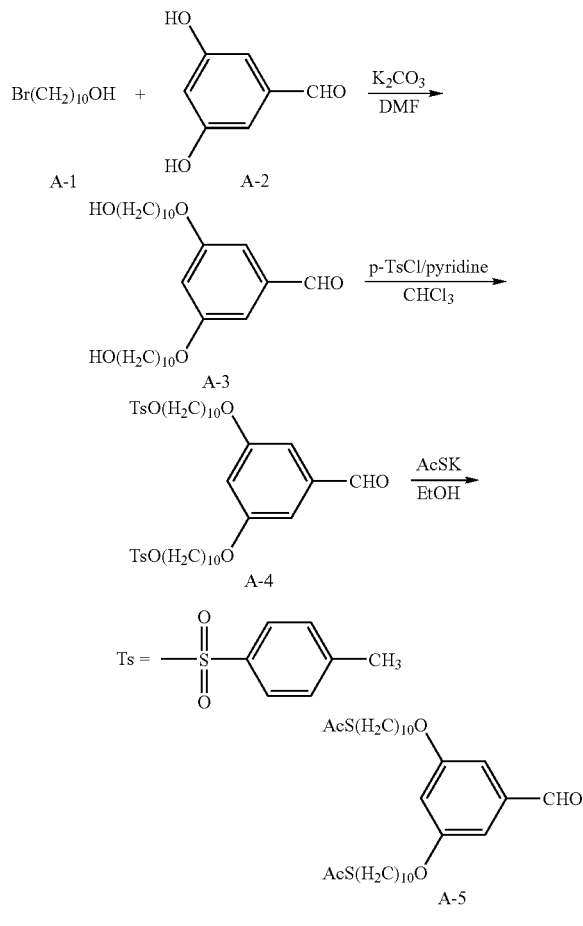

3,5-Bis(10-hydroxydecyloxyl)benzaldehyde A-3

1.18 g of 3,5-dihydroxybenzaldehyde A-2 (8.56 mmol) and 6.15 g of K$_2$CO$_3$ (44.5 mmol, 5.2 eq.) were added to 4.47 g of 10-bromodecane-1-ol A-1 (18.8 mmol, 2.2 eq.) dissolved in 100 mL of DMF, and the mixture was stirred in nitrogen atmosphere at 50° C. for 48 hours. After the temperature was returned to room temperature, the reaction was stopped by adding 50 mL of water and the organic layer was extracted with ether (100 mL×3). The extracted organic layers were combined, washed with saturated brine and dried with anhydrous Na$_2$SO$_4$. The solvent was removed by using an evaporator, whereby brown liquid A-3 was obtained (crude yield: 4.418 g). The product was not purified at this stage and directly used for the next reaction.

TLC R$_f$=0.63 (eluting solvent: CHCl$_3$/MeOH=10/1, detection: UV 254 nm, 10% ethanol solution of phosphomolybdic acid)

$^1$H-NMR (270 MHz, CDCl$_3$) δ 9.88 (s, 1H; H$_a$), 6.98 (d, J=6.0 Hz, 2H; H$_b$), 6.70 (t, J=6.0 Hz, 1H; H$_c$), 3.98 (t, 4H; H$_d$), 3.62 (t, J=16.8 Hz, 4H; H$_e$), 1.85–1.26 (m, H$_f$).

The integrals of He and Hf do not accord, because the material, 10-bromodecane-1-ol, remained.

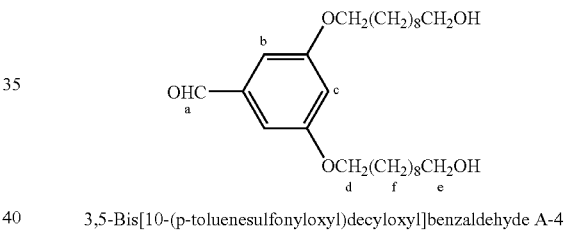

3,5-Bis[10-(p-toluenesulfonyloxyl)decyloxyl]benzaldehyde A-4

2 g of unpurified A-3 (4.44 mmol) was dissolved in 50 mL of chloroform, and 3.38 g of p-TsCl (17.8 mmol, 4 eq.) and 1.40 g of pyridine (17.8 mmol, 4 eq.) were added thereto. The solution was stirred at 0° C. and the reaction was allowed to proceed for 9 hours. The reacted solution was washed with water (50 mL×3) and NaHCO$_3$, and then dried with anhydrous Na$_2$SO$_4$ containing a small amount of Na$_2$CO$_3$. The solvent was removed by using an evaporator, whereby orange color liquid was obtained. This gross product was separated by using a silica gel column (CHCl$_3$/hexane=3/2), whereby pale yellow, oily A-4 was obtained. Yield was 2.20 g (65%).

TLC R$_f$=0.34 (eluting solvent:hexane/EtOAc=3/1, detection:UV 254 nm, 10% ethanol solution of phosphomolybdic acid)

$^1$H-NMR (270 MHz, CDCl$_3$) δ 9.89 (s, 1H; H$_a$), 7.79 (d, J=8.4 Hz, 2H; H$_b$), 7.34 (d, J=8.1 Hz, 2H; H$_c$), 6.98 (d, J=2.2 Hz, 2H; H$_d$), 6.69 (t, J=2.4 Hz, 1H; H$_e$), 4.04–3.96 (m, 8H; H$_f$), 6.69 (s, 6H; H$_g$), 1.81–1.25 (m, 32H; H$_h$)

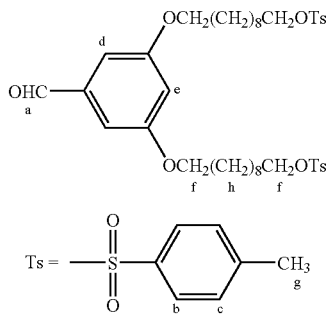

3,5-Bis(10-thioacetyldecyloxyl)benzaldehyde A-5

800 mg of 3,5-Bis[10-(p-toluenesulfonyloxyl) decyloxyl] benzaldehyde A-4 (1.05 mmol) was dissolved in 40 mL of ethanol. 361 mg of potassium thioacetate (3.16 mmol, 3 eq) was added thereto and the mixture was stirred for 2 hours, with reflux. After the temperature of the reacted solution was returned to room temperature, 20 mL of water was added to the solution, and extracted with diethyl ether (50 mL×3). The extracted ether layers were combined, washed with saturated brine and dried with anhydrous $Na_2SO_4$. The solvent was removed by using an evaporator, whereby solid A-5 of beige color was obtained. Yield 447 mg (75%).

TLC $R_f$=0.72 (eluting solvent: hexane/EtOAc=3/1, detection: UV 254 nm, 10% ethanol solution of phosphomolybdic acid)

$^1$H-NMR (270 MHz, $CDCl_3$) δ9.887 (s, 1H; $H_a$), 7.263 (d, 2H; $H_b$), 6.981 (t, 2H; $H_c$), 3.982 (t, J=6.75 Hz, 4H; $H_d$), 2.863 (t, J=7.02 Hz, 4H; $H_e$), 2.321 (s, 6H; $H_f$), 1.812–1.305 (m, 32H; $H_g$)

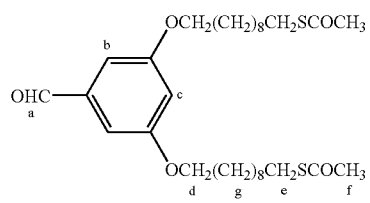

(1-1-3) Compound B-3 was obtained as a result of a reaction shown in the following scheme B:

Scheme B

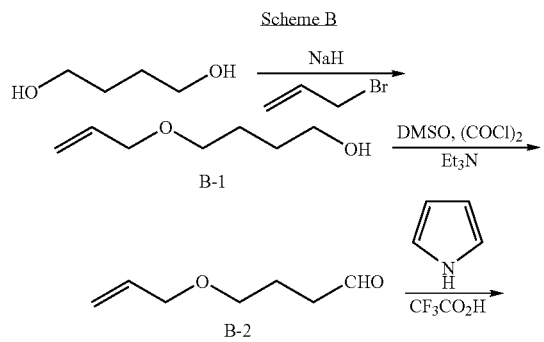

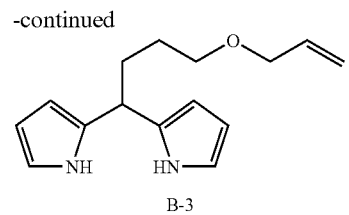

4-Allyloxy-1-butanol B-1

(ref. Kodama, I.; Kawada, M.; Gevorgyan, V.; Yamamoto, Y., J. Org. Chem. 1997, 62, 7439)

1.5 g of sodium hydride (61 mmol) was washed with n-hexane and dispersed to 30 mL of THF. The solution was stirred in an ice bath for 1 hour, while 22 g of butanediol (249 mmol) was added dropwise thereto. 7.6 g of allyl bromide (63 mmol) was also added dropwise to the mixture and the mixture was stirred in an ice bath for 1 hour. Thereafter, the reaction solution was heated for 3 hours with reflux (sodium bromide of beige color was deposited). The reaction was quenched by adding water to the solution and the oily phase was separated. Then, the aqueous phase was extracted with $Et_2O$. The aqueous phase was combined with the previously extracted oily phase and the mixed phases were dried with anhydrous $Na_2SO_4$. The solvent was distilled away under reduced pressure. The product was purified by distillation under reduced pressure (79 to 82° C./0.3 kPa), whereby colorless, transparent liquid was obtained (6.8 g, 82%).

$^1$H-NMR (270 MHz, $CDCl_3$) δ 1.64–1.72 (m, —(C$\underline{H}_2$)$_2$—, 4H), 2.68 (br, —OH, 1H), 3.48 (t, J=6.0 Hz, —OC$\underline{H}_2$—, 2H), 3.64 (t, J=6.0 Hz, —$CH_2OH$, 2H), 3.99 (dd, J=5.9, 1.4 Hz, $CH_2$=CHC$\underline{H}_2$O—, 2H), 5.20 (d, J=10.5 Hz, β-cis-allyl, 1H), 5.37 (dd, J=17.3, 1.6 Hz, β-trans-allyl, 1H), 5.91 (m, α-allyl, 1H)

4-Allyloxy-1-butanal B-2

13 mL of DMSO (246 mmol) was gradually added to a solution prepared by dissolving oxaryl chloride (5.8 mL, 66 mmol) in 123 mL of $CHCl_3$, which solution had been cooled to −80° C., and the mixture was stirred for three minutes. 6.8 g of 4-allyloxy-1-butanol (52 mmol) was then added to the mixture. After the solution was stirred for 15 minutes, 43 mL of triethylamine (594 mmol) was added thereto and the reaction solution was stirred for 10 hours, while the temperature of the reaction solution was allowed to return to room temperature. The reaction was quenched by adding distilled water and the $CHCl_3$ layer was separated. The separated layer was washed with diluted hydrochloric acid, saturated aqueous sodium bicarbonate and saturated brine and dried with anhydrous $Na_2SO_4$. The solvent was distilled away under reduced pressure, whereby pale yellow liquid was obtained (6.0 g, 90%).

$^1$H-NMR (270 MHz, $CDCl_3$) δ 1.93 (m, —$CH_2$C$\underline{H}_2CH_2$—, 2H), 2.54 (m, —C$\underline{H}_2CHO$, 2H), 3.47 (t, J=5.9 Hz, allyl-OC$\underline{H}_2$—, 2H), 3.99 (ddd, J=5.1, 1.4, 1.4 Hz, $CH_2$=CHC$\underline{H}_2O$—, 2H), 5.17 (dd, J=10.5, 1.9 Hz, β-cis-allyl, 1H), 5.25 (dd, J=15.4, 1.6 Hz, β-trans-allyl, 1H), 5.91 (m, α-allyl, 1H), 9.78 (s, —C$\underline{H}O$, 1H). bp.45–48° C./0.3 kPa

Meso-(3-Allyloxypropyl)dipyrromethane B-3

6.0 g of 4-allyl-1-butanal (47 mmol) was dissolved in 60 equivalent amount of pyrrole (200 mL), and nitrogen gas was bubbled therein. 0.362 mL, 0.1 equivalent amount, of TFA (4.7 mmol) was added thereto, and stirred for 14 hours (during which the solution became dark), and $CHCl_3$ was added, then subjected to liquid separation washing using saturated aqueous sodium bicarbonate and saturated brine, and dried with anhydrous $Na_2SO_4$. The solvent was distilled away under reduced pressure, and excess pyrrole was recovered by distillation under reduced pressure. The desired product (9.3 g) of brownish viscous liquid was obtained using silica gel column (hexane/ethyl acetate 5/1 v/v, TLC $R_f$=0.28) (yield 81%).

$^1$H-NMR (270 MHz, $CDCl_3$) δ1.58 (m, —$CH_2C\underline{H}_2CH_2$—, 2H), 2.04 (m, —$CH_2C\underline{H}_2$-dipyrro, 2H), 3.43 (t, J=6.2 Hz, allyl-O$C\underline{H}_2$—, 2H), 3.93 (t, J=1.4 Hz, $CH_2$=$CHCH_2O$—, 2H), 4.02 (t, methine, 1H), 5.16 (d, J=10.5 Hz, β-cis-allyl, 1H), 5.25 (dd, J=17.1, 1.4 Hz, β-trans-allyl, 1H), 5.89 (m, α-allyl, 1H), 6.05 (s, 3,3'-pyrrole ring, 2H), 6.14 (m, 4,4'-pyrrole ring, 2H), 6.62 (s, 5,5'-pyrrole ring, 2H), 7.88 (br, NH, 2H)

(1-1-4) Compound C-3 was obtained by the reaction of the following scheme C:

Scheme C

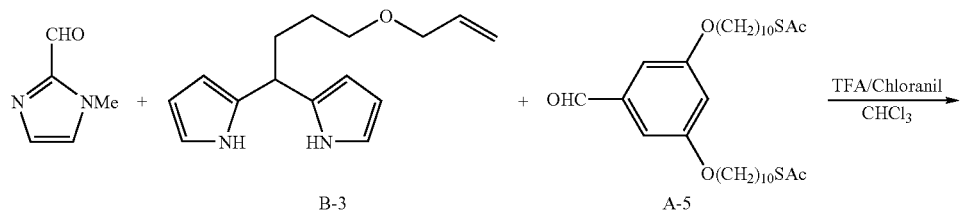

B-3    A-5

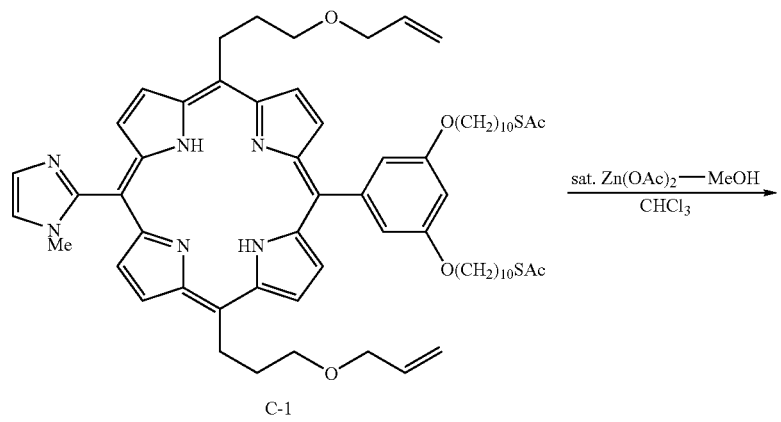

C-1

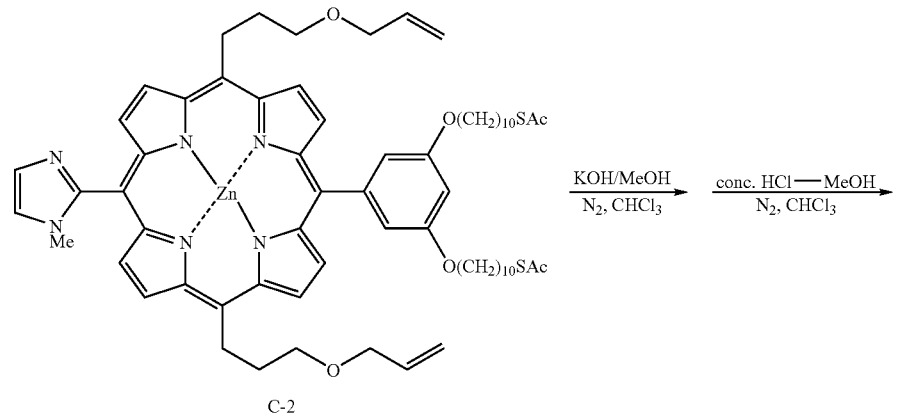

C-2

-continued

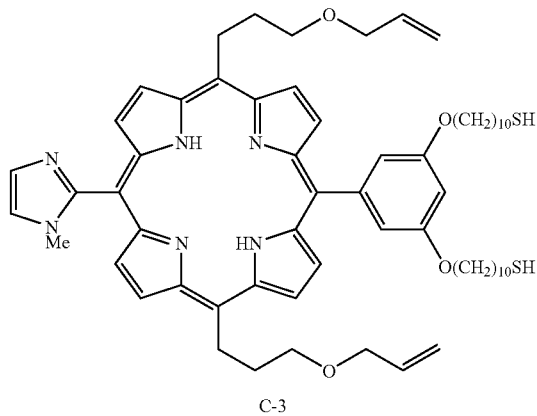

C-3

5,15-Bis(allyloxypropyl)-10-[3,5-bis(10-thioacetyl-decyloxyl)phenyl]-20-(1-methyl-2-imidazol) porphyrin C-1

612 mg of meso-(allyloxypropyl)dipyrromethane B-3 (2.59 mmol, 2 eq.) and 733 mg of 3,5-bis(10-thioacetyldecyloxyl)-benzaldehyde A-5 (1.29 mmol, 1 eq.) were added to a solution of 142 mg of 2-Formyl-1-methylimidazole (1.29 mmol, 1 eq.) dissolved in 250 mL of $CHCl_3$, and nitrogen gas was bubbled thereinto for 10 min. To the solution, 199 μL of trifluoroacetic acid (2.59 mmol, 2 eq.) was added as a acid catalyst, and stirred for 5 hours under nitrogen atmosphere with light shielding. 954 mg of p-chloranil (3.88 mmol, 3 eq.) was further added as an oxidizer, and stirred the mixture overnight to finish the reaction. The reaction solution was passed through silica gel as it is, and the tar component and by-products were removed by column chromatography (eluting solvent $CHCl_3 \rightarrow CHCl_3$/acetone=9/1, v/v). The fraction showing $R_f$=0.40 in TLC (eluting solvent:$CHCl_3$/acetone=9/1, v/v) was separated by silica gel column chromatography (eluting solvent $CHCl_3$/acetone=9/1→$CHCl_3$/acetone=1/1, v/v) again, to separate C-1 (59.6 mg, yield 4.1%)

TLC $R_f$=0.40 (eluting solvent: $CHCl_3$/acetone=9/1, Detection: UV 365 nm, visible)

$^1$H-NMR (600 MHz, $CDCl_3$) δ 9.53 (d, J=4.8 Hz, 2H; Por β), 9.47 (d, J=4.8 Hz, 2H; Por β), 9.00 (d, J=4.8 Hz, 2H; Por β), 8.77 (d, J=4.8 Hz, 2H; Por β), 7.69 (s, 1H; imidazole ring), 7.48 (s, 1H; imidazole ring), 7.39 (s, 1H; phenyl), 7.30 (s, 1H; phenyl), 6.91 (s, 1H; phenyl), 6.08 (ddt, J=6.0, 9.6, 16.2 Hz, 2H; Allyl β), 5.42 (dd, J=1.8, 16.2 Hz, 2H; Allyl γ), 5.23 (dd, J=1.8, 9.6 Hz, 2H; Allyl γ), 5.10 (t, J=7.2 Hz, 4H; $CH_2α$), 4.12 (m, 4H; $phOCH_2$—), 4.08 (m, 4H; Allyl α), 3.66 (t, J=4.8 Hz 4H; —$CH_2$OAllyl), 3.40 (s, 3H; $NCH_3$), 2.83 (m, 4H; —$CH_2$SAc), 2.79 (m, 4H; $CH_2$ β), 2.28 (s, 6H; —$SCOCH_3$), 1.88–1.25 (m, 32H; Alkyl), -2.65 (s, 2H; inner proton).

MALDI-TOF Mass spectrum (Dithranol):m/z Found 1123.96 $(M+H)^+$, Calcd ($C_{66}H_{86}N_6O_6S_2$) 1122.61

UV-Vis spectrum (solvent: $CHCl_3$) $\lambda_{max}$/nm (absorbance): 419.0 (0.1109), 516.0 (0.0075), 554.5 (0.0030) 588.5 (0.0028), 649.0 (0.0020)

Fluorescence spectrum (solvent: $CHCl_3$, $\lambda_{EX}$: 419 nm) $\lambda_{EM}$/nm (fluorescent intensity): 653 (211.0), 719.8 (102.1).

5,15-Bis(allyloxypropyl)-10-[3,5-bis(10-thioacetyl-decyloxyl)phenyl]-20-(1-methyl-2-imidazolyl) porphyrinatozinc C-2

28 mg of C-1 (24.9 μmol) was dissolve into 6 mL of $CHCl_3$ under nitrogen atmosphere, and 1 mL of methanol solution of saturated zinc acetate was added, then stirred for 2 hours. The reaction was stopped after observing, in TLC (eluting solvent: $CHCl_3$/acetone=9/1,v/v), the disappearance of C-1 and instead appearance of C-2 at $R_f$=0.80. 5 mL of $CHCl_3$ was added to the reaction solution, and washed with an aqueous solution of saturated sodium bicarbonate and purified water, then extracted with $CHCl_3$ until the water layer became colorless. The organic layer was combined, and washed with saturated brine, and dried with anhydrous sodium sulfate. The solvent was concentrated with evaporator, and C-2 was separated by silica gel column chromatography (eluting solvent: $CHCl_3$/acetone=9/1,v/v) (26.6 mg, yield 90%).

TLC $R_f$=0.80 (eluting solvent::$CHCl_3$/acetone=9/1, detection::UV 365 nm, visible)

$^1$H-NMR (600 MHz, $CDCl_3$) δ 9.62 (d, J=4.8 Hz, 2H; Por β), 9.51 (d, J=4.8 Hz, 2H; Por β), 8.95 (d, J=4.8 Hz, 2H; Por β), 7.87 (s, 1H; phenyl), 7.31 (s, 1H; phenyl), 6.98 (s, 1H; phenyl), 6.19 (ddt, J=6.0, 10.2, 16.8 Hz, 2H; Allyl β), 5.53 (dd, J=1.2, 16.8 Hz, 2H, Allyl γ), 5.52 (d, J=1.8 Hz, 1H; imidazole ring), 5.41 (d, J=4.8 Hz, 2H; Por β), 5.34 (dd, J=1.2, 10.2 Hz, 2H; Allyl γ), 5.23 (m, 4H; $CH_2α$), 4.37 (t, J=7.2 Hz, 2H; $PhOCH_2$—), 4.08 (ddt, J=1.2, 6.0, 10.2 Hz, 4H; Allyl α), 4.12 (t, J=6.6 Hz, 2H; $PhOCH_2$—), 3.94 (m, 4H; —$CH_2$OAllyl), 3.11 (m, 2H; $CH_2$ β), 3.00 (m, 2H; $CH_2β$), 2.83 (t, J=7.2 Hz, 2H; —$CH_2$SAc), 2.83 (t, J=7.2 Hz, 2H; —$CH_2$Sac), 2.32 (s, 3H; —$SCOCH_3$), 2.27. (s, 3H; —$SCOCH_3$), 2.12 (d, J=1.8 Hz, 1H; imidazole ring), 1.67 (s, 3H; $NCH_3$), 2.06-1.26 (m, 32H; Alkyl).

MALDI-TOF Mass spectrum (Dithranol): m/z Found 1185.89 $(M+H)^+$, Calcd ($C_{66}H_{84}N_6O_6S_2Zn$) 1184.52

UV-Vis spectrum (solvent: $CHCl_3$) $\lambda_{max}$/nm (absorbance): 414.0 (0.0851), 437.0 (0.0991), 566.0 (0.0082), 618.5 (0.0045)

Fluorescent spectrum (solvent: $CHCl_3$, $\lambda_{EX}$: 437 nm) $\lambda_{EM}$/nm (fluorescent intensity): 622.8 (167.5), 678.2 (55.27)

5,15-Bis(allyloxypropyl)-10-[3,5-bis(10-mercaptodecyloxyl)phenyl]-20-(1-methyl-2-imidazolyl) porphyrin C-3

26.6 mg of C-2 (22.4 μmol) was dissolved into 10 mL of a mixed solution of $CHCl_3$/MeOH (=4/1, v/v), and $N_2$ was bubbled for 5 min. 1 mL of KOH solution (KOH 5 g+$H_2O$ 10 mL+MeOH 15 mL) was added thereto and stirred at room temperature for 30 min. After confirming the disappearance of C-2 by MALDI-TOF Mass spectrum, purified water was added to stop the reaction. The mixture was washed with purified water twice, and extracted with $CHCl_3$ until the water layer became colorless.

The organic layer was combined, and conc. HCl/MeOH (=1/10, v/v) was added until the color of the solution changed to fresh green, and stirred at room temperature for 2 hours. The generation of the desired product was confirmed by MALDI-TOF Mass spectrum and TLC ($CHCl_3$/acetone=9/1) with $R_f$=0.40. The reaction solution was washed with an aqueous solution of saturated sodium bicarbonate (50 mL) and purified water (50 mL), and the water layer was extracted with $CHCl_3$, and then dried with anhydrous $Na_2SO_4$. The solvent was removed by evaporator, and C-3 was obtained after suction drying (20.3 mg, yield 87%)

TLC $R_f$=0.40 (eluting solvent::$CHCl_3$/acetone=9/1, detection::UV 365 nm, visible)

$^1$H-NMR (600 MHz, $CDCl_3$) δ 9.45 (d, J=4.2 Hz, 2H; Por β), 9.39 (d, J=4.2 Hz, 2H; Por β), 8.92 (d, J=4.2 Hz, 2H; Por β), 8.70 (d, J=4.2 Hz, 2H; Por β), 7.61 (s, 1H; imidazole ring), 7.39 (s, 1H; imidazole ring), 7.32 (s, 1H; phenyl), 7.22 (s, 1H; phenyl), 6.83 (s, 1H; phenyl), 6.00 (ddt, J=6.0, 9.6, 16.2 Hz 2H; Allyl β), 5.34 (dd, J=1.8, 18.0 Hz, 2H; Allyl γ), 5.18 (dd, J=1.8, 10.2 Hz, 2H; Allyl γ), 5.11 (t, J=7.80 Hz 4H; $CH_2α$), 4.06 (m, 4H; phO$CH_2$—), 4.00 (m, 4H; Allyl α), 3.58 (t, J=6.0 Hz 4H; —$CH_2$OAllyl), 3.31 (s, 3H; $NCH_3$), 2.71 (m, 4H; $CH_2$β), 2.40 (m, 4H; —$CH_2$SH), 1.81–0.77 (m, 32H; Alkyl), −2.77 (s, 2H; inner proton).

MALDI-TOF Mass spectrum (Dithranol):m/z Found 1039.68 (M+H)$^+$, Calcd ($C_{62}H_{82}N_6O_4S_2$) 1038.58

UV-Vis spectrum(solvent: $CHCl_3$) $λ_{max}$/nm (absorbance): 418.5 (0.1128), 515.5 (0.0059), 553.5 (0.0024) 589.5 (0.0022), 648.0 (0.0018)

Fluorescent spectrum (solution: $CHCl_3$, $λ_{EX}$: 419 nm) $λ_{EM}$/nm (fluorescent intensity): 653 (177.3), 718.6 (84.28)

(1-1-5) Compound D-3 was obtained by the reaction of the following scheme D:

Scheme D

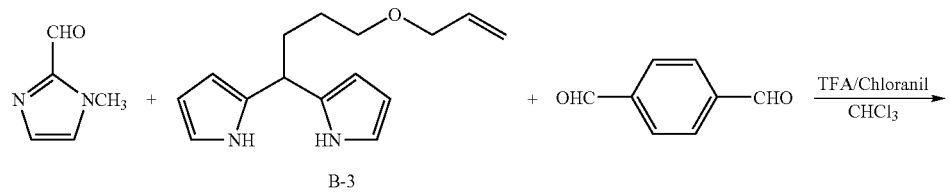

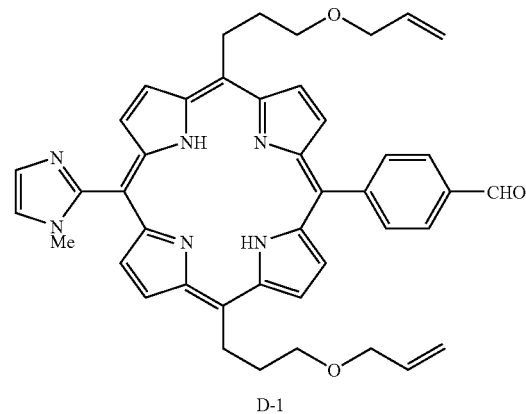

D-1

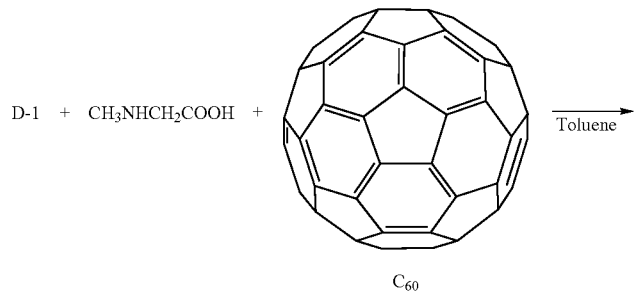

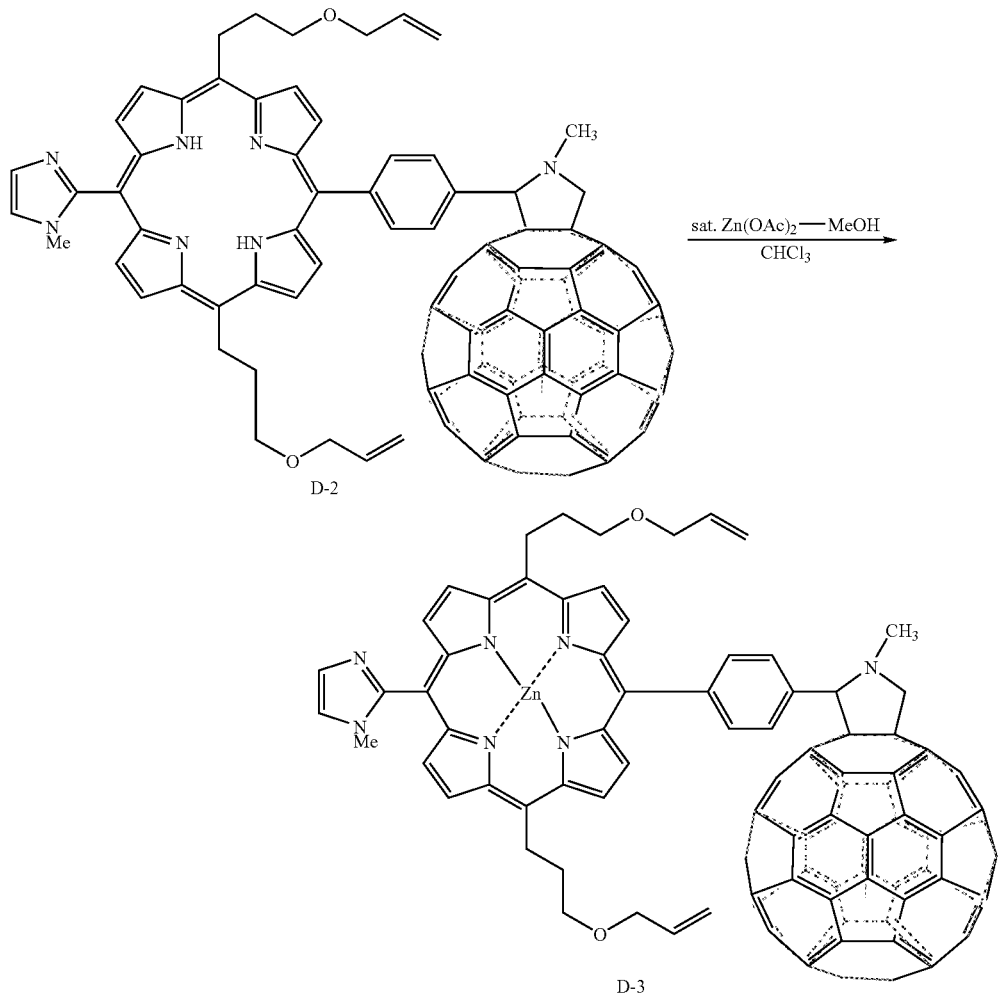

D-2

D-3

5,15-Bis(allyloxypropyl)-10-(4-formylphenyl)-20-(1-methyl-2-imidazolyl) porphyrin D-1

1.00 g of 5-(allyloxypropyl)dipyrromethane B-3 (4.09 mmol, 2 eq.) and 274 mg of terephthalaldehyde (2.05 mmol, 1 eq.) were added to 225 mg of 2-Formyl-1-methylimidazole (2.05 mmol, 1 eq.) dissolved in 400 mL of $CHCl_3$, and nitrogen gas was bubbled for 10 min. To the solution, 315 µL of trifluoroacetic acid (4.09 mmol, 2 eq.) was added as an acid catalyst, and stirred for 30 min under nitrogen atmosphere with light shielding. 1.51 g of chloranil (6.14 mmol, 3 eq.) was further added as an oxidizer, and stirred the mixture overnight to finish the reaction. The tar in the reaction solution was removed by suction filtration, and the residue was washed with $CHCl_3$. The filtrate was washed with 200 mL of an aqueous solution of saturated sodium bicarbonate, and 200 mL of purified water. The water layer was extracted with $CHCl_3$, and dried with anhydrous $Na_2SO_4$. The tar component and by-products were removed with silica gel column chromatography (eluting solvent: $CHCl_3 \rightarrow CHCl_3/MeOH=9/1$, v/v). The fraction showing $R_f=0.48$ in TLC (eluting solvent::$CHCl_3$/acetone=1/1,v/v) was separated again by silica gel column chromatograph (eluting solvent: $CHCl_3$/acetone=1/1, v/v) again, to obtain D-1 (65.3 mg, yield 4.6%).

TLC $R_f=0.48$ (eluting solvent: $CHCl_3$/acetone=1/1, detection::UV 365 nm, visible)

$^1$H-NMR (600 MHz, $CDCl_3$) δ 10.41 (s, 1H; —CHO), 9.55 (d, J=4.2 Hz, 2H; Por β), 9.51 (d, J=4.2 Hz, 2H; Por β), 8.81 (d, J=5.4 Hz, 2H; Por β), 8.80 (d, J=5.4 Hz, 2H; Por β), 8.42 (d, J=7.2 Hz, 1H; phenyl), 8.31 (t, 2H; phenyl), 8.28 (d, J=7.2 Hz, 1H; phenyl), 7.69 (s, 1H; imidazole ring), 7.49 (s, 1H; imidazole ring), 6.08 (ddt, J=6.0, 9.6, 16.2 Hz 2H; Allyl β), 5.43 (dd, J=1.2, 17.4 Hz 2H; Allyl γ), 5.26 (dd, J=1.2, 10.2 Hz 2H; Allyl γ), 5.01 (t, J=7.20 Hz 4H; $CH_2$α), 4.08 (m, 4H; Allyl α), 3.66 (t, J=5.4 Hz 4H; —C$\underline{H}_2$OAllyl), 3.31 (s, 3H; $NCH_3$), 2.28 (m, 4H; $CH_2$β), −2.69 (s, 2H; inner proton).

MALDI-TOF Mass spectrum (Dithranol): m/z Found 691.34 (M+H)$^+$, Calcd ($C_{43}H_{42}N_6O_3$) 690.33

UV-Vis spectrum (solvent: $CHCl_3$) $\lambda_{max}$/nm (absorbance): 418.0 (0.8446), 515.5 (0.0455), 551.0 (0.0222), 591.0 (0.0147), 648.0 (0.0120)

Fluorescent spectrum ($CHCl_3 \lambda_{EX}$: 418 nm) $\lambda_{EM}$/nm (fluorescent intensity): 653.0 (158.9), 711.8 (64.28).

5,15-Bis(allyloxypropyl)-10-[4-phenyl-2-(N-methyl)fulleropyrrolidinyl]-20-(1-methyl-2-imidazolyl) porphyrin D-2

37.5 mg of D-1 (54.2 mmol) was dissolved into 60 mL of toluene, and 78.1 mg of fullerene (109 μmol, 2 eq.) and 96.7 mg of N-methylglycine (sarcosine) (1.09 mmol, 20 eq.) were added thereto. The mixture was stirred under nitrogen atmosphere, and heated at 100° C. for 12 hours with light shielding. After confirming the disappearance of D-1 and generation of D-2 by MALDI-TOF Mass spectrum, the reaction was stopped. The reaction solution was passed through silica gel column as it is, fullerene was eluted with only toluene, at first, to recover it. Subsequently, the eluting solvent was changed to $CHCl_3$/acetone (=9/1,v/v), and the red band corresponding to $R_f$=0.35 in TLC (eluting solvent:: $CHCl_3$/acetone=9/1,v/v) was separated to isolate D-2 (32 mg, yield 41%)

TLC $R_f$=0.35 (eluting solvent::$CHCl_3$/acetone=9/1, detection::UV 365 nm, visible)

MALDI-TOF Mass spectrum (Dithranol): m/z Found 1439.96 $(M+H)^+$, Calcd $(C_{105}H_{47}N_7O_2)$ 1437.38

UV-Vis spectrum(solvent: $CHCl_3$) $\lambda_{max}$/nm (absorbance): 419.0 (1.0652), 516.0 (0.0582), 551.0 (0.0277), 591.5 (0.0184), 648.5 (0.0140)

Fluorescent spectrum ($CHCl_3, \lambda_{EX}$: 419 nm) $\lambda_{EM}$/nm (fluorescent intensity): 655.0 (1.521), 711.8 (1.507)

5,15-Bis(allyloxypropyl)-10-[4-phenyl-2-(N-methyl)fulleropyrrolidinyl]-20-(1-methyl-2-imidazolyl) porphyrinatozinc D-3

7.7 mg of D-2 (5.35 μmol) was dissolved into 15 mL of $CHCl_3$ under nitrogen atmosphere, and 1 mL of a methanol solution of saturated zinc acetate was added, then stirred at room temperature for 2 hours. The reaction was completed after confirming, in TLC (eluting solvent: $CHCl_3$/acetone=9/1,v/v), disappearance of D-2 and generation of D-3 at $R_f$=0.85. 5 mL of chloroform was added to the reaction solution, washed with an aqueous solution of saturated sodium bicarbonate and purified water, and extracted with chloroform until the water layer became colorless. The organic layer was combined, and washed with saturated brine, and then dried with anhydrous $Na_2SO_4$. The solvent was concentrated with evaporator, and D-3 was isolated by separation with silica gel column chromatography (eluting solvent: $CHCl_3$/acetone=9/1,v/v) (7.2 mg, yield 90%)

TLC $R_f$=0.85 (eluting solvent: $CHCl_3$/acetone=9/1, detection::UV 365 nm, visible)

MALDI-TOF Mass spectrum (Dithranol): m/z Found 1502.77 $(M+H)^+$, Calcd $(C_{105}H_{45}N_7O_2Zn)$=1499.29

UV-Vis spectrum (solvent: $CHCl_3$) $\lambda_{max}$/nm (absorbance): 414.0 (0.0824), 438.5 (0.1113), 565.5 (0.0099), 619.5 (0.0063)

Fluorescent spectrum ($CHCl_3, \lambda_{EX}$: 438 nm) $\lambda_{EM}$/nm (fluorescent intensity): 620.6 (0.581), 675.0 (0.300)

(1-1-6) Compound E-6 was Obtained by the Reaction of the Following Scheme E:

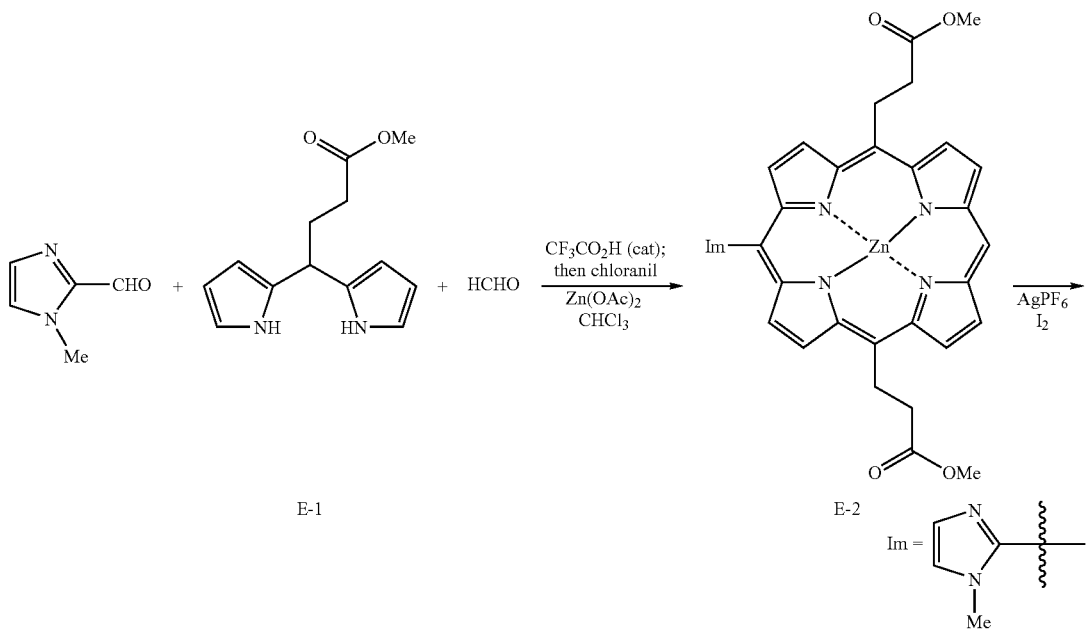

Scheme E

-continued
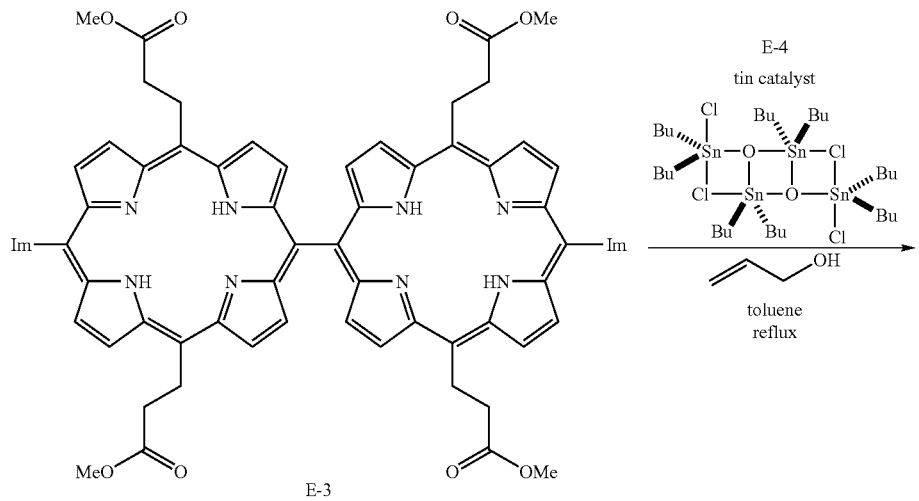
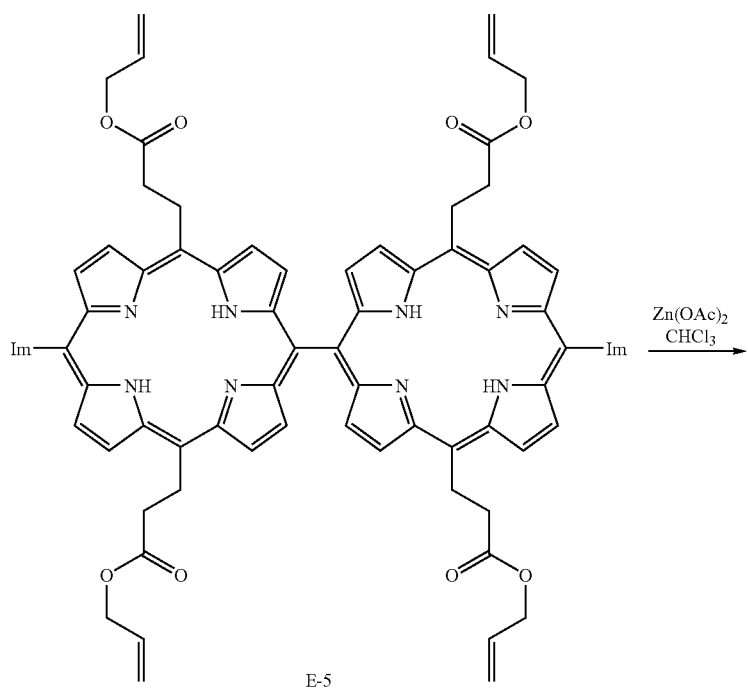

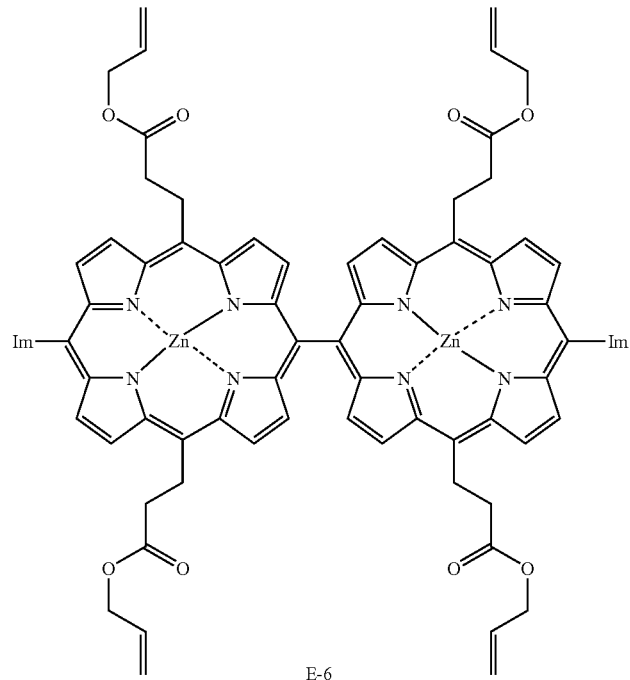

E-6 meso-(methoxycarbonylethyl)dipyrromethane E-1

E-1 was synthesized by stirring methoxycarbonylpropanal (11.6 g, 0.1 mol) and pyrrole (280 mL, 4 mol) in the presence of trifluoroacetic acid (1.4 mL, 10 mmol). Purification with silica gel column chromatography (hexane/EtOAc 5/1) was performed to obtain 17 g of meso-(methoxycarbonylethyl)dipyrromethane E-1 (73%).

$^1$H NMR (600 MHz, CDCl$_3$) δ 2.22–2.26 (m, 2H), 2.29–2.33 (m, 2H), 3.63 (s, 3H), 3.99 (t, J=7.2 Hz, 1H), 6.05–6.07 (m, 2H, pyH4), 6.12–6.14 (m, 2H, pyH5), 6.58–6.62 (m, 2H, pyH2), 7.78 (br, 2H, NH); $^{13}$C NMR (150 MHz, CDCl$_3$) δ 29.5, 31.9, 36.9, 51.6, 105.8, 108.1, 117.3, 132.4, 174.0

5-(1-methylimidazol-2-yl)-10,20-bis(2-methoxycarbonylethyl) porphyrin E-2

500 mL of CHCl$_3$ into which 2.6 g of anhydrous MgSO$_4$ (22 mmol) and 0.8 g of paraformaldehyde (20 mmol) were dispersed, was bubbled with nitrogen, and then 0.75 mL of TFA (9.8 mmol) was added. The mixture was exposed to ultrasound for 40 seconds, 0.55 g of imidazolylaldehyde (5.0 mmol) and 2.35 g of dipyromethane E-1 (10 mmol) were added, and the mixture was stirred for 50 minutes. Then, 3.5 g of chloranil (14 mmol) was added and stirred for 20 min. Subsequently, the mixture was subjected to separation washing with an aqueous solution of saturated sodium bicarbonate, TFA was removed, and the solvent was removed under reduced pressure. The fraction containing the desired porphyrin was separated by silica gel column chromatography (CHCl$_3$—CHCl$_3$/acetone 9/1 v/v). Zinc was introduced into porphyrin using methanol solution of saturated zinc acetate, and separated with silica gel column (CHCl$_3$). The thus obtained fraction was washed with diethyl ether, and the precipitated fine crystal of E-2 was obtained (96 mg, yield 3.1%).

$^1$H NMR (270 MHz, CDCl$_3$) δ 1.59 (s, N—CH$_3$, 3H), 1.85 (s, 5-imidazolyl, 1H), 3.87–3.91 (m, —CH$_2$COOMe, 4H), 3.91 (s, —COOCH$_3$, 6H), 5.42 (s, 3,7-β-pyrrole, 2H), 5.44 (s, 4-imidazolyl, 1H), 5.52 (t, J=8.6 Hz, —CH$_2$CH$_2$COOMe, 4H), 8.95 (d, J=4.6 Hz, 2, 8-β-pyrrole, 2H), 9.54, 9.74 (d, 4.32 Hz, 12,13,17,18-β-pyrrole, 4H), 10.29 (s, meso-proton, 1H).

MALDI-TOF Mass spectrum (Dithranol): m/z Found 625.35 (M+H)$^+$, Calcd 624.15 (M$^+$)

UV-Vis spectrum(solvent: CHCl$_3$) λ$_{max}$/nm (absorbance): 408, 430, 559, 608

15,15'-Bis{5-(1-methylimidazol-2-yl)-10,20-bis(2-methoxycarbonyl-ethyl)}-porphyrin E-3 (meso-meso bisporphyrin)

174 mg of porphyrinato zinc E-2 (0.27 mmol), as a precursor, and 39 mg of I$_2$ (0.15 mmol) were dissolved into 90 mL of CHCl$_3$, and the atmosphere was changed to nitrogen by 5-minute nitrogen bubbling. An acetonitrile solution containing 47 mg of AgPF$_6$ (0.18 mmol) was added drop wise to this solution, and stirred for 18 minutes at room temperature. The reaction was quenched by washing the mixture with an aqueous solution of sodium thiosulfate, aqueous solution of saturated sodium bicarbonate and saturated brine, and dried with anhydrous Na$_2$SO$_4$, after the mixture was processed with dilute hydrochloric acid/methanol solution to remove zinc. After washing with n-hexane using silica gel column (CHCl$_3$/acetone 9/1 v/v) thrice, the desired porphyrin E-3 in which porphyrins are directly bonded at meso position was obtained (74 mmol, yield 49%)

$^1$H NMR (270 MHz, CDCl$_3$) δ −2.17 (s, NH, 4H), 3.53 (s, N—CH3+—CH2COOMe, 6H+8H), 3.70 (d, J=3.24 Hz, —COOCH3, 6H), 5.33 (m, —CH2CH2COOMe, 8H), 7.56 (d, J=1.4 Hz, 5-imidazolyl, 2H), 7.76 (d, J=1.4 Hz, 4-imidazolyl, 2H), 7.99, 8.14 (d, J=4.7 Hz, 13,13',17,17'-β-pyrrole, 4H), 8.94 (d, J=4.1 Hz, 4,4',7,7'-β-pyrrole, 4H), 9.14 (dd, J=10.8, 5.1 Hz, 12,12',18,18'-β-pyrrole, 4H), 9.59 (dd, J=2.3, 3.0 Hz, 3,3',9,9'-β-pyrrole, 4H).

MALDI-TOF Mass spectrum (Dithranol):m/z Found 1123.82 (M+H)$^+$, Calcd 1122.45 (M$^+$).

UV-Vis spectrum(solvent: CHCl$_3$) λ$_{max}$/nm (absorbance): 413, 453, 526, 596, 655

15,15'-Bis{5-(1-methylimidazol-2-yl)-10,20-bis(2-allyloxycarbonyl-ethyl)}-porphyrin E-5

21 mg of porphyrin methyl ester E-3 (0.019 mmol) was dissolved into toluene/allyl alcohol 10/1 v/v, and 104 mg, 10 equivalent amount, of tin-catalyst E-4 (0.19 mmol) (prepared by the method of Otera et al., i.e., Junzo Otera, Nobuhisa Dan-oh, Hitosi Nozaki, J. Org. Chem. 1991, 56, 5307-5311) was added and stirred for 6 hours while heating (bath temperature: 80–90° C.). After confirming the completion of the transesterification by MALDI-TOF MS, the reaction solution was concentrated with evaporator, purified with silica gel column (CHCl$_3$/acetone 5/1 v/v→1/1 v/v, CHCl$_3$/acetone 1/1 v/v—CHCl$_3$/acetone 1/1 v/v+MeOH), thereby to obtain E-5 (12 mg, yield 51%).

$^1$H NMR (270 MHz, CDCl$_3$) δ −2.16 (s, NH, 4H), 3.53 (s, N—CH$_3$+—CH$_2$COOMe, 6H+8H), 3.50 (m, —CH$_2$COO—6H), 3.53 (s, N—CH$_3$, 6H), 4.62 (m, —COOCH$_2$—, 8H), 5.15 (d, J=10.26 Hz, β-allyl, 4H), 5.23 (d, J=2.7 Hz, β-allyl, 4H), 5.29 (m, —CH$_2$CH$_2$COO—, 8H), 5.84 (m, α-allyl, 4H), 7.25 (s, 5-imidazolyl, 2H), 7.57 (d, J=1.1 Hz, 4-imidazolyl, 2H), 7.99, 8.15 (d, J=4.7 Hz, 13,13',17,17'-β-pyrrole, 4H), 8.95 (d, J=4.3 Hz, 4,4',7,7'-β-pyrrole, 4H), 9.18 (dd, J=13.5, 4.9 Hz, 12,12',18,18'-β-pyrrole, 4H), 9.59 (dd, J=2.3, 3.0 Hz, 3,3',9,9'-β-pyrrole, 4H).

MALDI-TOF Mass spectrum (Dithranol): m/z Found 1227.58 (M+H)$^+$, Calcd 1226.51 (M$^+$).

15,15'-Bis{5-(1-methylimidazol-2-yl)-10,20-bis(2-allyloxycarbonyl-ethyl)}-porphyrinatezinc E-6

The free base porphyrin E-5 (12 mg) was dissolved into chloroform (20 mL), and stirred for 2 hours at room temperature after adding methanol solution of saturated zinc acetate (2 mL). After the reaction liquid was subjected to separation washing with aqueous ethylenediaminetetraacetic acid and saturated brine, the liquid was dried with anhydrous sodium sulfate, thereby zinc complex E-6 (12 mg) was obtained after removing the solvent.

MALDI-TOF Mass spectrum (Dithranol):m/z Found 1351.35 (M+H)$^+$, Calcd 1350.34 (M$^+$).

UV-Vis spectrum(solvent: CH$_2$Cl$_2$) λmax/nm (absorbance): 407, 490, 582, 633.

Fluorescent spectrum (CH$_2$Cl$_2$λ$_{EX}$:490 nm) λ$_{EM}$/nm (fluorescent intensity): 670

(1-2) Preparation of Porphyrin-organized Substrate (1-2-1) Preparation of Gold Substrate Slide glass (76×26×1.2 mm, produced by Iwaki) was soaked into a mixed solution of 30% H$_2$O$_2$/conc.HCl (10/1, v/v) for 1.5 to 2 hours. Then, the glass was washed with purified water, and dried with heat gun. The substrate was put into a vapor deposition apparatus, and vapor deposition was performed, firstly, by Cr with 50 Å (vapor deposition rate: ca. 0.3 nm/sec), and then by Au with 200 Å (vapor deposition rate: ca. 0.1 nm/sec). After the vapor deposition, the glass was left to stand to lower the temperature to 180° C. (approximately 1 hour), and the substrate was recovered. Small-size vacuum deposition apparatus VPC-260 (manufactured by ULVAC TECHNO) was used as the vapor deposition apparatus. The thus obtained substrate is named as F-1.

(1-2-2) Preparation of Self-Organized Zinc Porphyrin Monomolecular Film (Zn-SAM F-3)

Compound F-3 was obtained by the reaction of the following scheme Fa:

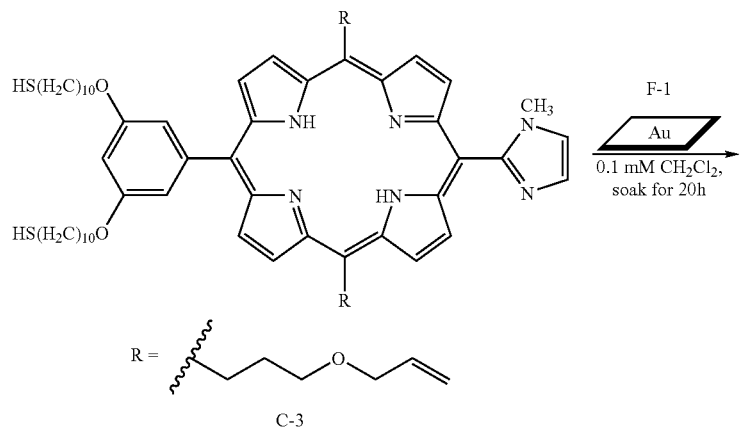

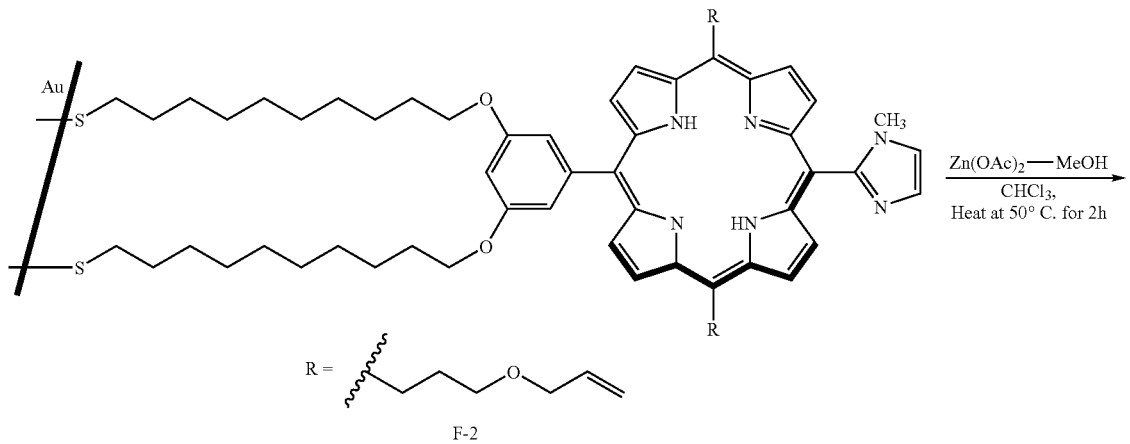

F-2

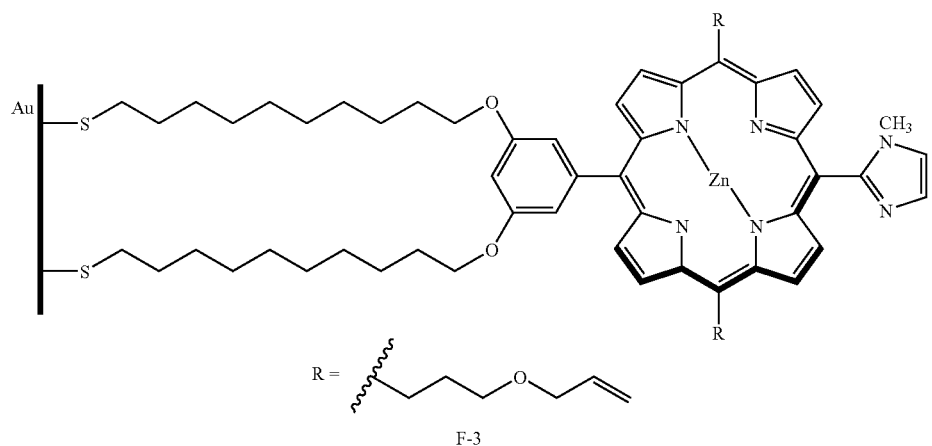

F-3

The gold substrate F-1 was divided into pieces of 10 mm×26 mm, and the surface thereof was wiped with methanol, and then dried under nitrogen flow. 0.1 mM $CH_2Cl_2$ solution of C-3 was separately prepared, and argon gas was bubbled to remove air. Then the divided gold substrate was soaked into the solution overnight at room temperature. After the soaking, the surface of the substrate was washed with $CH_2Cl_2$. Moreover, the surface was dried with nitrogen flow, to obtain a substrate E-2 having self-organized monomolecular film. That is, the gold surface of the substrate is modified with free base porphyrin. The area occupied by porphyrin molecule on the substrate was measured by reductive elimination method of Au—S bond to reveal that the surface covering ratio was approximately $7 \times 10^{13}$ molecule/$cm^2$ ($10^{-10}$ mol/$cm^2$). That is, the area on the substrate occupied by 1 mol of the molecule was approximately 3 $nm^2$/molecule. It was confirmed that the porphyrin molecules were densely arranged all over the gold substrate.

Next, introduction of zinc to the porphyrin was effected on the substrate. Three to four drops of methanol solution of saturated zinc acetate were added to 4 mL of $CHCl_3$. After nitrogen was bubbled to remove air, Fb-SAM substrate F-2 was soaked into the solution, and heated at 50° C. for 2 hours while lightly stirring the solution with 30-minute intervals. The surface of the substrate was washed with $CHCl_3$, MeOH and $CH_2Cl_2$ in this order, and dried with nitrogen flow to obtain substrate Zn-SAM F-3 having porphyrin into which zinc is introduced.

(1-2-3) Preparation of C60-ZnSAM/Au F-4

Compound F-4 was obtained by the reaction of the following scheme Fb:

Scheme Fb

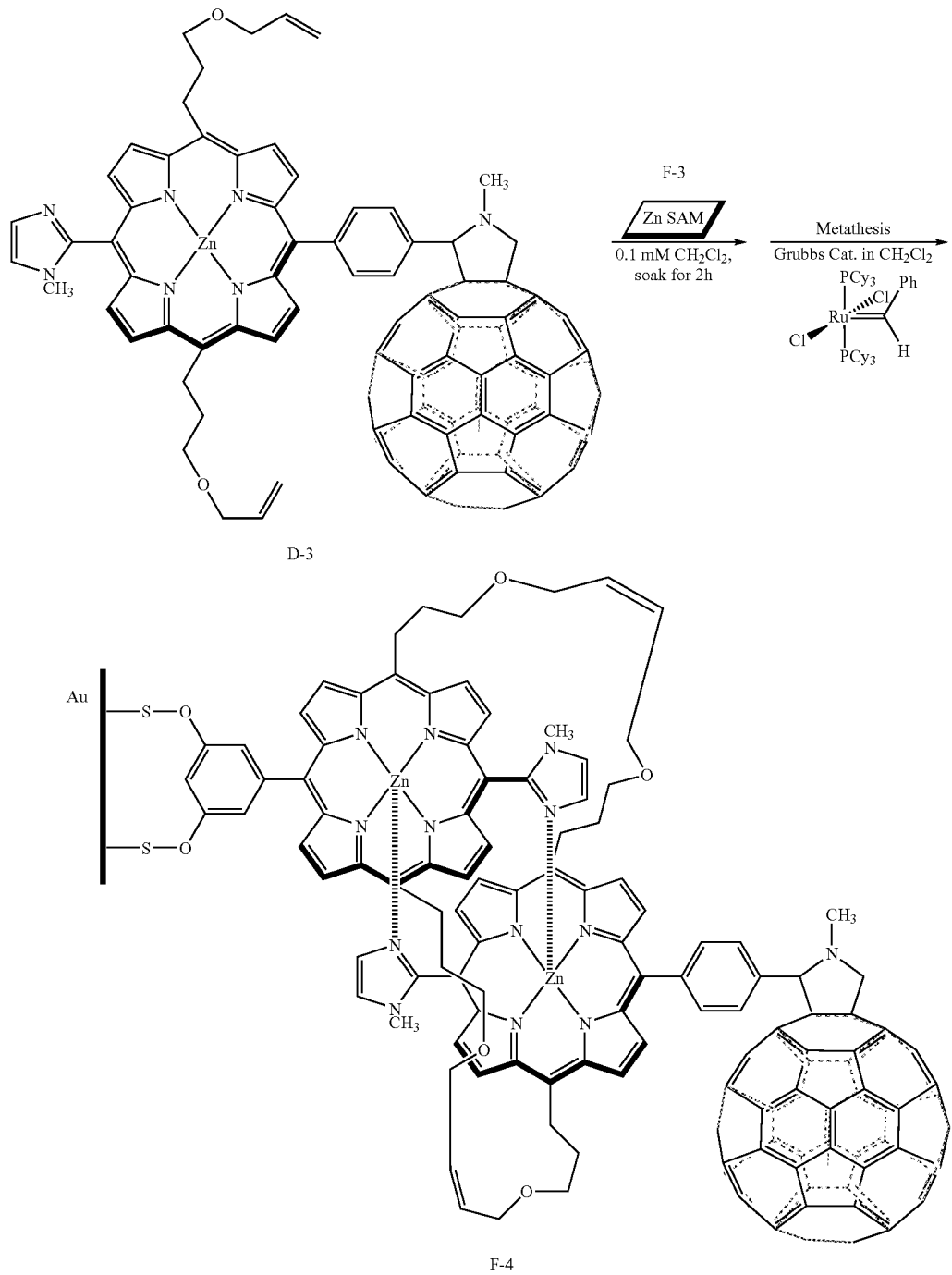

The substrate having porphyrinatozinc monomolecular film, Zn-SAM F-3, was soaked in 0.1 mM $CH_2Cl_2$ (containing 20 mM pyridene) solution of fullerene-substituted imidazolylporphyrin D-3 at room temperature for 2 hours. Then, the substrate was washed with $CH_2Cl_2$, and dried under nitrogen flow. Further, this substrate was soaked in a solution (Grubbs cat. 0.7 mg, 0.85 μmol in $CH_2Cl_2$ 4 mL) of Grubbs catalyst, benzylidene-bis(tricyclohexylphosphine)-dichlororuthenium (purchased from Fluka 09587), for 10 min under nitrogen atmosphere to effect metathesis reaction. After that, the substrate was washed with $CH_2Cl_2$, MeOH and $CH_2Cl_2$ in this order, thereby to obtain the substrate (C60-ZnSAM/Au) F-4, having electron acceptor attached on SAM surface.

(1-2-4) Preparation of Antenna-ZnSAM/Au F-5

Compound F-5 was obtained by the reaction of the following scheme Fc:

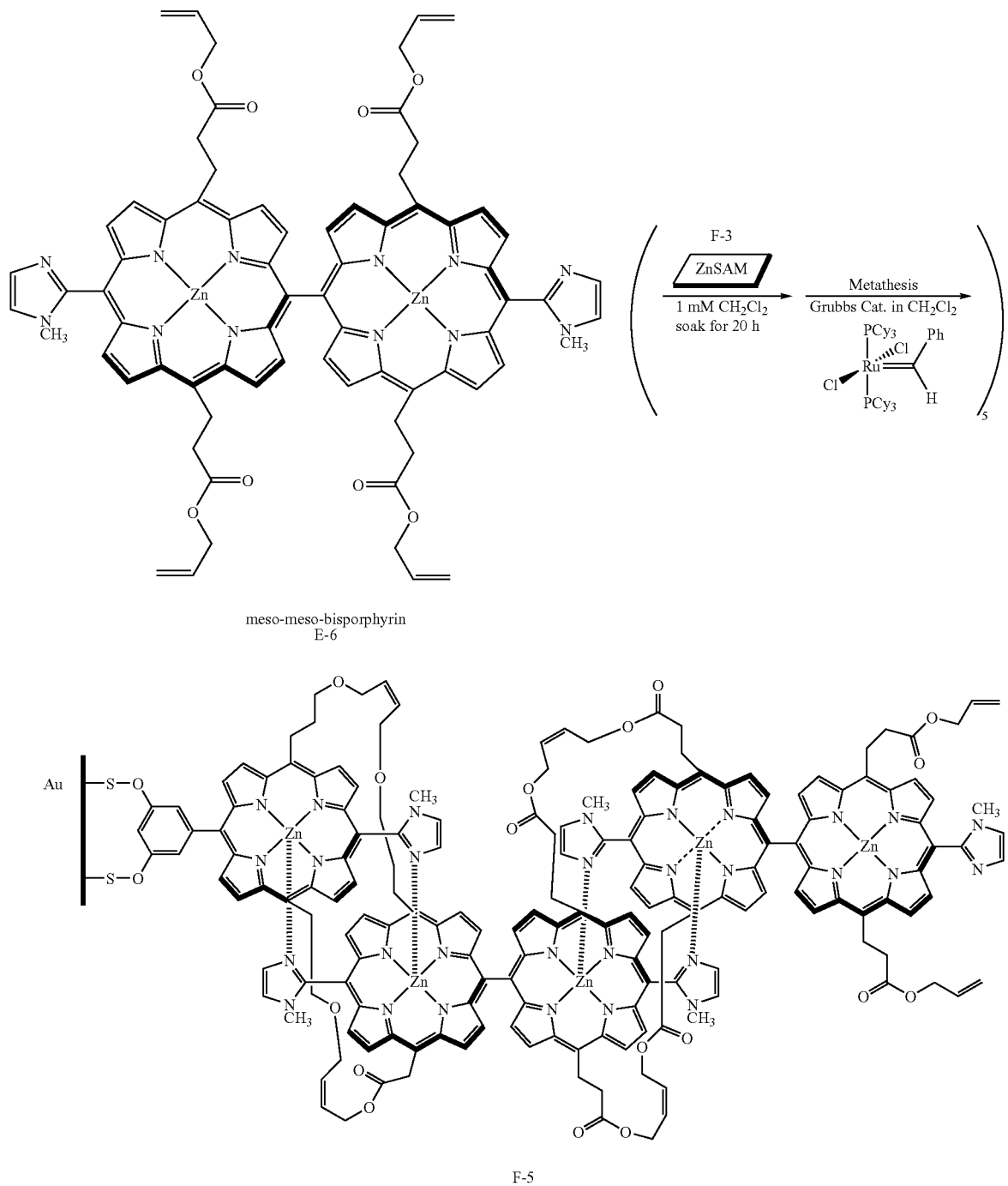

Scheme Fc meso-meso-bisporphyrin
E-6

F-5

The substrate F-3 was soaked (i) in 1 mM CH$_2$Cl$_2$ (containing 20 mM of pyridine) solution of meso-meso linked bisporphyrin E-6 for 1 hour, and the surface of the substrate was washed with CH$_2$Cl$_2$ in order to remove pyridine, thereby to organize oligomer of E-6 on the substrate. This substrate was soaked in a solution of Grubbs catalyst (Grubbs cat. 0.7 mg, 0.85 µmol in CH$_2$Cl$_2$ 4 mL) for 10 min under nitrogen atmosphere to effect metathesis reaction (ii). The substrate was washed (iii) with excess CH$_2$Cl$_2$, MeOH and CH$_2$Cl$_2$ in this order to remove excess catalyst and porphyrin that is not bonded by covalent bonds, and dried under nitrogen flow. The procedure, as one cycle, of (i) soaking, (ii) metathesis reaction, and (iii) washing were repeated for five times until the absorbance became approximately 0.15, to fix porphyrin polymer regularly. The thus obtained substrate is named as Antenna-ZnSAM/Au F-5.

FIG. 1 shows absorption spectra of Zn-SAM F3 and the products of respective cycles.

(1-2-5) Preparation of C60-Antenna-ZnSAM/Au F-6
Compound F-6 was obtained by the reaction of the following scheme Fd:
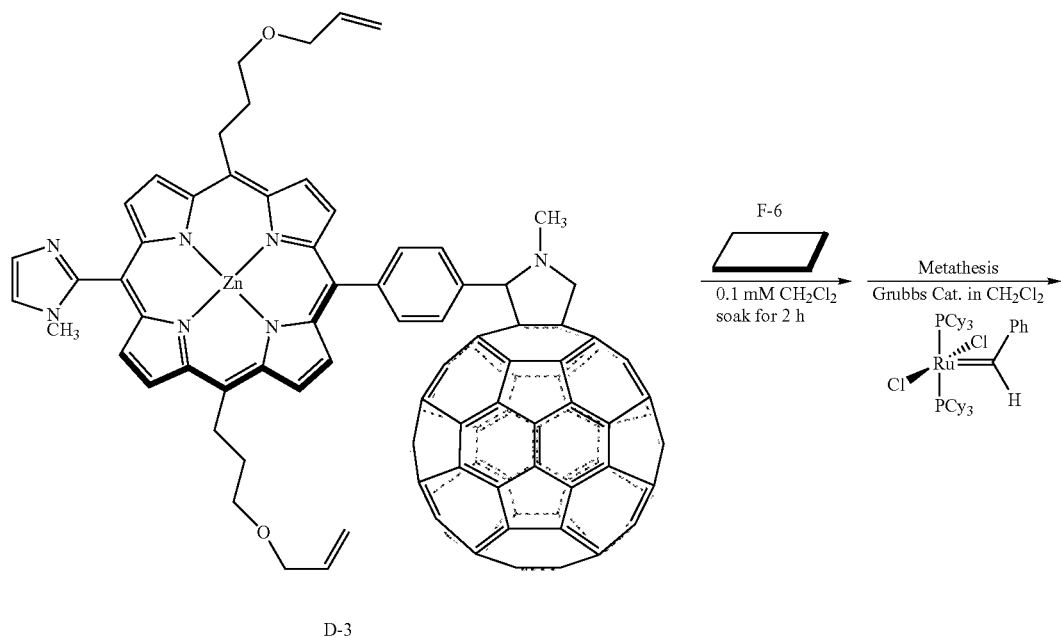
D-3
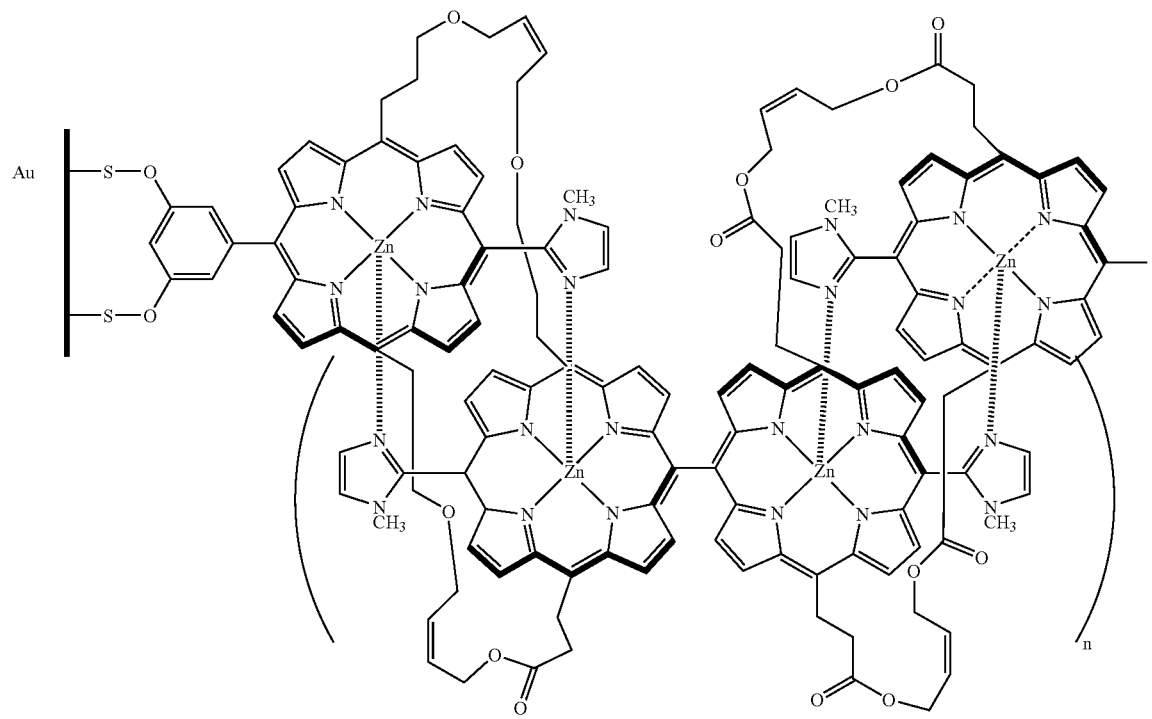
F-5

-continued

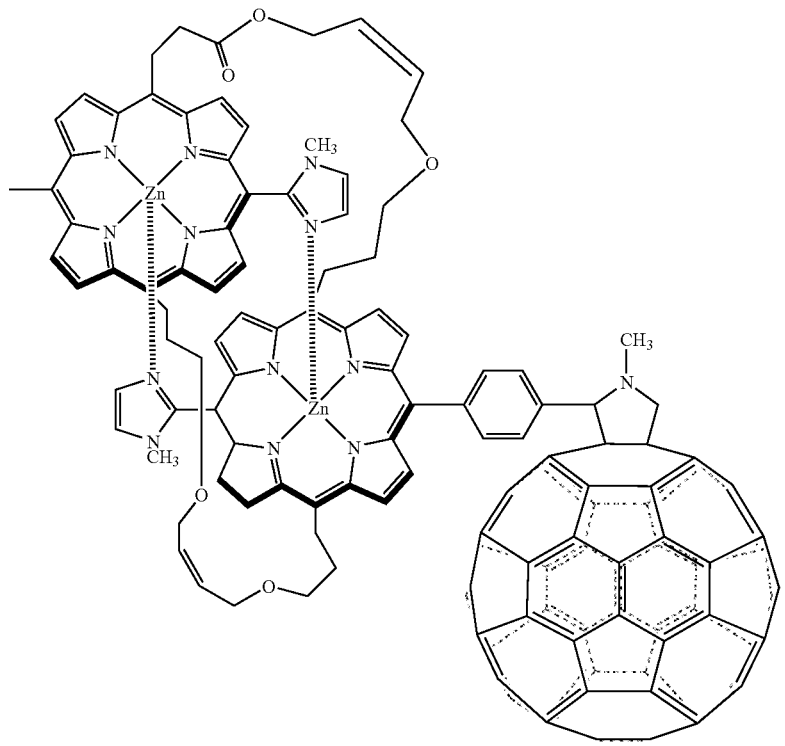

The substrate on which photo-collecting antenna is organized F-5 was soaked in 0.1 mM $CH_2Cl_2$ (containing 20 mM of pyridine) solution of fullerene-substituted imizazolylporphyrin D-3 for 2 hours at room temperature, then washed with $CH_2Cl_2$, and dried under nitrogen flow. Further, the substrate was soaked in a solution of Grubbs catalyst (Grubbs cat. 0.7 mg 0.85 μmol+$CH_2Cl_2$ 4 mL) for 10 min under argon atmosphere, to effect metathesis reaction. Then, the substrate was washed with $CH_2Cl_2$, MeOH and $CH_2Cl_2$ in this order. The substrate obtained by this series of procedure is named C60-Antenna-ZnSAM/Au F-6.

Example 2

Although only two kinds of different porphyrin were used in Example 1 mentioned above, two or more kinds of porphyrin may be laminated and fixed in an arbitrary order. For example, as shown in scheme G below, an element having a gradient of energy level by bonding, on bis-porphyrin 16, bis-porphyrin 26 having lower energy level, and then imidazolylporphyrin having an electron acceptor, may be constructed. By such a method mentioned above, various elements each having a gradient in energy level and having hetero boundary surfaces may be constructed.

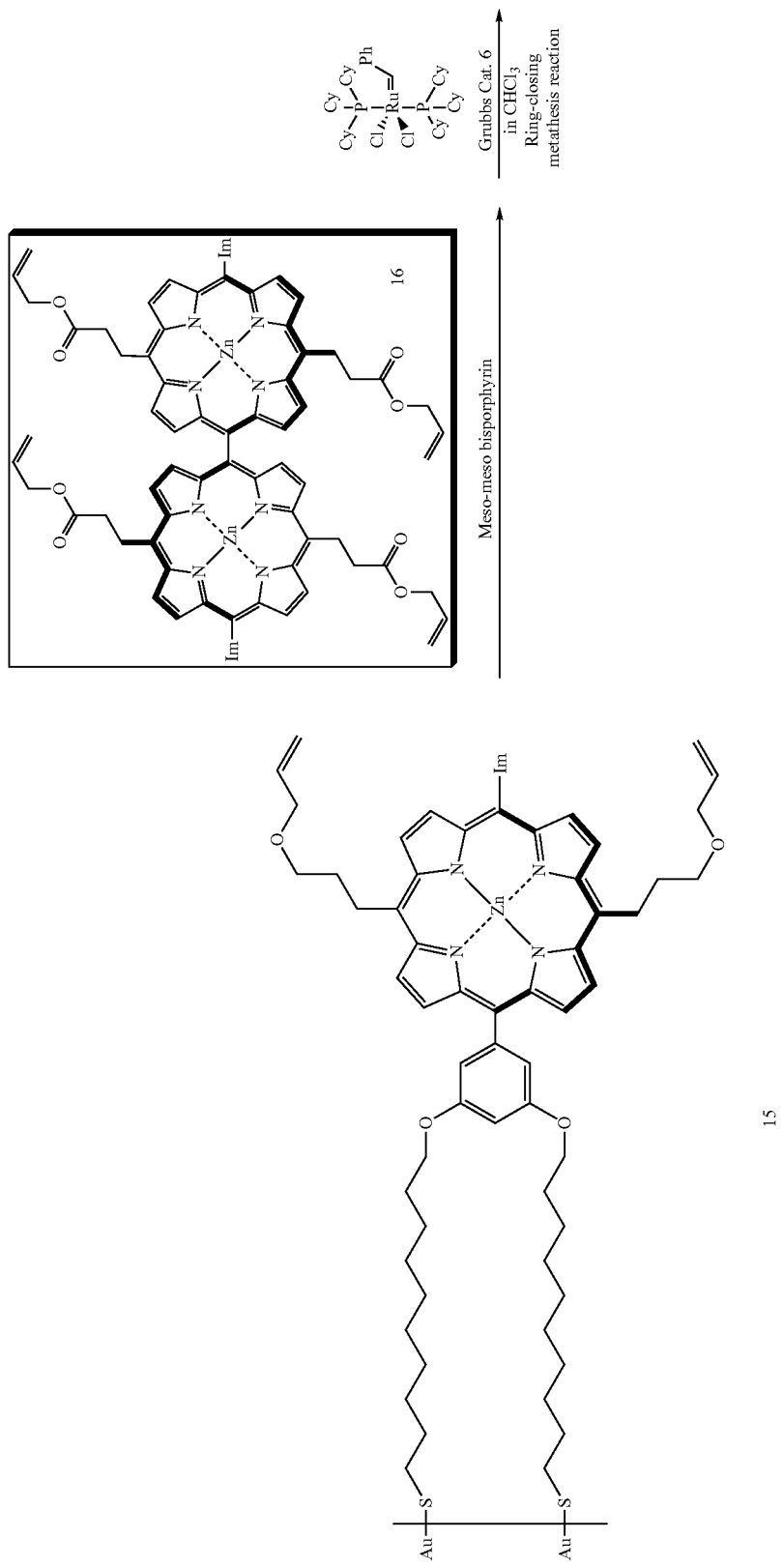

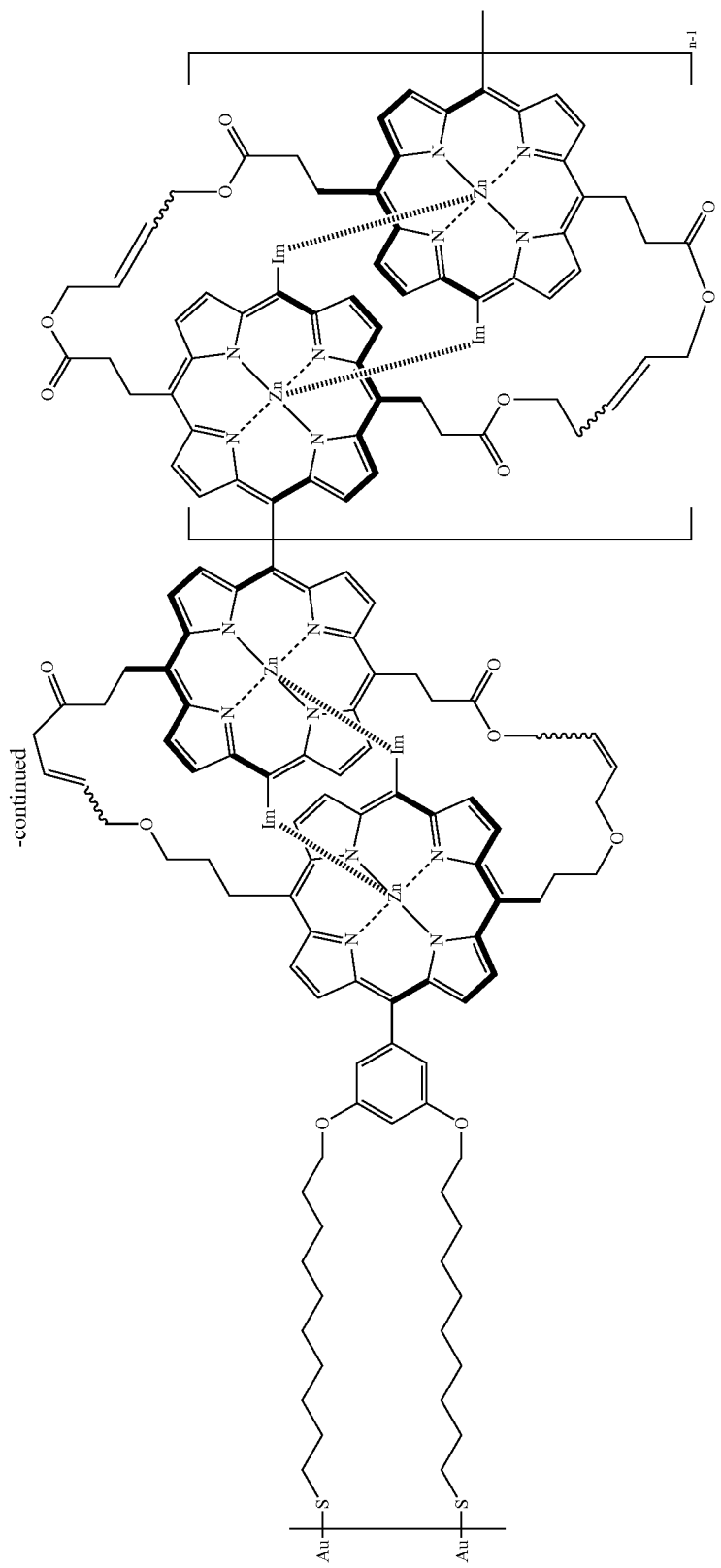

-continued
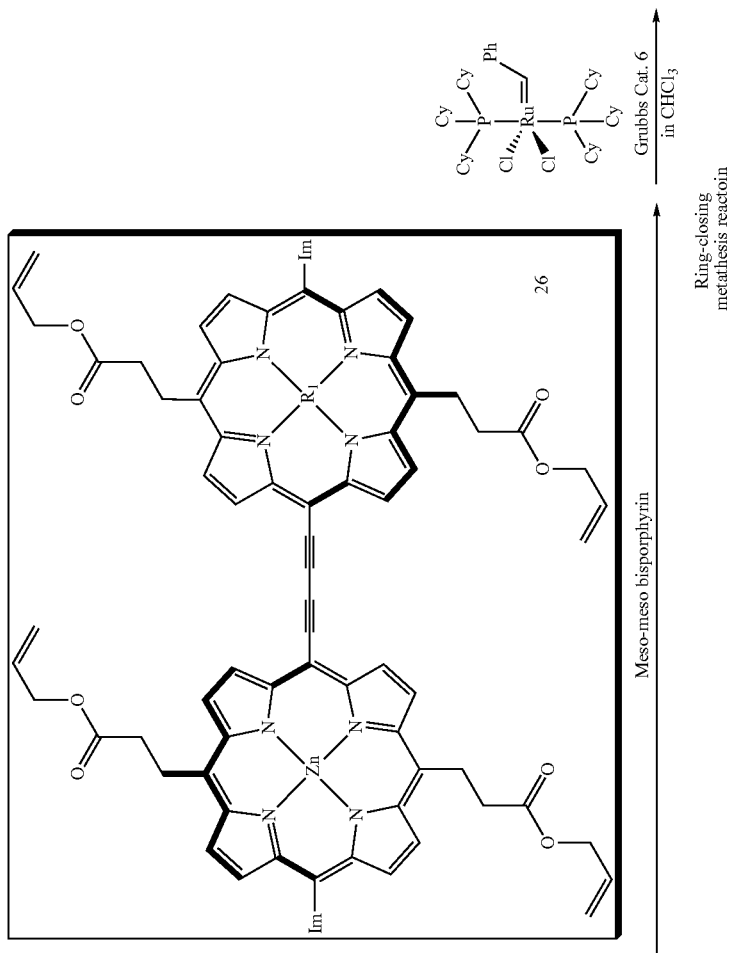
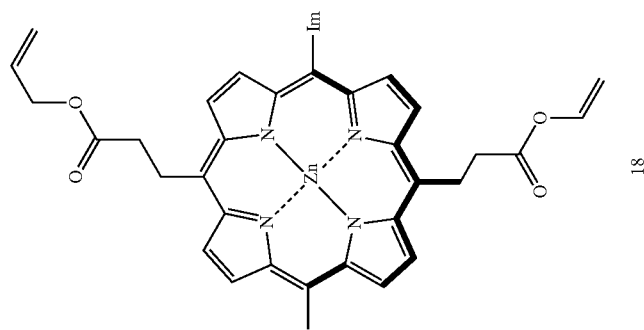

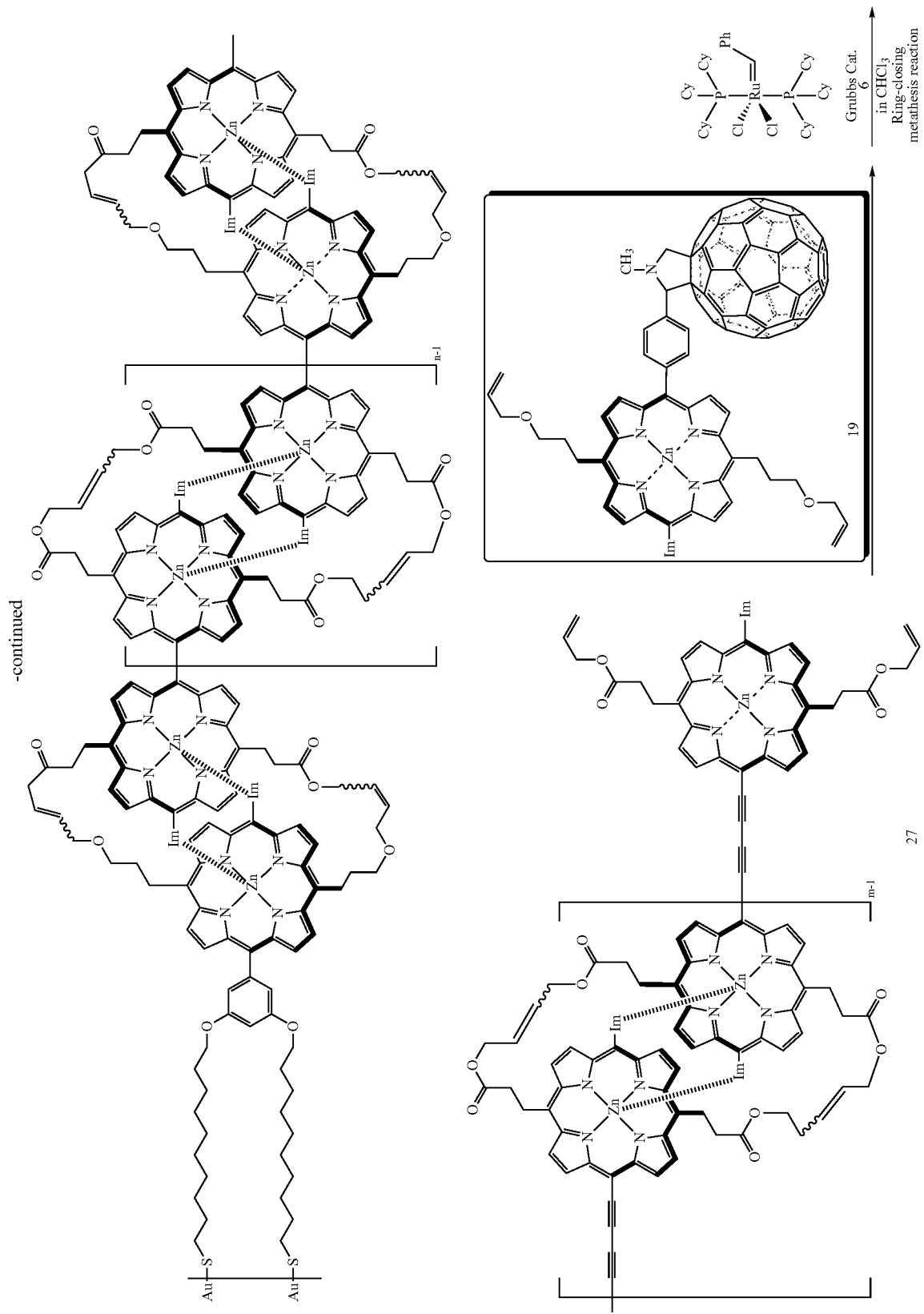

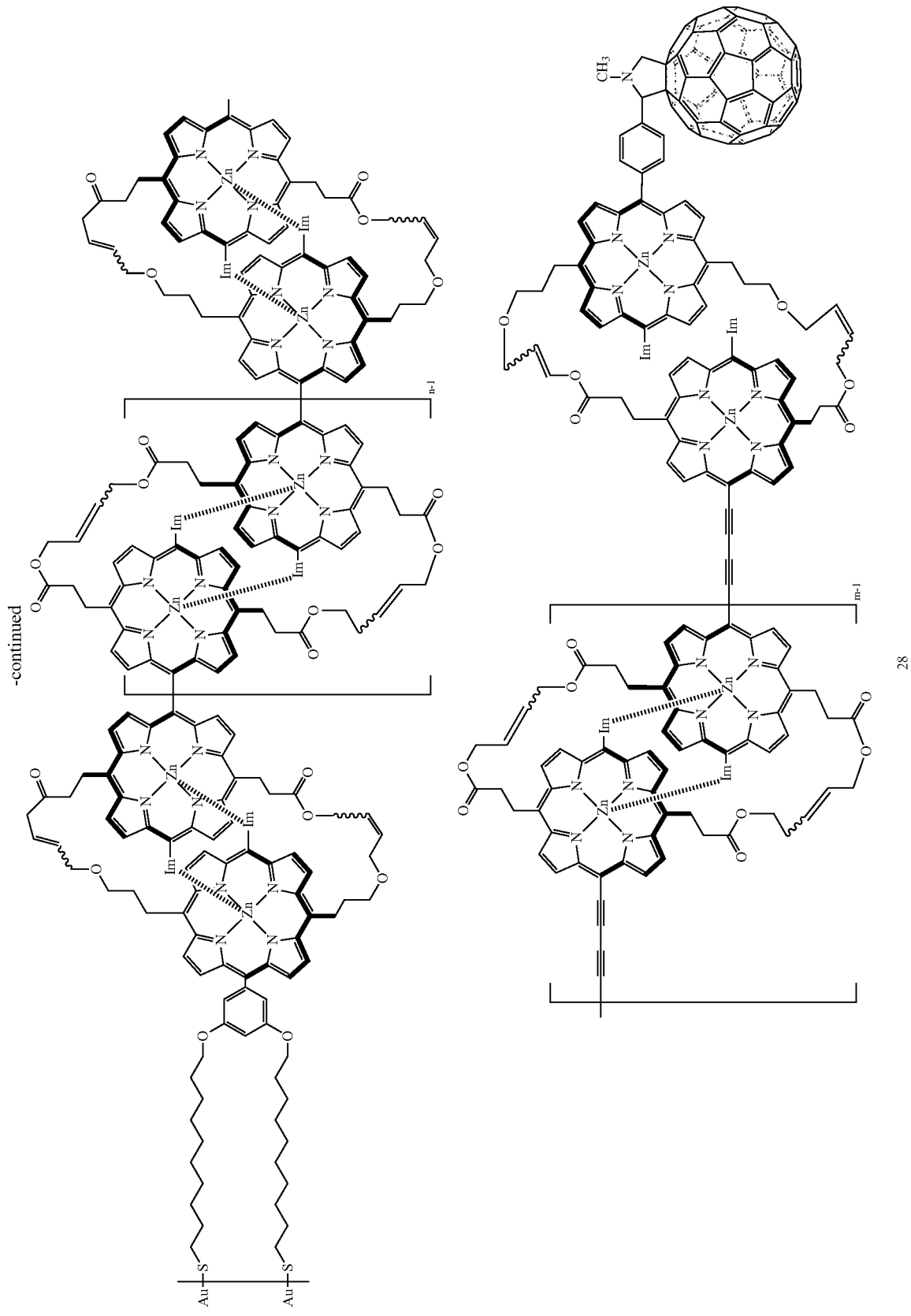

Example 3

(3-1) Measurement of Photo-electronic Current

Photo-electronic current of each of ZnSAM/Au F-3, C60-ZnSAM/Au F-4, Antenna-ZnSAM/Au F-5 and C60-Antenna-ZnSAM/Au F-6 prepared in Example 1 was measured.

Figure 2:
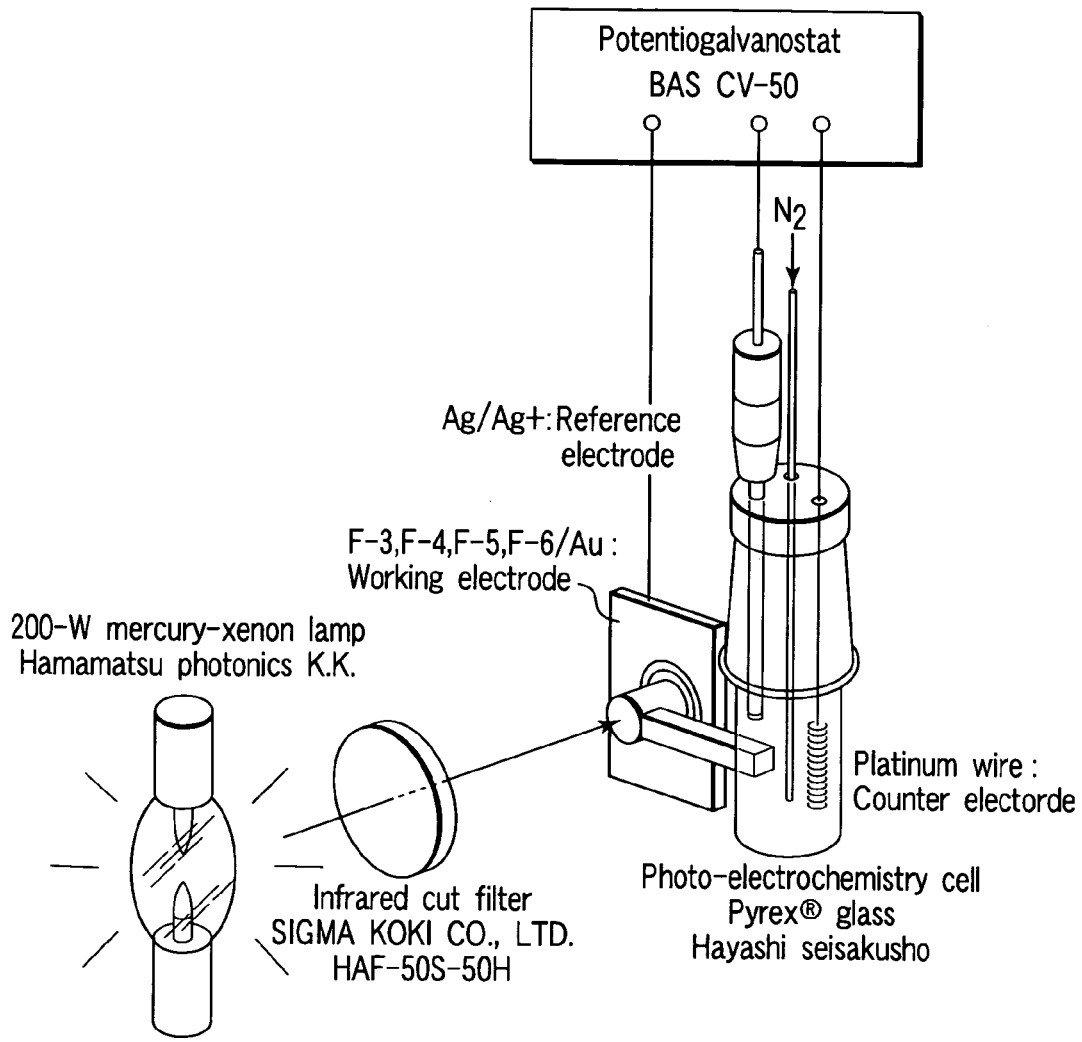
FIG. 2 is a schematic view of a device employed in an example, in which device a triple-pole electrochemical cell is combined with an optical cell.

(3-2) Apparatus for the Measurement
200 W Hg—Xe Lamp
Electronic power supply: XENON LAMP POWER SUPPLY C7535 HAMAMATSU
Lamp housing: LAMPHOUSE UNIT E7536 HAMAMATSU
Monochrome meter: SPG-120S SHIMADZU (3-3) Measurement System The photo-electrochemistry cell (FIG. 2) in which optical cell is combined with tri-pole electrochemical triode electrochemical cell was used. The gold electrode (working electrode) on which porphyrin is modified was fixed in the cell via rubber having a window of 0.28 cm$^2$. The cell was set at a position of 30 cm away from the housing of 200-W Xe lamp. White light or monochrome light was irradiated to the surface of the substrate through optical cell using IR cut filter or monochrome meter. In order to remove the influence of the light from out side, the whole apparatus was covered with a box to shield light. The cell was filled with 0.1 M Na$_2$SO$_4$ aqueous solution, as a supporting electrolyte, and 5 mM methylviologen aqueous solution for sacrificial agent. Photo-electronic current was measured after the counter electrode (platinum wire) and the reference electrode (Ag/Ag$^+$, CH$_3$CN, tetra-t-butylammonium perchlorate (TBAP)) were soaked in the solution and nitrogen was bubbled therethrough for 1 hour.

After the initiation of the measurement, the current was stabilized by letting the shutter off for 50 min. Then, light irradiation was changed between on and off in an interval of 20 sec.

Figure 3:
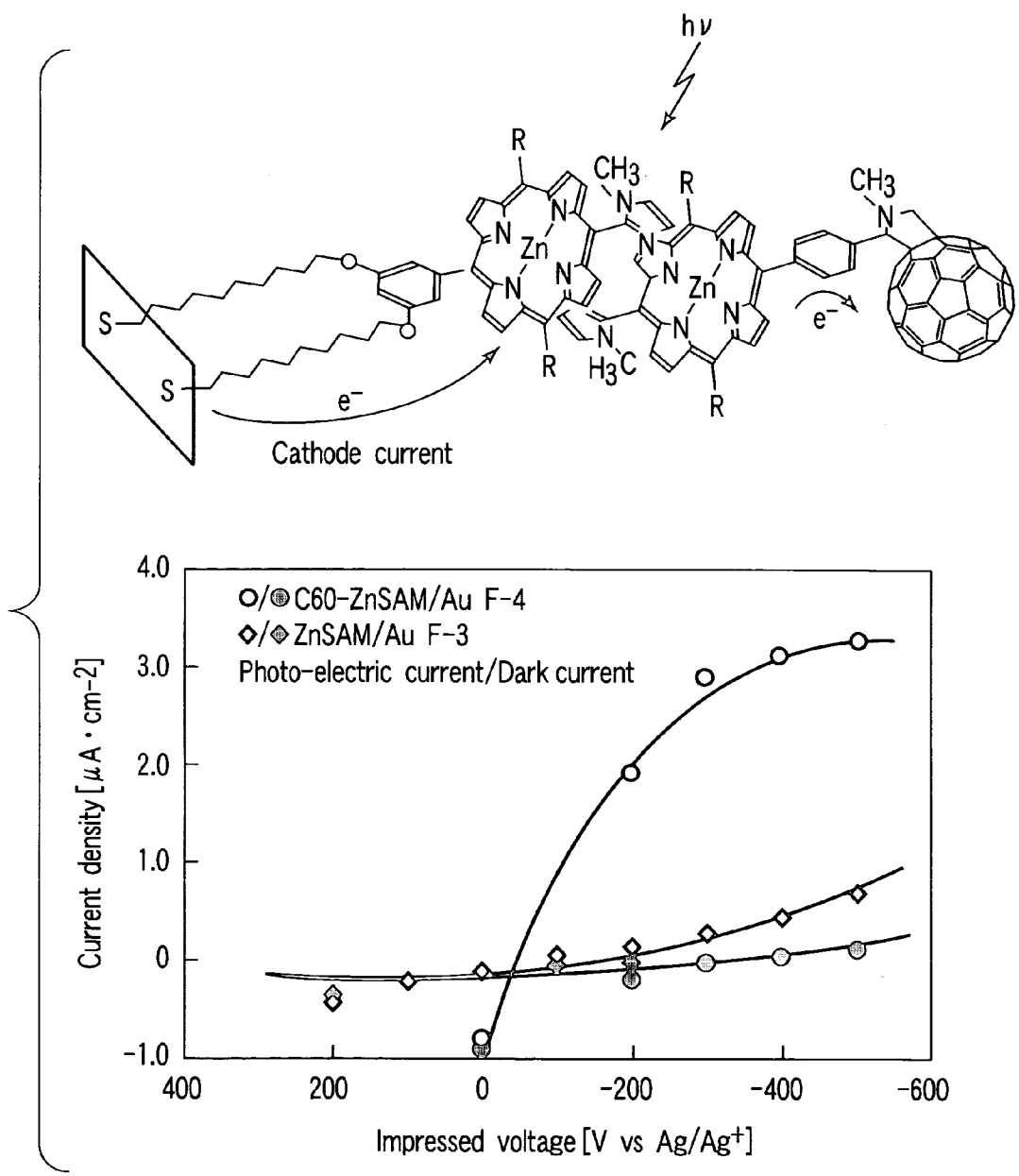
FIG. 3 is a graph showing results of photocurrent measurement of Zn-SAM F-3 (white and black squares indicate photocurrent and dark current, respectively) and C60-Zn-SAM/Au F-4 (white and dark circles indicate photocurrent and dark current, respectively).
Figure 4:
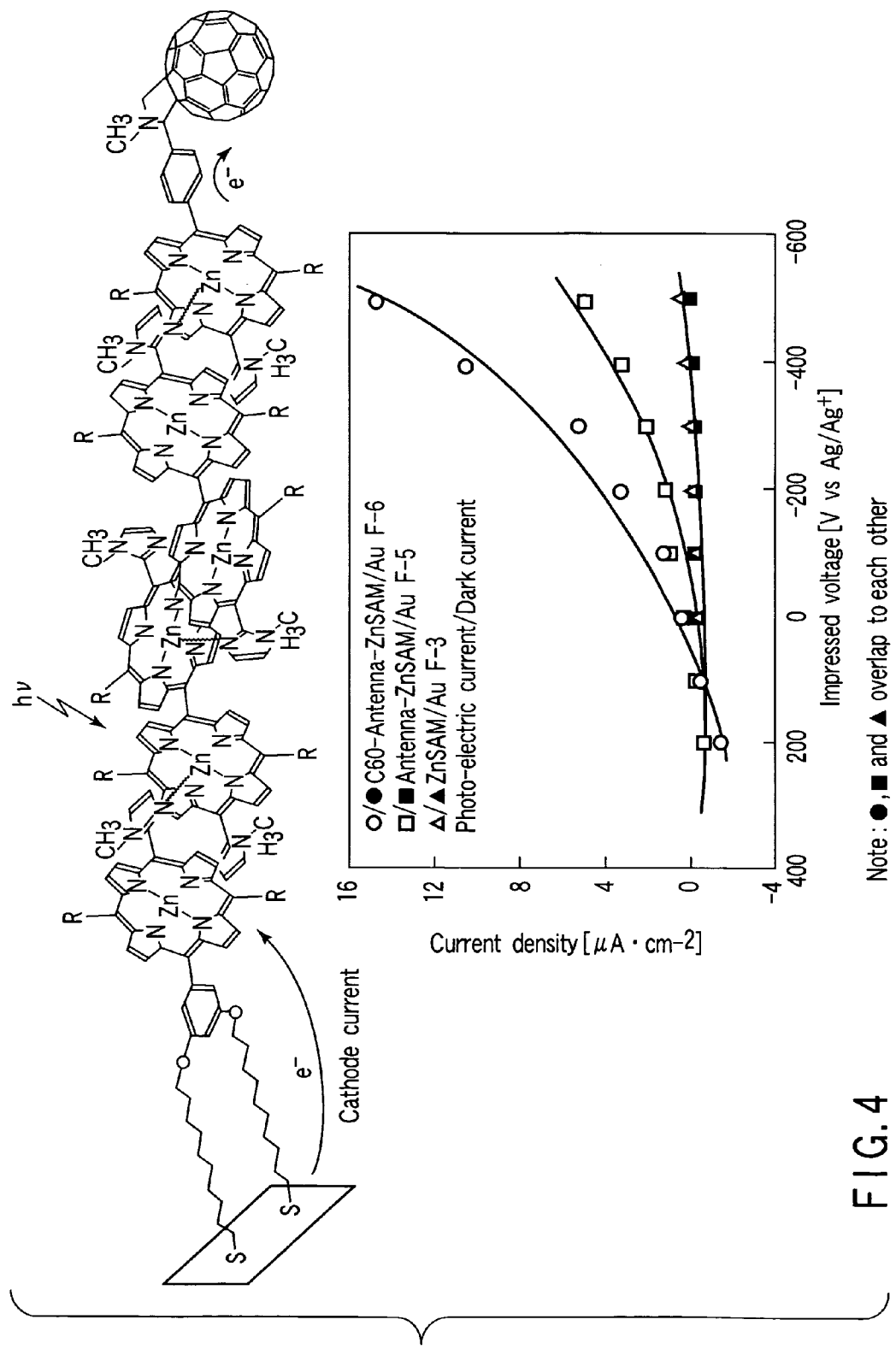
FIG. 4 is a graph showing results of photocurrent measurement of Zn-SAM F-3 (white and black triangles indicate photocurrent and dark current, respectively), Antenna-Zn-SAM/Au F-5 (white and black squares indicate photocurrent and dark current, respectively) and C60-Antenna-ZnSAM/Au F-6 (white and dark circles indicate photocurrent and dark current, respectively).

The relationship between electric current and voltage at the times of light irradiation and non-irradiation of the prepared substrates ZnSAM/Au F-3, C60-ZnSAM/Au F-4, Antenna-ZnSAM/Au F-5 and C60-Antenna-ZnSAM/Au F-6 were measured using the above apparatus. The results are shown in FIGS. 3 and 4.

The relationship between electric current and voltage at the times of light irradiation and non-irradiation of Antenna-ZnSAM/Au F-5 was also measured by changing the electrolyte to 50 mM triethanolamine. The results are shown in FIG. 5.

The element represented by the formula (VIII) or (VIII') having a polymer on a substrate is able to be used as photo-functional element by the function of photo-excited electron transfer of porphyrin, which is a constituting unit. Specifically, the photo-functional element of the present invention is expected to be applied to organic solar cell and third-order non-linear organic material.

Also, in the photo-functional element of the present invention, the porphyrin polymer that is organized by coordination bonds on a substrate is fixed by covalent bonds. Especially, the fixation by the covalent bonds renders the photo-functional element of the present invention to less dependent on the circumstance (a solvent to be used) in which the photo-functional element of the present invention is used. As a result, the configuration of the polymer is maintained stably. In addition, the possibility of detaching the already laminated layer during the soaking step for laminating the polymer and a washing step of the laminate. As a result, a laminate having a large thickness may be formed.

Also, in the photo-functional element of the present invention, porphyrin to be fixed may be arbitrarily selected, and the element may be grown step by step toward one direction only. Accordingly, for example, when porphyrin polymers having different energy levels are fixed step by step, a functional material having a gradient of electric level may be obtained. Due to this, the direction of electrons holes may be control (rectification).

Also, the photo-functional element of the present invention has advantages, in comparison with conventional electric materials using inorganic semiconductor, such as a possibility of weight decrease (weight saving), a possibility of thin layer formation, resistance to bending, lower cost, and decomposition by nature after the use thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photo-functional molecule element having, on a substrate, a porphyrin polymer containing covalently-fixed porphyrin units represented by the following formula (VIII) or (VIII'):

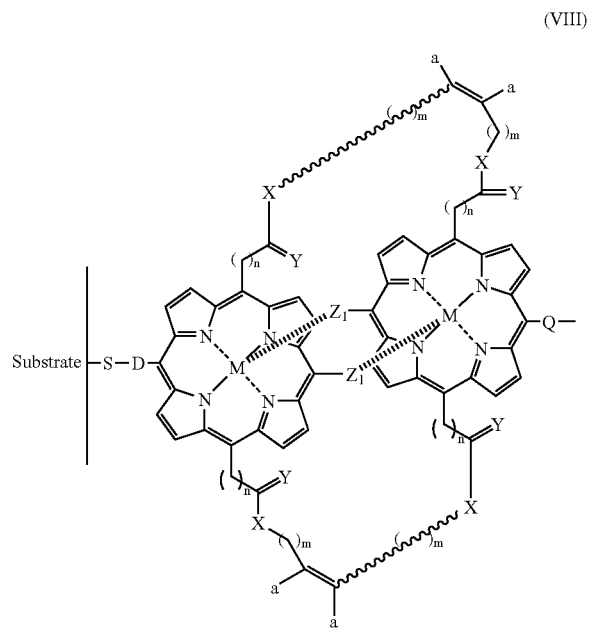

(VIII)

-continued
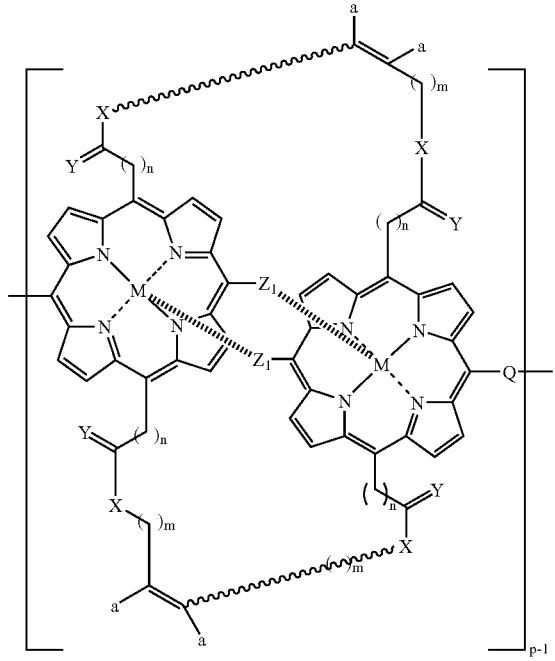
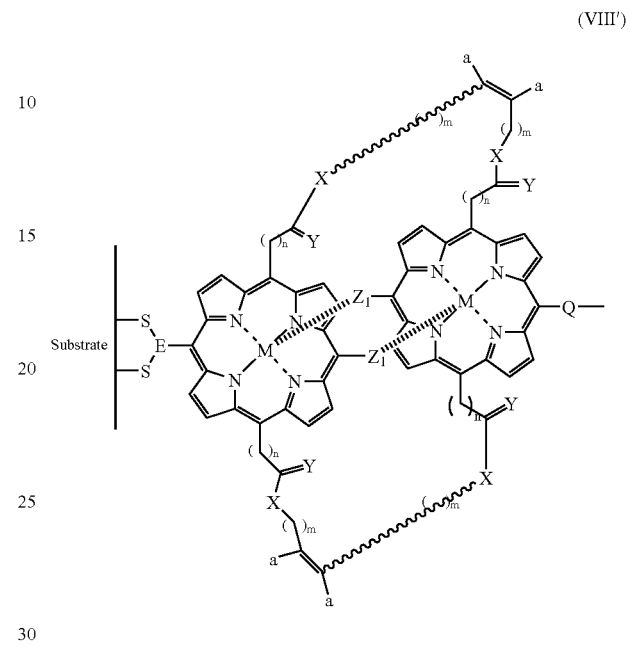
(VIII′)
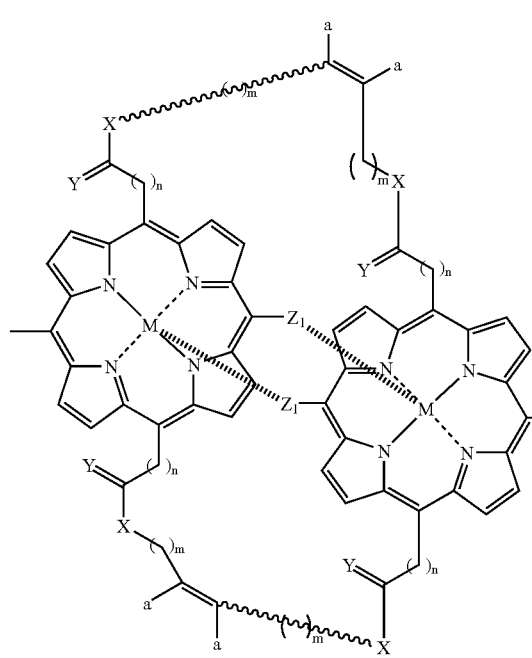
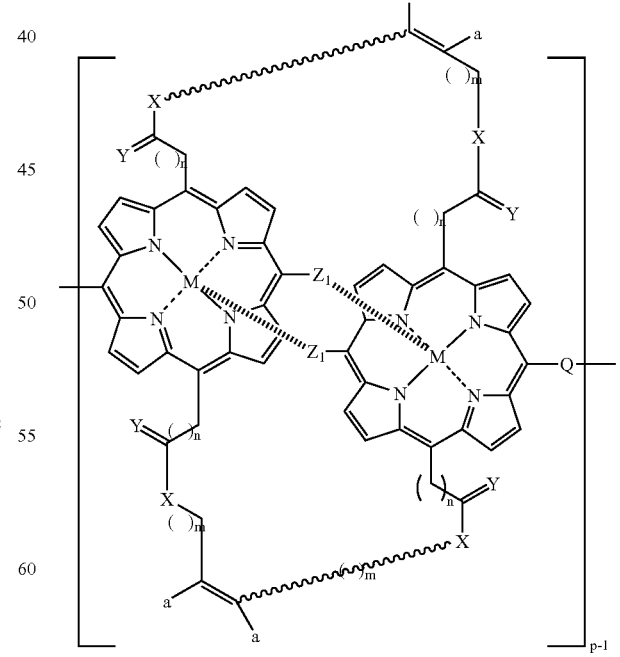

-continued

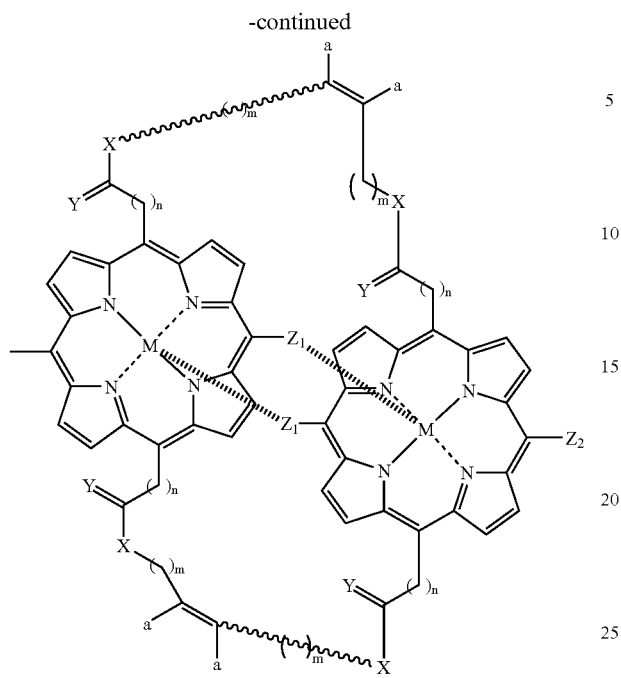

[wherein
- a represents H, an alkyl group or an aryl group;
- X represents —O—, —S—, >$NR_{101}$ (wherein $R_{101}$ represents H or an alkyl group), —$CH_2$— or a single bond;
- Y represents =O, =S or 2H;
- m represents an integer of 0 to 4;
- n represents an integer of 0 to 6;
- $Z_1$ represents a 5- or 6-membered nitrogen-containing heteroaromatic ring group capable of forming a coordination bond;
- $Z_2$ represents a group having a functional group which can be an electron acceptor or electron donor, or a group which can be the terminal group of the porphyrin polymer;
- D represents a divalent group including at least one of an arylene group and an alkylene group;
- E represents a trivalent group including at least one of an arylene group and an alkylene group;
- M represents an ion of metal selected from the group consisting of typical metals and transition metals;
- Q represents a single bond or a divalent linking group; and
- p represents an integer of 1 or more, and
- wherein a plurality of the repeating unit consisting of two porphyrin derivatives that are boned with the two covalent bonds may be the same or different to each other].

2. The photo-functional molecule element according to claim 1, wherein the 5- or 6-membered nitrogen-containing heteroaromatic ring group represented by $Z_1$ is selected from the group consisting of an imidazolyl group and a derivative thereof, an oxazolyl group, a thiazolyl group and 2-pyriziyl group.

3. The photo-functional molecule element according to claim 1, wherein the group having a functional group which can be an electron acceptor represented by $Z_2$ is selected from:

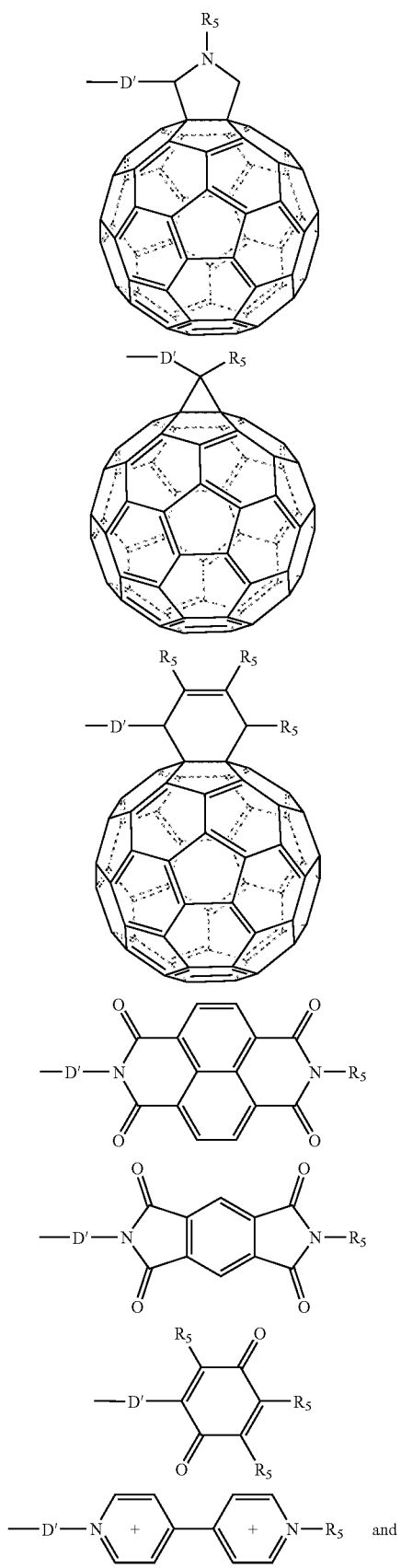

and

-continued

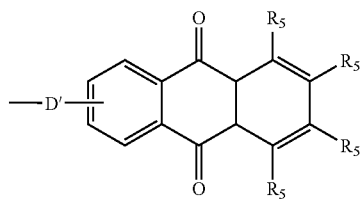

[(wherein D' represents a single bond, a divalent group including at least one of arylene group and alkylene group,

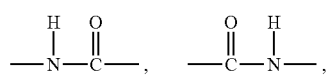

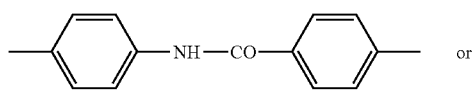

or

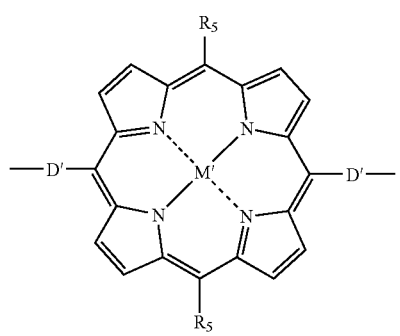

(wherein $R_5$ represents H, an alkyl group, an aryl group, a halogen atom, a cyano group or an alkoxy group, wherein two $R_5$s may be the same or different; and M' represents 2H or the ion of the metal represented by M)].

4. The photo-functional molecule element according to claim 1, wherein the group having a functional group which can be an electron donor represented by $Z_2$ is selected from:

[wherein D' represents a single bond, a divalent group including at least one of arylene group and alkylene group,

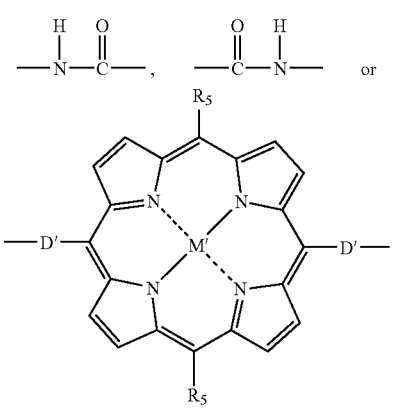

(wherein $R_5$ represents H, an alkyl group, an aryl group, a halogen atom, a cyano group or an alkoxy group, wherein two $R_5$s may be the same type or different; and M' represents 2H or the ion of the metal represented by M)].

5. The photo-functional molecule element according to claim 1, wherein the group having a functional group which can be the terminal group of the porphyrin polymer represented by $Z_2$ is selected from the group consisting of an alkyl group, an aryl group and an alkynyl group.

6. The photo-functional molecule element according to claim 1, wherein the divalent group including at least one of arylene group and alkylene group represented by D is a divalent group having at least an arylene group and/or an alkylene group at terminal ends thereof, and optionally having therebetween at least one group selected from an ether group, a carbonyl group, and a functional group having a hetero atom).

7. The photo-functional molecule element according to claim 1, wherein the trivalent group including at least one of arylene group and alkylene group is a trivalent group obtained by eliminating one hydrogen atom from the divalent group represented by D.

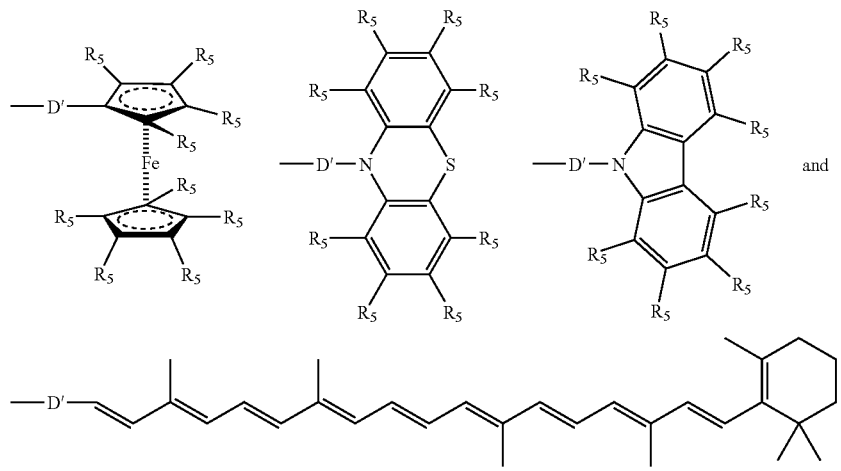

and

8. The photo-functional molecule element according to claim 1, wherein the metal that provides the ion represented by M is selected from the group consisting of typical metals belonging to 1A, 2A, 2B, 3B to 7B and 0 groups on the periodic table, and transition metals belonging to 3A to 7A, 8 and 1B groups on the periodic table.

9. The photo-functional molecule element according to claim 1, wherein the divalent linking group represented by Q is selected from the group consisting of a divalent, saturated or unsaturated aliphatic hydrocarbon group, a divalent, saturated or unsaturated hydrocarbon ring group, a divalent, saturated or unsaturated hetero cyclic group, and a combination of at least one of these divalent groups and at least one divalent groups selected from —O— and —C(=O)—.

10. The photo-functional molecule element according to claim 1, wherein the substrate is a metal selected from old, silver, copper, platinum, palladium, nickel and aluminum, or a solid substrate onto which one of the metals is vapor-deposited; semiconductor selected from $TiO_2$, $SnO_2$, indium tin oxide, CdS, CdSe, GaAs, GaP, Si, InP and CdTe, or semiconductor into which an electron acceptor or an electron donor is added; and a solid substrate onto which a polymer selected from conductive polymer, semiconductive polymer, polythiophene-type polymer, polypyrrole-type polymer, polyacetylene-type polymer and polydiacetylene-type polymer is coated.

11. A method of preparing a photo-functional molecule element having, on a substrate, a porphyrin polymer containing covalently-fixed porphyrin units, which method comprises:
(1) fixing, on a substrate, a linker molecule represented by the following formula (I):

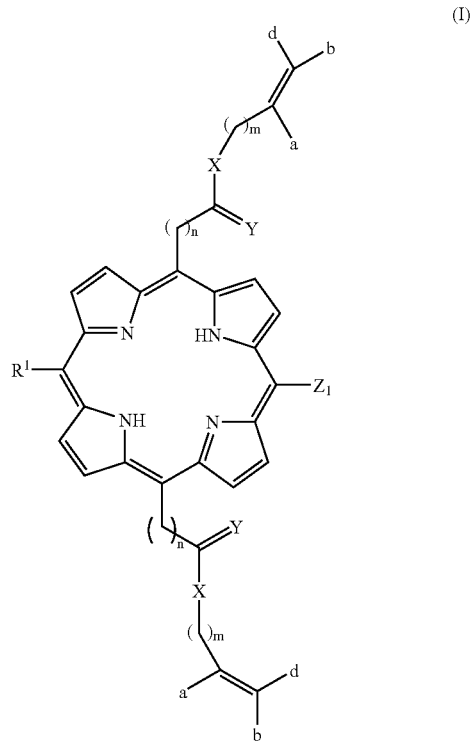

[wherein
a, b and d independently represent H, an alkyl group or an aryl group;

X represents —O—, —S—, >$NR_{101}$ (wherein $R_{101}$ represents H or an alkyl group), —$CH_2$— or a single bond;

Y represents =O, =S or 2H;

m represents an integer of 0 to 4;

n represents an integer of 0 to 6;

$Z_1$ represents a 5- or 6-membered nitrogen-containing heteroaromatic ring group capable of forming a coordination bond; and $R^1$ represents

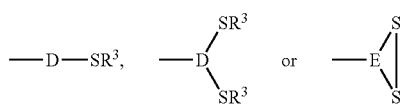

(wherein D represents a divalent group including at least one of arylene group and alkylene group; E represents a trivalent group including at least one of arylene group and alkylene group; and $R^3$ represents H or an acetyl group)]; and introducing a metal, M, selected from the group consisting of typical metals and transition metals to the porphyrin residue derived from the linker molecule, thereby obtaining a monomolecular film represented by the following formula (II) or (II'):

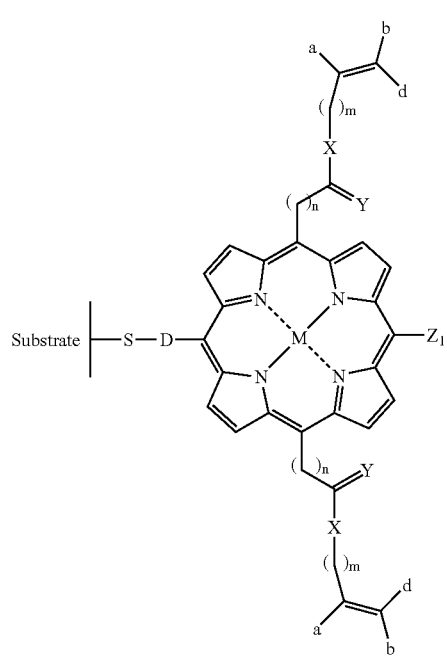

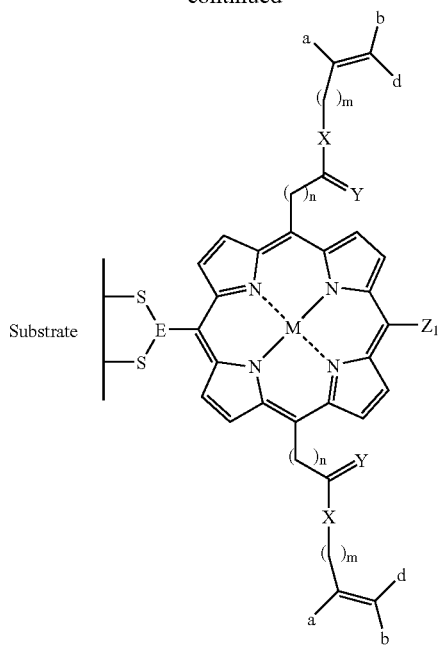

(wherein each of the substituents is as defined above), provided that either one of the fixing a linker molecular and the introducing a metal M may be carried out earlier than the other;

(2) linking the porphyrin residue of the monomolecular film with one of porphyrin residues of meso-meso linked bis-porphyrin represented by the following formula (III):

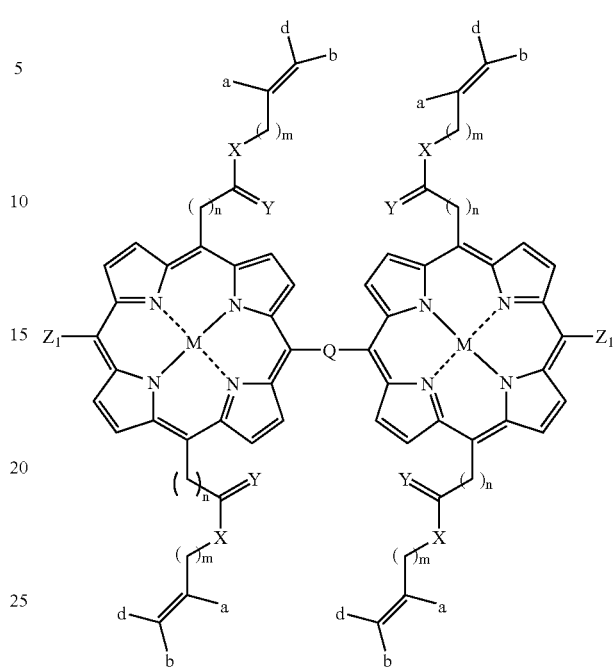

(wherein each of a, b, d, X, Y, m, n, M and $Z_1$ is as defined above and Q represents a single bond or divalent linking group), via two coordinate bonds, thereby obtaining a first laminate represented by the following formula (IV) or (IV'):

-continued
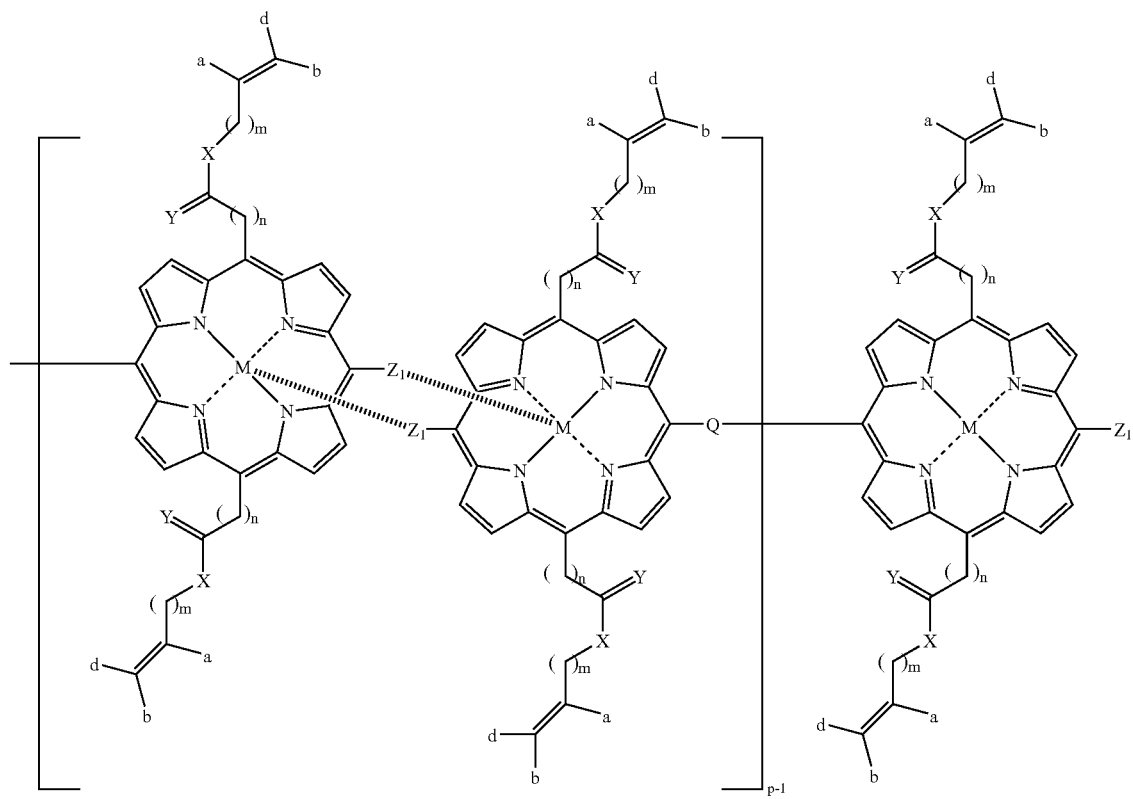
(IV')
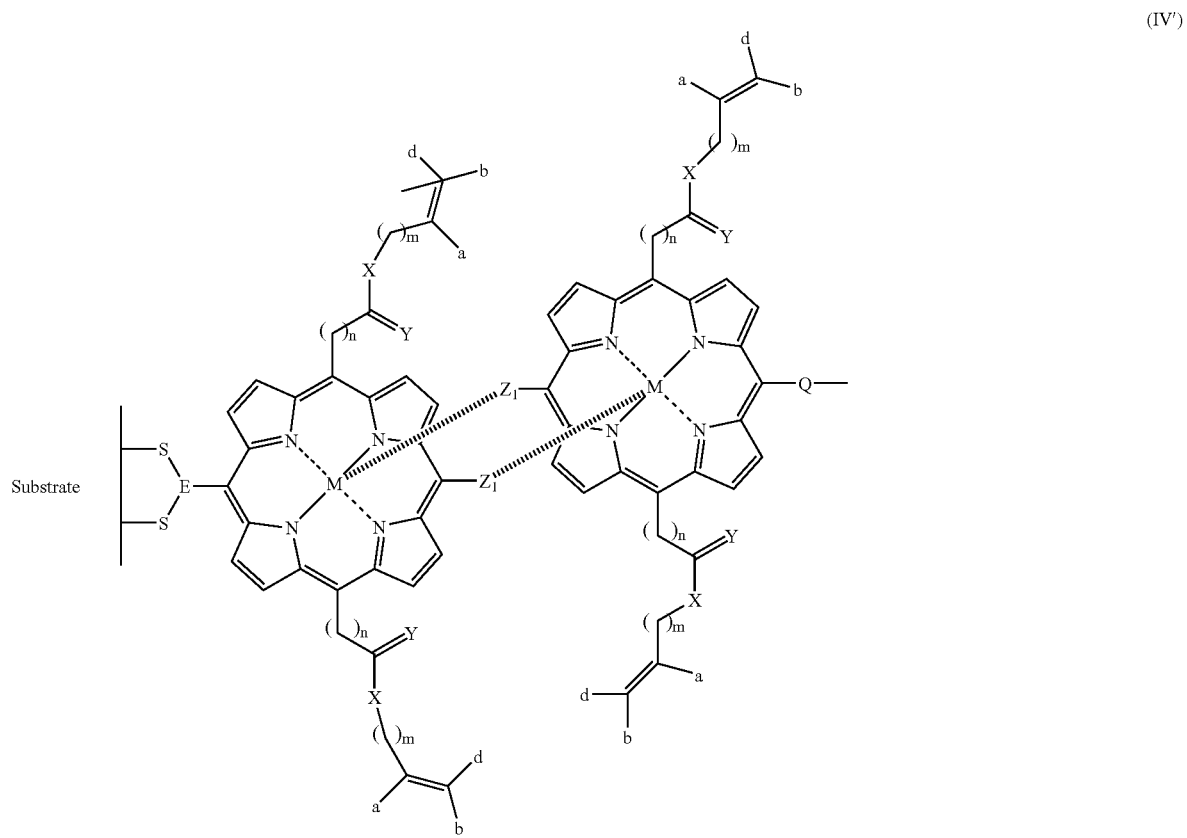

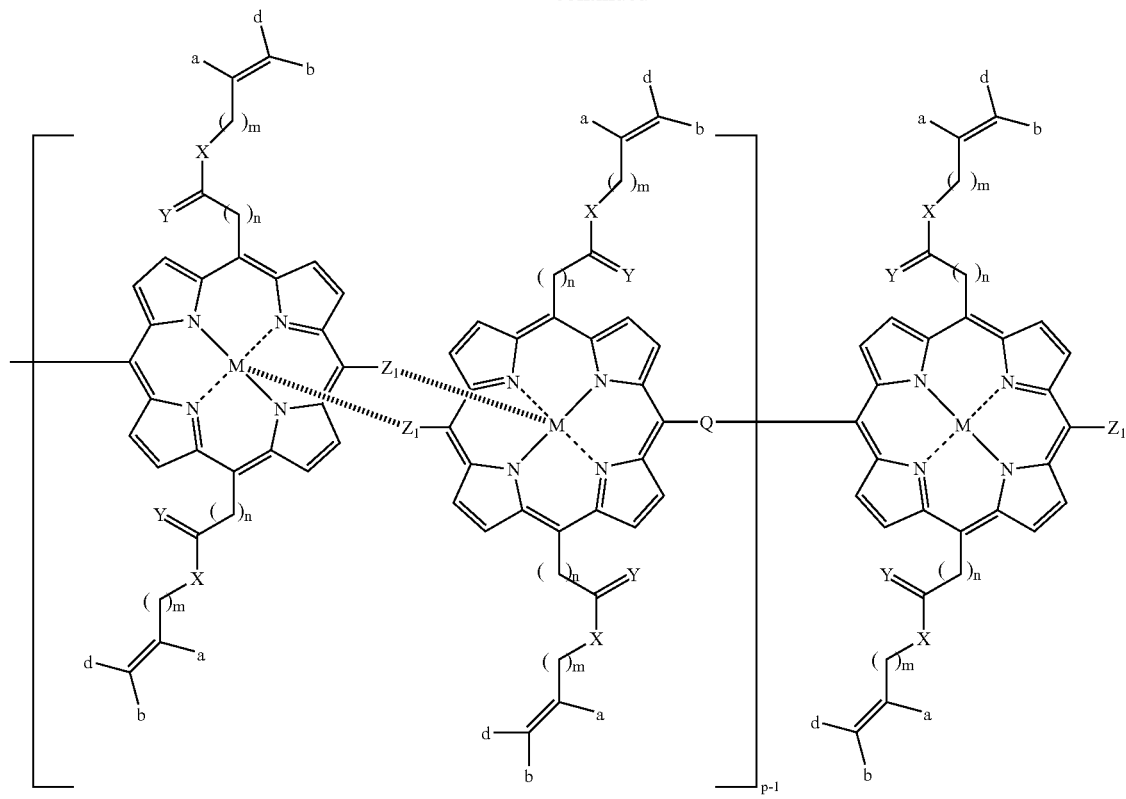

(wherein each of the substituent is as defined above, and p is 1);

(3) effecting, in the presence of a Grubbs catalyst, a ring-closing metathesis reaction of the olefin portions of the porphyrin residue derived from the linker molecule, with the corresponding olefin portions of the porphyrin residue that is coordinated to the linker molecule, so that the porphyrins are fixed to each other by covalent bonds, thereby obtaining a fixed first laminate represented by the following formula (V) or (V'):

(V)

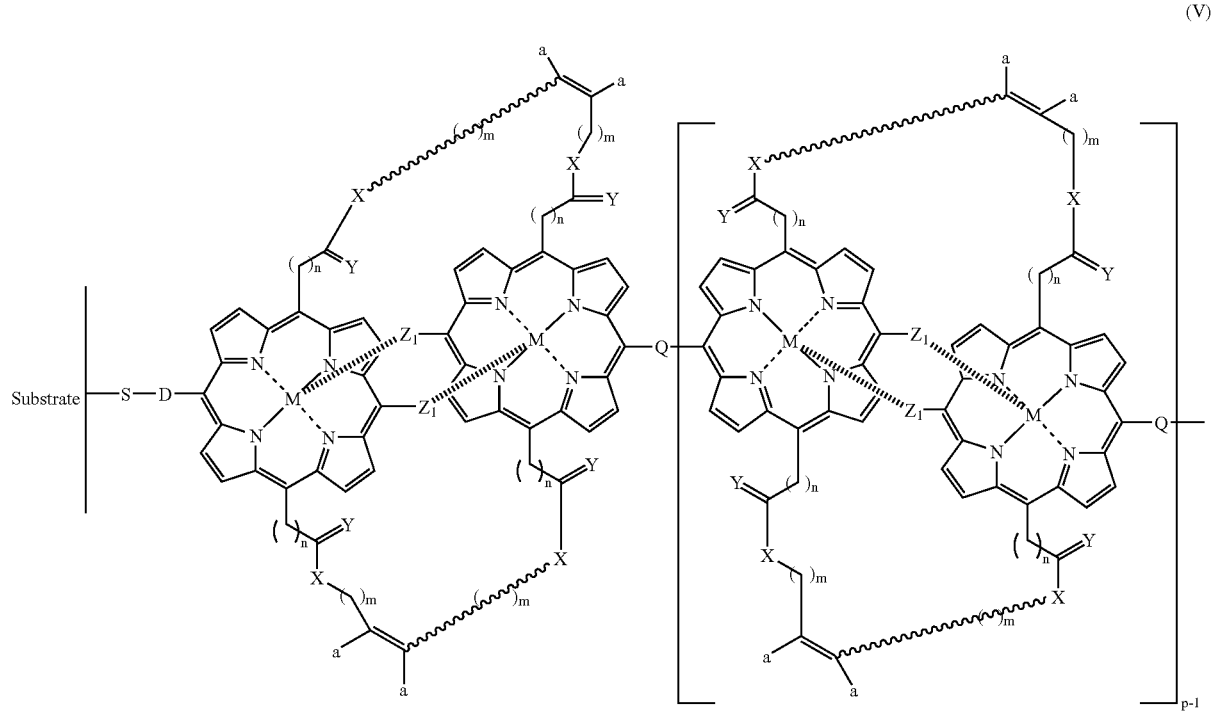

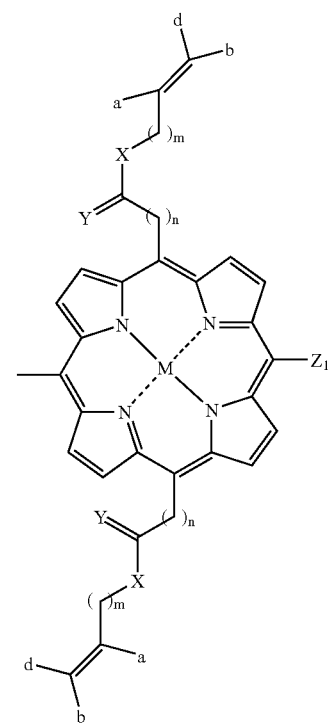
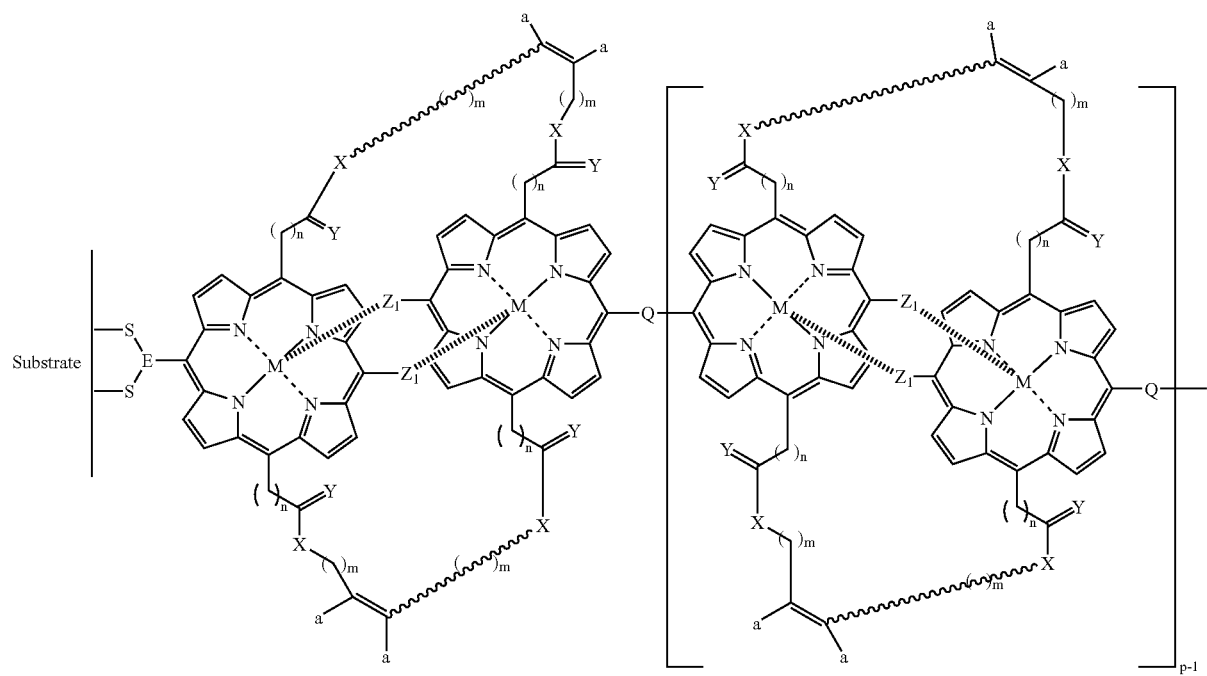
(V′)

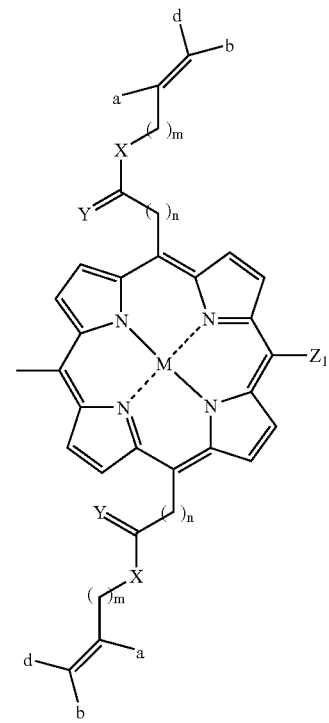

(wherein each of the substituents is as defined above, and p is 1);

(4) optionally,
linking the porphyrin residue at the terminal end of the fixed first laminate with one of the porphyrin residues of another meso-meso linked bis-porphyrin represented by the formula (III), via two coordinate bonds, in the same manner as in above (2), thereby obtaining a second laminate represented by the above formula (IV) or (IV'), wherein p represents an integer of 2 or more); and effecting, in the presence of a Grubbs catalyst, a ring-closing metathesis reaction in the same manner as in above (3), thereby obtaining a fixed second laminate represented by the formula (V) or (V'), wherein p represents an integer of 2 or more);
wherein the linking and the effecting the ring-closing metathesis reaction, as one cycle, are sequentially repeated q times, thereby obtaining a fixed $q^{th}$ laminate represented by the formula (V) or (V'), wherein p represents q, and q is an integer of 2 or more;

(5) linking the porphyrin residue at the terminal end of the fixed first laminate obtained in above (3) or the fixed $q^{th}$ laminate obtained in above (4), with the porphyrin residue of a porphyrin derivative represented by the following formula (VI):

(VI)

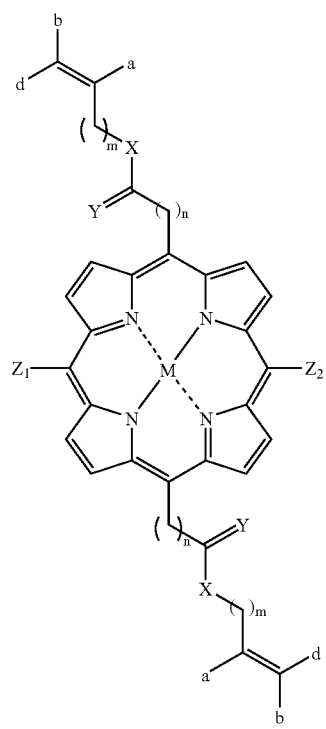

(wherein each of $Z_1$, M, X, Y, m, n, a, b and d is as defined above, and $Z_2$ represents a group having a functional group which can be an electron acceptor or electron donor, or a group which can be the terminal group of the porphyrin polymer), via two coordinate bonds, thereby obtaining a photo-functional molecule precursor represented by the following formula (VII) or (VII'):
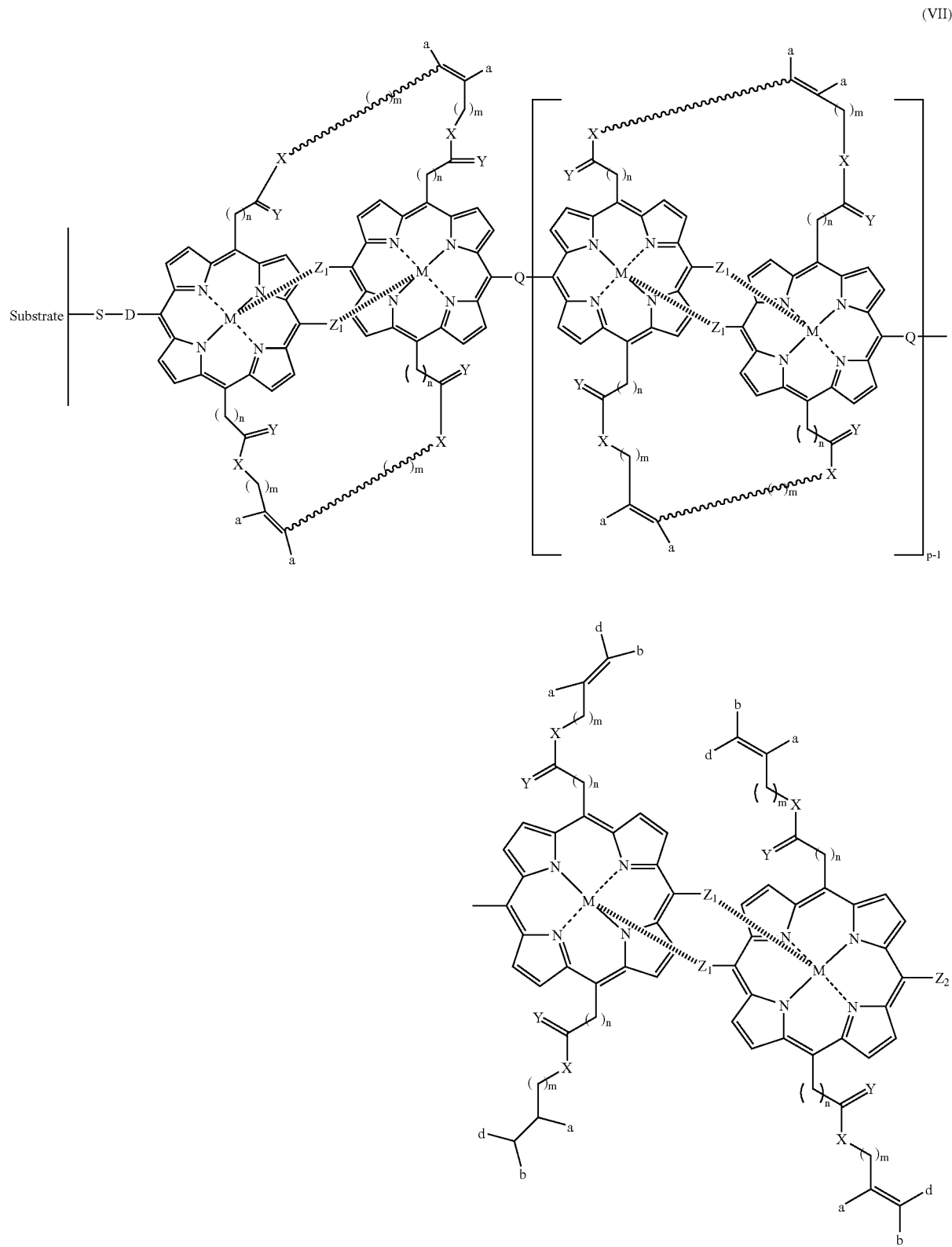
(VII)

-continued (VII')

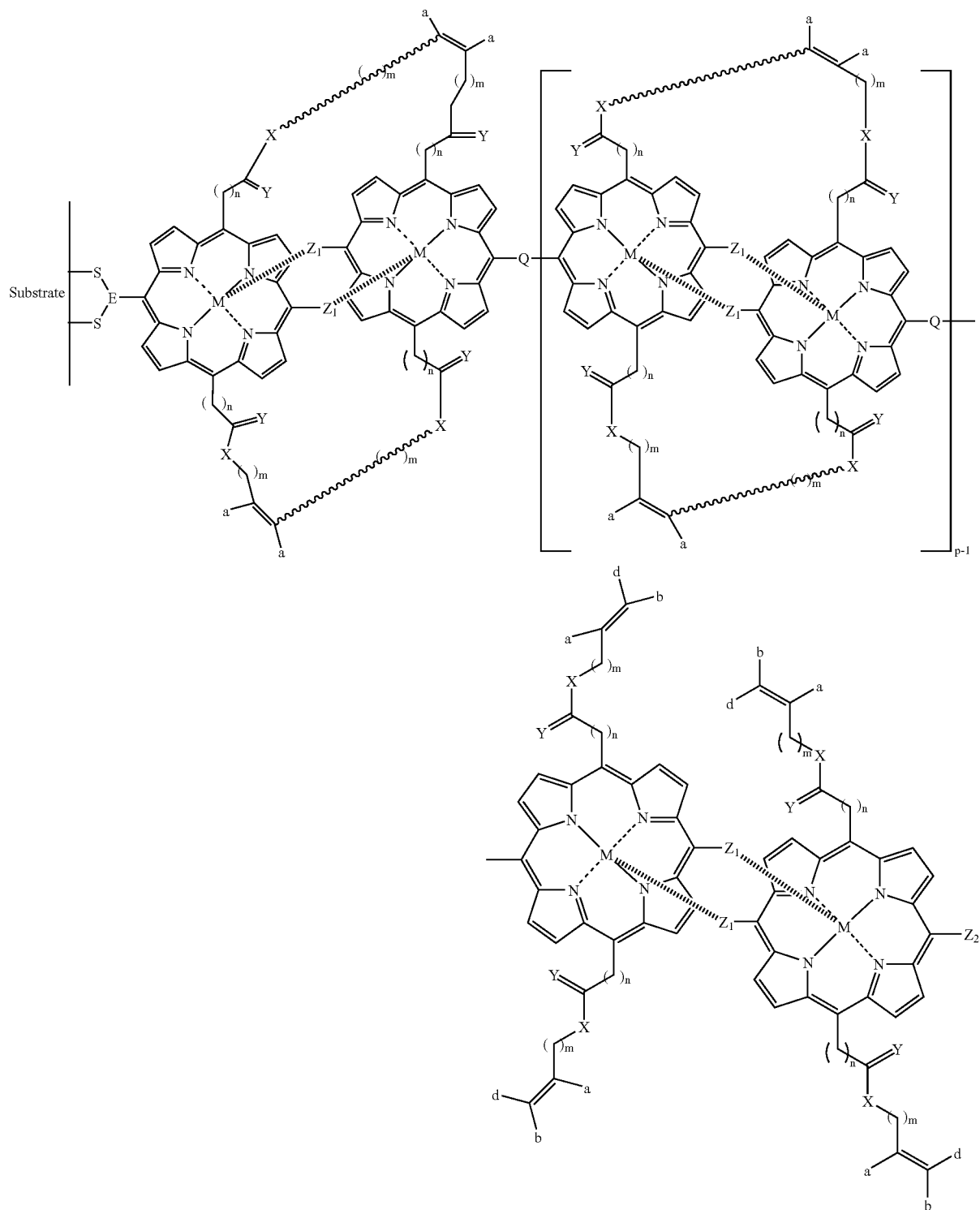

(wherein each of the substituents is as defined above); and (6) effecting, in the presence of a Grubbs catalyst, a ring-closing metathesis reaction of the olefin portion derived from the porphyrin derivative represented by the formula (VI), with the olefin portion of the porphyrin residue that is coordinated to the porphyrin derivative, so that the porphyrins are fixed to each other by covalent bonds, thereby obtaining a photo-functional molecule element represented by the following formula (VIII) or (VIII'):

(VIII)
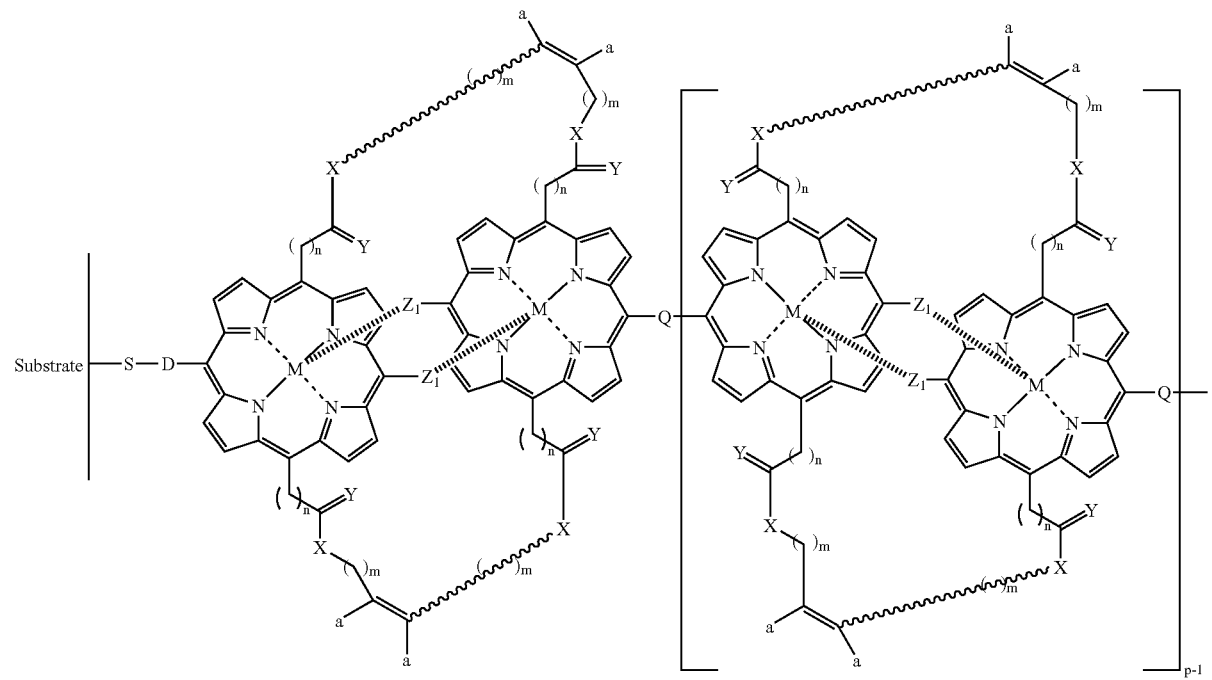
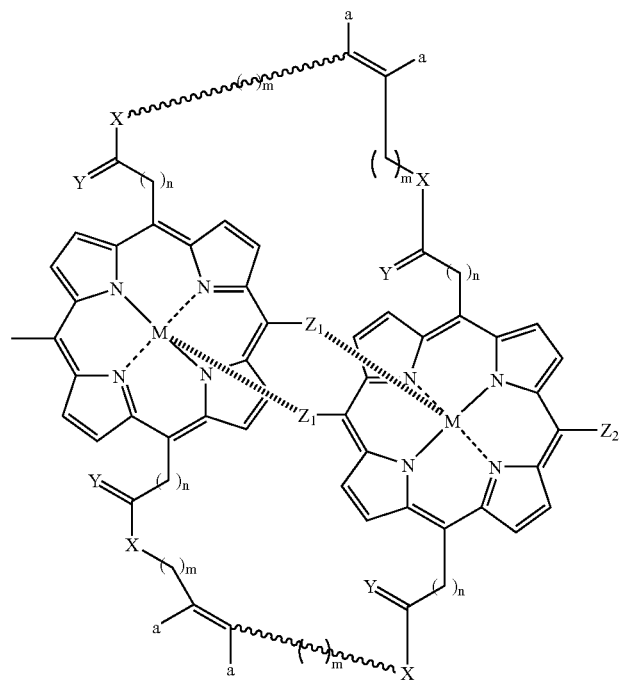

-continued (VIII')

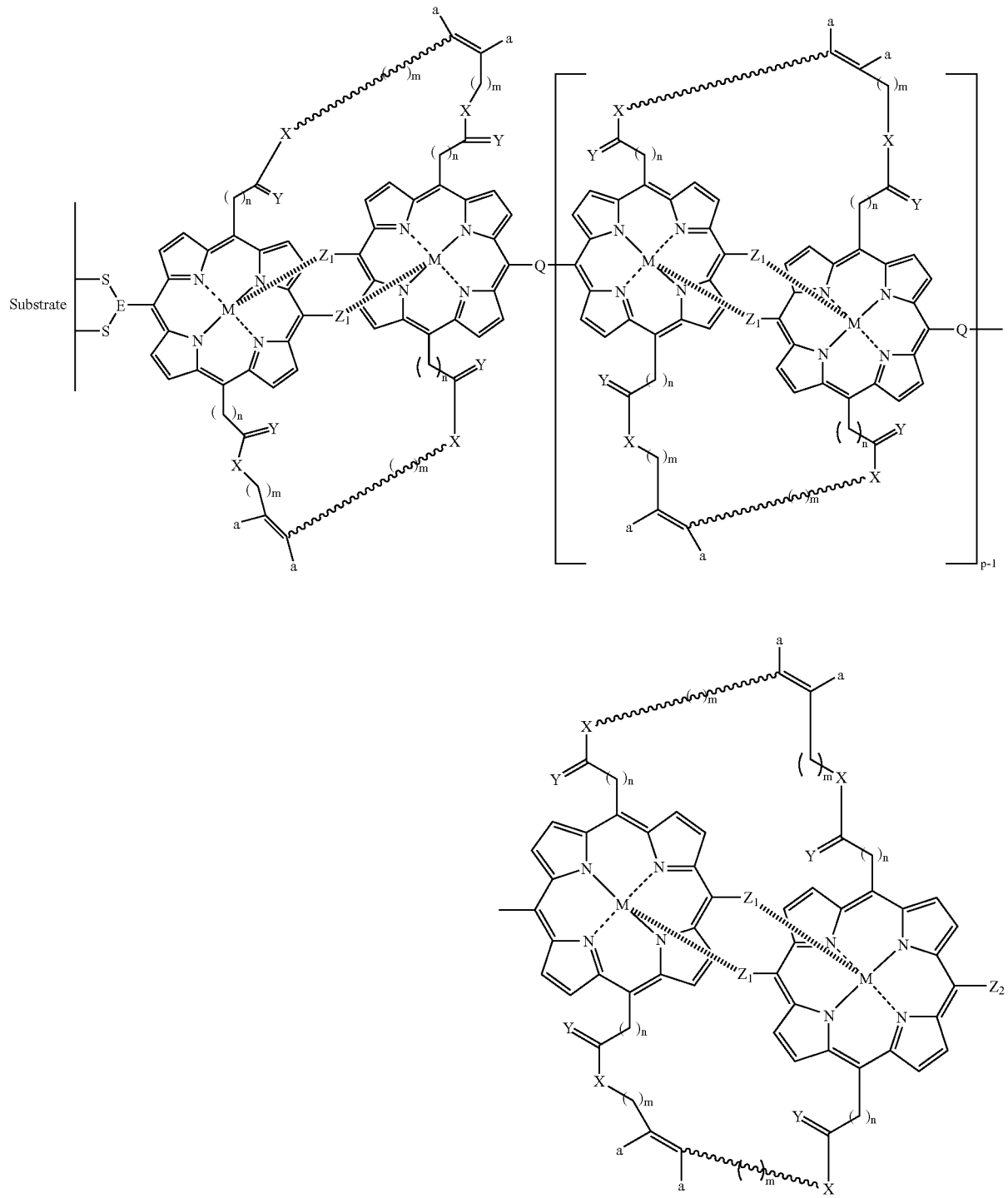

(wherein each of the substituents is as defined above).

12. The photo-functional molecule element according to claim 11, wherein the 5- or 6-membered nitrogen-containing heteroaromatic ring group represented by $Z_1$ is selected from the group consisting of an imidazolyl group and a derivative thereof, an oxazolyl group, a thiazolyl group and 2-pyriziyl group.

13. The photo-functional molecule element according to claim 11, wherein the group having a functional group which can be an electron acceptor represented by $Z_2$ is selected from:

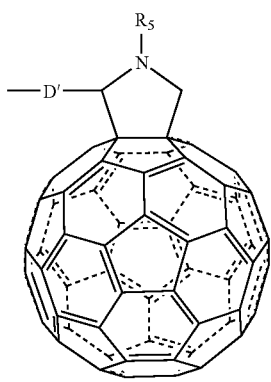

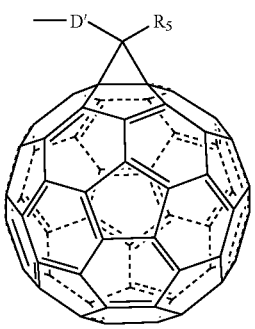

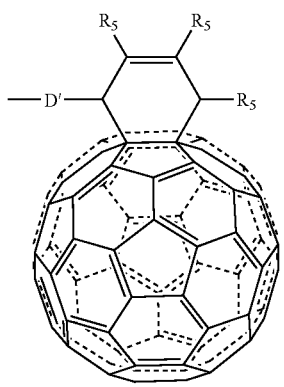

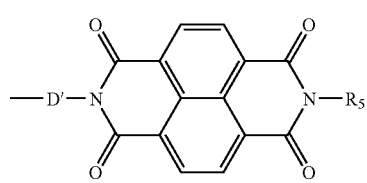

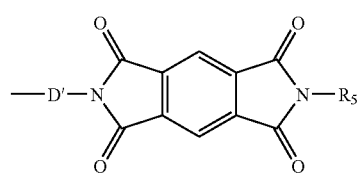

-continued

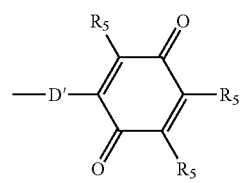

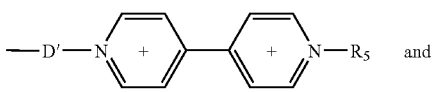 and

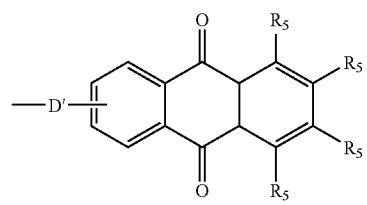

[(wherein D' represents a single bond, a divalent group including at least one of arylene group and alkylene group,

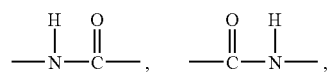

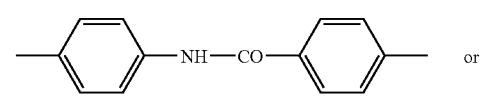 or

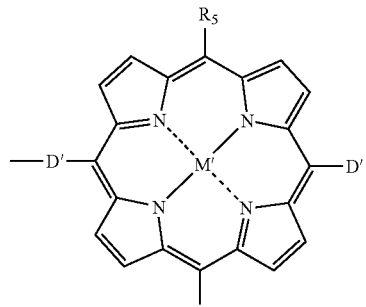

(wherein $R_5$ represents H, an alkyl group, an aryl group, a halogen atom, a cyano group or an alkoxy group, wherein two $R_5$s may be the same or different; and M' represents 2H or the ion of the metal represented by M)].

14. The photo-functional molecule element according to claim 11, wherein the group having a functional group which can be an electron donor represented by $Z_2$ is selected from:

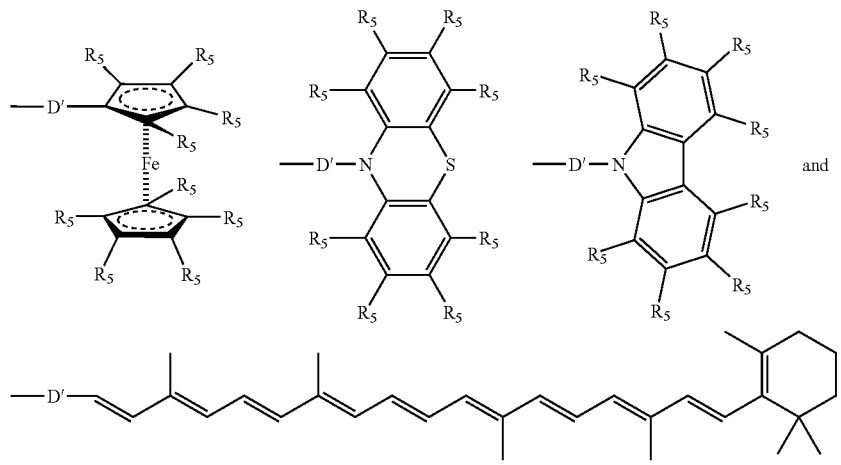

[wherein D' represents a single bond, a divalent group including at least one of arylene group and alkylene group,

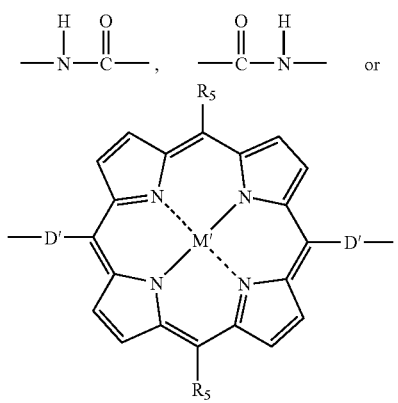

(wherein $R_5$ represents H, an alkyl group, an aryl group, a halogen atom, a cyano group or an alkoxy group, wherein two $R_5$s may be the same type or different; and M' represents 2H or the ion of the metal represented by M)].

15. The photo-functional molecule element according to claim 11, wherein the group having a functional group which can be the terminal group of the porphyrin polymer represented by $Z_2$ is selected from the group consisting of an alkyl group, an aryl group and an alkynyl group.

16. The photo-functional molecule element according to claim 11, wherein the divalent group including at least one of arylene group and alkylene group represented by D is a divalent group having at least an arylene group and/or an alkylene group at terminal ends thereof, and optionally having therebetween at least one group selected from an ether group, a carbonyl group, and a functional group having a hetero atom).

17. The photo-functional molecule element according to claim 11, wherein the trivalent group including at least one of arylene group and alkylene group is a trivalent group obtained by eliminating one hydrogen atom from the divalent group represented by D.

18. The photo-functional molecule element according to claim 11, wherein the metal that provides the ion represented by M is selected from the group consisting of typical metals belonging to 1A, 2A, 2B, 3B to 7B and 0 groups on the periodic table, and transition metals belonging to 3A to 7A, 8 and 1B groups on the periodic table.

19. The photo-functional molecule element according to claim 11, wherein the divalent linking group represented by Q is selected from the group consisting of a divalent, saturated or unsaturated aliphatic hydrocarbon group, a divalent, saturated or unsaturated hydrocarbon ring group, a divalent, saturated or unsaturated hetero cyclic group, and a combination of at least one of these divalent groups and at least one divalent groups selected from —O— and —C(=O)—.

20. The photo-functional molecule element according to claim 1, wherein the substrate is a metal selected from old, silver, copper, platinum, palladium, nickel and aluminum, or a solid substrate onto which one of the metals is vapor-deposited; semiconductor selected from $TiO_2$, $SnO_2$, indium tin oxide, CdS, CdSe, GaAs, GaP, Si, InP and CdTe, or semiconductor into which an electron acceptor or an electron donor is added; and a solid substrate onto which a polymer selected from conductive polymer, semiconductive polymer, polythiophene-type polymer, polypyrrole-type polymer, polyacetylene-type polymer and polydiacetylene-type polymer is coated.

* * * * *